(12) United States Patent
Ogihara et al.

(10) Patent No.: US 9,857,686 B2
(45) Date of Patent: Jan. 2, 2018

(54) COMPOSITION FOR FORMING RESIST UNDERLAYER FILM AND PATTERNING PROCESS

(71) Applicant: SHIN-ETSU CHEMICAL CO., LTD., Tokyo (JP)

(72) Inventors: Tsutomu Ogihara, Jyoetsu (JP); Daisuke Kori, Jyoetsu (JP); Jun Hatakeyama, Jyoetsu (JP); Naoki Kobayashi, Jyoetsu (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 0 days.

(21) Appl. No.: 15/178,982

(22) Filed: Jun. 10, 2016

(65) Prior Publication Data
US 2017/0017156 A1    Jan. 19, 2017

(30) Foreign Application Priority Data

Jul. 13, 2015  (JP) .................. 2015-139659

(51) Int. Cl.
*G03F 7/11*   (2006.01)
*G03F 7/20*   (2006.01)
(Continued)

(52) U.S. Cl.
CPC .............. *G03F 7/11* (2013.01); *C09D 161/22* (2013.01); *G03F 7/091* (2013.01); *G03F 7/168* (2013.01);
(Continued)

(58) Field of Classification Search
CPC . G03F 7/004; G03F 7/094; G03F 7/11; G03F 7/091; G03F 7/168; G03F 7/40;
(Continued)

(56) References Cited

U.S. PATENT DOCUMENTS 4,829,090 A * 5/1989 Bair ................. A01N 33/02
                                                   514/655
5,494,944 A * 2/1996 Meier .................. C08G 59/68
                                                   430/280.1
(Continued)

FOREIGN PATENT DOCUMENTS

JP     H06-118651 A     4/1994
JP     2004-310019 A    11/2004
(Continued)

OTHER PUBLICATIONS

Machine translation of JP 2013-227307 (no date).*
(Continued)

*Primary Examiner* — Amanda C Walke
(74) *Attorney, Agent, or Firm* — Oliff PLC

(57) ABSTRACT

The present invention provides a composition for forming a resist underlayer film, containing an organic solvent and either or both of a compound shown by the following general formula (1) and a condensate of the compound. There can be provided a composition for forming a resist underlayer film that is capable of forming an underlayer film, especially for use in a three-layer resist process, that can reduce reflectance, has high pattern-bend resistance, and prevents line fall and wiggling after etching of a high aspect (Continued)

line especially thinner than 60 nm, and a patterning process using the same.

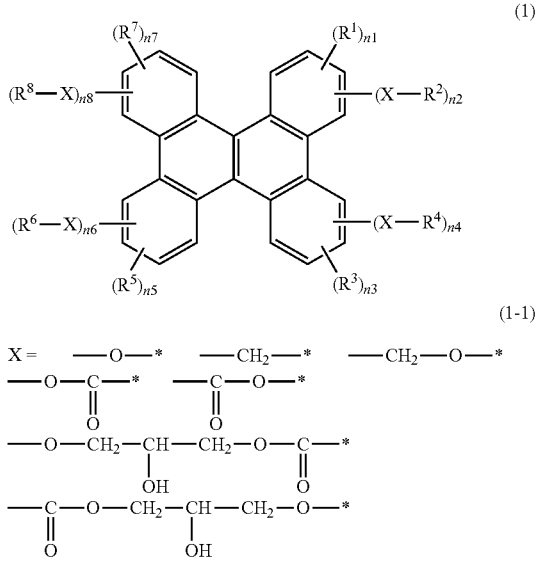

20 Claims, 3 Drawing Sheets

(51) Int. Cl.
| | |
|---|---|
| G03F 7/32 | (2006.01) |
| H01L 21/027 | (2006.01) |
| H01L 21/311 | (2006.01) |
| G03F 7/16 | (2006.01) |
| G03F 7/30 | (2006.01) |
| G03F 7/09 | (2006.01) |
| G03F 7/36 | (2006.01) |
| G03F 7/40 | (2006.01) |
| C09D 161/22 | (2006.01) |
| H01L 21/033 | (2006.01) |

(52) U.S. Cl.
CPC .............. *G03F 7/2053* (2013.01); *G03F 7/30* (2013.01); *G03F 7/322* (2013.01); *G03F 7/36* (2013.01); *G03F 7/40* (2013.01); *H01L 21/0276* (2013.01); *H01L 21/0332* (2013.01); *H01L 21/31116* (2013.01); *H01L 21/31138* (2013.01); *H01L 21/31144* (2013.01)

(58) Field of Classification Search
CPC ......... G03F 7/30; G03F 7/36; H01L 21/0274; H01L 21/0276; H01L 21/31144; H01L 21/3081; H01L 21/02318; C09D 161/22; C09D 161/14; C08G 2261/314
USPC ............ 430/271.1, 322, 325, 329, 330, 331; 438/703, 781; 528/153
See application file for complete search history.

(56) References Cited

U.S. PATENT DOCUMENTS

| | | | | |
|---|---|---|---|---|
| 8,993,215 | B2* | 3/2015 | Nishimaki | G03F 7/091 430/270.1 |
| 9,116,429 | B2* | 8/2015 | Song | C08G 61/02 |
| 9,263,285 | B2* | 2/2016 | Shinjo | C09D 139/04 |
| 9,334,357 | B2* | 5/2016 | Han | C08G 61/128 |
| 9,469,777 | B2* | 10/2016 | Endo | C08G 8/02 |
| 9,556,094 | B2* | 1/2017 | Kim | C07C 39/14 |
| 2004/0191479 | A1 | 9/2004 | Hatakeyama et al. | |
| 2006/0019195 | A1 | 1/2006 | Hatakeyama et al. | |
| 2007/0238300 | A1 | 10/2007 | Ogihara et al. | |
| 2008/0118860 | A1 | 5/2008 | Harada et al. | |
| 2009/0136869 | A1 | 5/2009 | Ogihara et al. | |
| 2012/0108071 | A1 | 5/2012 | Ogihara et al. | |
| 2012/0142193 | A1 | 6/2012 | Ogihara et al. | |
| 2012/0153511 | A1* | 6/2012 | Song | H01L 21/02118 257/786 |
| 2012/0184103 | A1 | 7/2012 | Ogihara et al. | |
| 2012/0270994 | A1* | 10/2012 | Kim | G03F 7/091 524/553 |
| 2012/0308832 | A1* | 12/2012 | Satou | C08G 8/08 428/414 |
| 2013/0171569 | A1* | 7/2013 | Tachibana | G03F 7/004 430/287.1 |
| 2013/0189533 | A1* | 7/2013 | Okuyama | G03F 7/091 428/524 |
| 2016/0017174 | A1* | 1/2016 | Nam | C08G 61/02 438/694 |
| 2016/0257842 | A1* | 9/2016 | Wakamatsu | C09D 161/14 |

FOREIGN PATENT DOCUMENTS

| | | | |
|---|---|---|---|
| JP | 2007-199653 A | 8/2007 | |
| JP | 2007-302873 A | 11/2007 | |
| JP | 2008-111103 A | 5/2008 | |
| JP | 2009-126940 A | 6/2009 | |
| JP | 4355943 B2 | 11/2009 | |
| JP | 2012-098431 A | 5/2012 | |
| JP | 2012118300 A | 6/2012 | |
| JP | 2012-145897 A | 8/2012 | |
| JP | 2013227307 A | * | 11/2013 |

OTHER PUBLICATIONS

Abe, J., H., et al., "Sub-55-Nm Etch Process Using Stacked-Mask Process.", Dry Process International Symposium, pp. 11-12, (2005).

* cited by examiner

Substrate reflectance  Middle layer n=1.5  k=variation

Middle layer film thickness (nm)

☐ 0-1  ▦ 1-2  ▦ 2-3  ▦ 3-4  ▪ 4-5     Substrate reflectance (%)

Substrate reflectance  Middle layer n=1.5 k=0.1  Underlayer n=1.5 k=0.2

Underlayer film thickness (nm)

Substrate reflectance (%)

☐ 0-1  ▦ 1-2  ▦ 2-3  ▦ 3-4  ▪ 4-5

US 9,857,686 B2

COMPOSITION FOR FORMING RESIST UNDERLAYER FILM AND PATTERNING PROCESS

BACKGROUND OF THE INVENTION

Field of the Invention

The present invention relates to a composition for forming a resist underlayer film that is effective as an antireflective film material used for fine patterning in a manufacturing process of a semiconductor device, etc., and to a resist patterning process using the same that is suitable for exposure by far ultraviolet rays, KrF excimer laser beam (248 nm), ArF excimer laser beam (193 nm), $F_2$ laser beam (157 nm), $Kr_2$ laser beam (146 nm), $Ar_2$ laser beam (126 nm), soft X-rays (EUV, 13.5 nm), electron beam (EB), X-rays or the like.

Description of the Related Art

A finer pattern rule has been recently required for Large-Scale Integrated circuit (LSI) with higher integration and higher processing speed. Under such circumstances, lithography using photo-exposure, which has been currently used as a general technique, develops to achieve a finer and more precise pattern processing according to a light source used therein.

As the light source for lithography employed in resist patterning, g-beam (436 nm) or i-beam (365 nm) of mercury lamp has been widely used in the photo-exposure. Shifting the exposure light to shorter wavelength was assumed to be effective in finer patterning. Thus, KrF excimer laser (248 nm), whose wavelength is shorter than i-beam (365 nm), has been used in place of i-beam as the exposure light source in mass production process of Dynamic Random Access Memory (DRAM) with 64 MB. However, production of DRAM with integration of 1 GB or higher, which requires still finer processing technologies (work size of 0.13 μm or less), needs a light source with still shorter wavelength, and lithography especially using ArF excimer laser (193 nm) is thus under investigation.

It is well known that a monolayer resist method, which is used as a typical resist patterning process, may cause pattern collapse at development due to surface tension of a developer if the ratio of pattern height to pattern line width (aspect ratio) is too high. To form a pattern with high aspect ratio on an uneven substrate, a multilayer resist method, in which films having different dry etching properties are laminated for patterning, is suitable. Then, there have been developed a two-layer resist process combining a resist layer of a photosensitive silicon polymer and an underlayer of an organic polymer mainly composed of carbon, hydrogen, and oxygen, for example, a novolak polymer (Patent Document 1); and a three-layer resist process combining a resist layer of a photosensitive organic polymer used in the monolayer resist method, a middle layer of a silicon polymer or a silicon CVD film, and an underlayer of an organic polymer (Patent Document 2).

In the multilayer resist method, the underlayer film uses the organic polymer mainly composed of carbon, hydrogen, and oxygen to form a pattern by dry etching with an oxygen gas by using the silicon-containing material film formed thereon as a hard mask. In addition to this, the underlayer film is required to have an etching resistance for dry etching of a substrate to be processed, an ability to form a film with high flatness on the substrate to be processed, and an antireflective function during photo-exposure depending on usage. For example, Patent Document 2, which relates to an underlayer film composition for two-layer or three-layer resist process, discloses that such an underlayer film enables formation of an underlayer film pattern with high precision and high etching resistance to etching conditions of the substrate to be processed.

FIG. 2 shows substrate reflectance when k-value (extinction coefficient) of the resist middle layer film is changed.

The appropriate film thickness in which the k-value of the resist middle layer film is 0.2 or lower yields a sufficient antireflective effect of 1% or less.

FIG. 3 and FIG. 4 show change of reflectance with change of film thicknesses of the middle layer film and the underlayer film in the case that the k-value of the underlayer film is 0.2 or 0.6, respectively. The resist underlayer film having higher k-value (in the case of 0.6 (FIG. 4)) can reduce the reflectance to 1% or less with the film being thinner. In the case that the k-value of the resist underlayer film is 0.2 (FIG. 3), the resist middle layer film 250 nm thick needs to be thicker to achieve a reflectance of 1%. However, it is undesirable to make the resist middle layer film thicker because the thicker film leads a larger load to the uppermost resist film at the time of dry etching for processing the resist middle layer film. FIG. 3 and FIG. 4, which show reflectance in the dry exposure by an exposure apparatus having lens with a numerical aperture (NA) of 0.85, indicate that reflectance of 1% or less can be achieved by optimizing the n-value (refractive index), k-value, and film thickness of the middle layer film in the three-layer process, regardless of the k-value of the underlayer film.

On the contrary, NA of the projection lens exceeds 1.0 by liquid immersion lithography, and an angle of incident light to the resist and the antireflective film under the resist becomes shallow accordingly. The antireflective film suppresses reflection not only by absorption of the film itself but also by a negating action due to interference effect of the light. The oblique incident light makes the interference effect small and thus increases the reflectance.

Among the films in the three-layer process, the middle layer film has an antireflective effect by the interference action of the light. The underlayer film is too thick for the interference action, and thus has no antireflective effect by the negating action due to the interference effect. Reflection from the underlayer film surface needs to be suppressed, so that the k-value needs to be less than 0.6 and the n-value needs to be near the value of the middle layer film thereon. If the transparency is excessively high due to a smaller k-value, reflection from the substrate takes place. Thus, when NA of liquid immersion exposure is 1.3, the k-value is preferably in the range of about 0.25 to 0.48. Target n-values of the middle layer film and the underlayer film are both near 1.7, which is the n-value of the resist. In particular, the ratio of the n-value to the k-value is preferably n/k=1.50/0.30 to 0.35, approximately.

It is reported that a decrease of a processed line width causes phenomena such as wiggling and bending of the underlayer film at the time of etching the substrate to be processed by using the underlayer film as a mask (Non-Patent Document 1). It is commonly known that an amorphous carbon film formed by CVD (hereinafter, referred to as "CVD-C film") can reduce the amount of hydrogen atoms therein extremely and thus prevent wiggling very effectively.

However, in the case that the underlayment substrate to be processed has difference in level, the difference needs to be planarized by the underlayer film. Planarizing the underlayer film can prevent variation in film thicknesses of the middle layer film and the photoresist formed thereon and increases a focus margin in lithography.

The CVD-C film using a raw material such as methane gas, ethane gas, and acetylene gas is difficult to fill the difference in level so as to be flat. On the other hand, the underlayer film formed by spin coating can advantageously fill the gaps of the substrate.

As mentioned above, the CVD-C film is poor in filling property for filling gaps. In addition, a CVD apparatus is difficult to be introduced due to its price and occupied footprint area in some cases. If the wiggling problem can be solved by using an underlayer film composition capable of forming a film by the spin coating method, the process and equipment can be simplified advantageously.

Therefore, it is desired to develop an underlayer film composition and a method for forming an underlayer film that has suitable n-value, k-value, and filling property as an antireflective film, and has excellent pattern-bend resistance without causing wiggling in etching.

PRIOR ART DOCUMENTS

Patent Documents

Patent Document 1: Japanese Patent Application Publication No. H06-118651
Patent Document 2: Japanese Patent No. 4355943

Non-Patent Document

Non-Patent Document 1: Proc. of Symp. Dry. Process, (2005), p. 11

SUMMARY OF THE INVENTION

The present invention has been accomplished in view of the above circumstances, and has an object to provide a composition for forming a resist underlayer film capable of forming an underlayer film, especially for use in a three-layer resist process, that can reduce reflectance, has high pattern-bend resistance, and prevents line fall and wiggling after etching of a high aspect line especially thinner than 60 nm; and a patterning process using the same.

To achieve this object, the present invention provides a composition for forming a resist underlayer film, comprising an organic solvent and either or both of a compound shown by the following general formula (1) and a condensate of the compound,

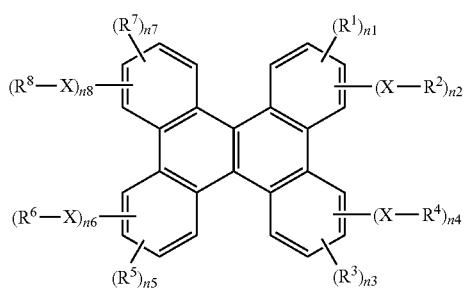

(1)

wherein $R^1$, $R^3$, $R^5$, and $R^7$ represent $Z^1$, a diglycidylamino group, or a dipropargylamino group; $R^2$, $R^4$, $R^6$, and $R^8$ represent $Z^2$, a glycidyl group, a diglycidylamino group, or a dipropargylamino group; X represents a group shown by the following formula (1-1); n1 to n8 are each a number satisfying $0 \leq n1 \leq 4$, $0 \leq n2 \leq 4$, $0 \leq n3 \leq 4$, $0 \leq n4 \leq 4$, $0 \leq n5 \leq 4$, $0 \leq n6 \leq 4$, $0 \leq n7 \leq 4$, $0 \leq n8 \leq 4$, $0 \leq n1+n2 \leq 4$, $0 \leq n3+n4 \leq 4$, $0 \leq n5+n6 \leq 4$, $0 \leq n7+n8 \leq 4$, and $1 \leq n1+n2+n3+n4+n5+n6+n7+n8 \leq 16$, where $Z^1$ represents an alkyl group having 1 to 20 carbon atoms, an alkenyl group or alkynyl group having 2 to 20 carbon atoms, or an aryl group having 6 to 30 carbon atoms, and $Z^2$ represents $Z^1$, a hydrogen atom, or a hydroxyaryl group having 6 to 14 carbon atoms,

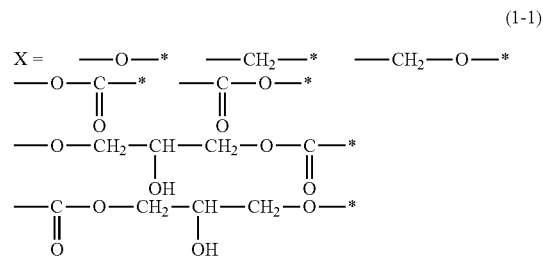

(1-1)

wherein * represents a binding site with $R^p$ where p represents 2, 4, 6, or 8.

A resist underlayer film formed by using such a composition can reduce reflectance, has high pattern-bend resistance, and prevents line fall and wiggling after etching of a high aspect line especially thinner than 60 nm.

The condensate is preferably obtained by a reaction of one or more compounds shown by the general formula (1) with one or more compounds selected from a compound shown by the following general formula (2-1), a compound shown by the following general formula (2-2), trioxane, paraformaldehyde, and fluorenone,

(2-1)

wherein $Y^1$ represents a hydrogen atom or a monovalent organic group having 1 to 30 carbon atoms and optionally containing a substituent,

(2-2)

wherein $Y^2$ represents an aromatic group having 6 or more carbon atoms and optionally containing a substituent; $R^9$ represents an alkoxy group or alkanoyloxy group having 1 to 6 carbon atoms, or a halogen atom.

Such a composition for forming a resist underlayer film improves the effect of the present invention.

Additionally, the condensate is preferably obtained by a reaction with one or more compounds selected from compounds shown by the following general formulae (3-1), (3-2), (3-3), (3-4), and (3-5),

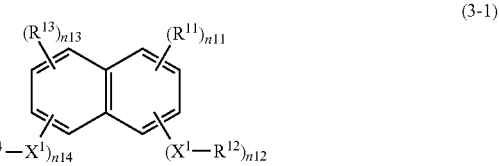

(3-1)

wherein $R^{11}$ and $R^{13}$ represent $Z^1$, where $Z^1$ is as defined above, an amino group, a diglycidylamino group, or a dipropargylamino group; $R^{12}$ and $R^{14}$ represent $Z^2$, where $Z^2$ is as defined above, a glycidyl group, a diglycidylamino group, or a dipropargylamino group; a single bond contained in $R^{11}$ to $R^{14}$ may be substituted by a double bond, a triple bond, an ether group, a carbonyl group, or a carbonyloxy group; a hydrogen atom contained in $R^{11}$ to $R^{14}$ may be substituted by a fluorine atom, a chlorine atom, or a hydroxyl group; two substituents selected from $R^{11}$, $R^{12}$, $R^{13}$, and $R^{14}$ may be bonded intramolecularly to form a cyclic substituent; $X^1$ represents a group shown by the following formula (3-6); and n11 to n14 are each a number satisfying $0 \le n11 \le 4$, $0 \le n12 \le 4$, $0 \le n13 \le 4$, $0 \le n14 \le 4$, $0 \le n11+n12 \le 4$, $0 \le n13+n14 \le 4$, and $1 \le n11+n12+n13+n14 \le 8$,

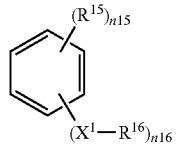

(3-2)

wherein $R^{15}$ represents a fluorine atom, a chlorine atom, $Z^1$, where $Z^1$ is as defined above, a diglycidylamino group, or a dipropargylamino group; $R^{16}$ represents $Z^2$, where $Z^2$ is as defined above, a glycidyl group, a diglycidylamino group, or a dipropargylamino group; a single bond contained in $R^{15}$ and $R^{16}$ may be substituted by a double bond, a triple bond, an ether group, a carbonyl group, or a carbonyloxy group; a hydrogen atom contained in $R^{15}$ and $R^{16}$ may be substituted by a fluorine atom, a chlorine atom, or a hydroxyl group; two substituents selected from $R^{15}$ and $R^{16}$ may be bonded intramolecularly to form a cyclic substituent; $X^1$ represents a group shown by the following formula (3-6); and n15 and n16 are each a number satisfying $0 \le n15 \le 6$, $0 \le n16 \le 6$, and $1 \le n \le 15+n16 \le 6$,

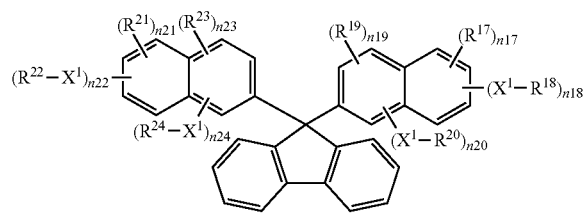

(3-3)

wherein $R^{17}$, $R^{19}$, $R^{21}$, and $R^{23}$ represent $Z^1$, where $Z^1$ is as defined above, a diglycidylamino group, or a dipropargylamino group; $R^{18}$ and $R^{22}$ represent $Z^2$, where $Z^2$ is as defined above, a glycidyl group, a glycidyloxyethyl group, a diglycidylamino group, or a dipropargylamino group; $R^{20}$ and $R^{24}$ represent $Z^2$, where $Z^2$ is as defined above, a glycidyl group, a diglycidylamino group, or a dipropargylamino group; a single bond contained in $R^{17}$ to $R^{24}$ may be substituted by a double bond, a triple bond, an ether group, a carbonyl group, or a carbonyloxy group; a hydrogen atom contained in $R^{17}$ to $R^{24}$ may be substituted by a fluorine atom, a chlorine atom, or a hydroxyl group; $X^1$ represents a group shown by the following formula (3-6); and n17 to n24 are each a number satisfying $0 \le n17 \le 4$, $0 \le n18 \le 4$, $0 \le n19 \le 3$, $0 \le n20 \le 3$, $0 \le n21 \le 4$, $0 \le n22 \le 4$, $0 \le n23 \le 3$, $0 \le n24 \le 3$, $0 \le n17+n18 \le 4$, $0 \le n19+n20 \le 3$, $0 \le n21+n22 \le 4$, $0 \le n23+n24 \le 3$, $1 \le n17+n18+n19+n20 \le 7$, and $1 \le n21+n22+n23+n24 \le 7$,

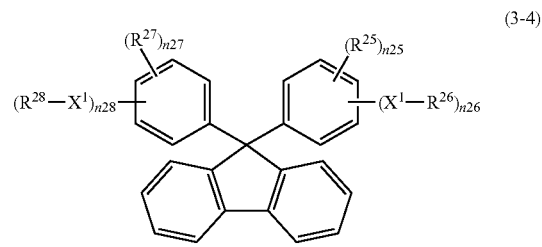

(3-4)

wherein $R^{25}$ and $R^{27}$ represent $Z^1$, where $Z^1$ is as defined above, a diglycidylamino group, or a dipropargylamino group; $R^{26}$ and $R^{28}$ represent $Z^2$, where $Z^2$ is as defined above, a glycidyl group, a glycidyloxyethyl group, a diglycidylamino group, or a dipropargylamino group; a single bond contained in $R^{25}$ to $R^{28}$ may be substituted by a double bond, a triple bond, an ether group, a carbonyl group, or a carbonyloxy group; a hydrogen atom contained in $R^{25}$ to $R^{28}$ may be substituted by a fluorine atom, a chlorine atom, or a hydroxyl group; $X^1$ represents a group shown by the following formula (3-6); and n25 to n28 are each a number satisfying $0 \le n25 \le 5$, $0 \le n26 \le 5$, $0 \le n27 \le$, $0 \le n28 \le 5$, $1 \le n25+n26 \le 5$, and $1 \le n27+n28 \le 5$,

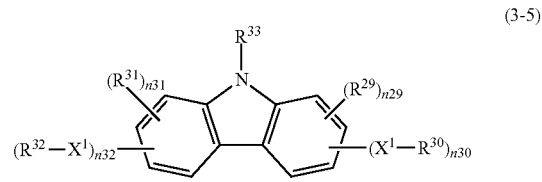

(3-5)

wherein $R^{29}$ and $R^{31}$ represent $Z^1$, where $Z^1$ is as defined above, a diglycidylamino group, or a dipropargylamino group; $R^{30}$, $R^{32}$, and $R^{33}$ represent $Z^2$, where $Z^2$ is as defined above, a glycidyl group, a diglycidylamino group, or a dipropargylamino group; a single bond contained in $R^{29}$ to $R^{33}$ may be substituted by a double bond, a triple bond, an ether group, a carbonyl group, or a carbonyloxy group; a hydrogen atom contained in $R^{29}$ to $R^{33}$ may be substituted by a fluorine atom, a chlorine atom, or a hydroxyl group; $X^1$ represents a group shown by the following formula (3-6); and n29 to n32 are each a number satisfying $0 \le n29 \le 4$, $0 \le n30 \le 4$, $0 \le n31 \le 4$, $0 \le n32 \le 4$, $0 \le n29+n30 \le 4$, and $0 \le n31+n32 \le 4$,

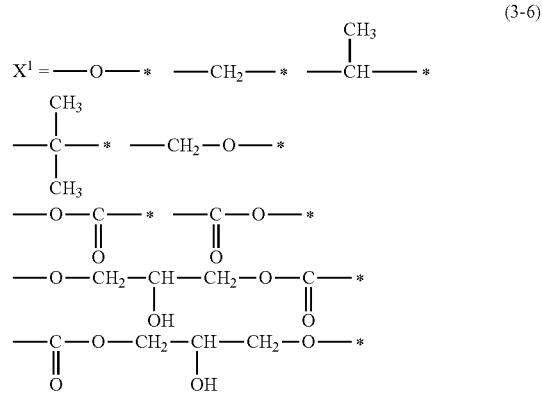

(3-6)

wherein * represents a binding site with $R^q$ where q represents 12, 14, 16, 18, 20, 22, 24, 26, 28, 30, or 32.

The n-value, k-value, and etching resistance can be controlled by combining such compounds.

The composition for forming a resist underlayer film preferably further comprises a substituted condensate obtained by substituting a part of hydrogen atoms contained in the condensate by a glycidyl group.

The inventive composition for forming a resist underlayer film may also contain a substituted condensate obtained by substituting a part of hydrogen atoms contained in the condensate by a glycidyl group.

The composition for forming a resist underlayer film preferably comprises two or more of the compound shown by the general formula (1), the condensate of the compound, and a substituted condensate obtained by substituting a part of hydrogen atoms of the condensate by a glycidyl group.

A resist underlayer film formed by using such a composition has excellent antireflective function especially relative to photo-exposure with short wavelength. More specifically, this film has high transparency, suitable n-value and k-value, and excellent high pattern-bend resistance at the time of processing a substrate.

The composition for forming a resist underlayer film preferably further comprises either or both of a crosslinking agent and an acid generator.

When the inventive composition for forming a resist underlayer film further contains either or both of a crosslinking agent and an acid generator, crosslinking reaction within the resist underlayer film can be accelerated, for example, by baking after application to a substrate. Thus, such a resist underlayer film is prevented from intermixing with a resist upper layer film and can reduce diffusion of low-molecular weight components to the resist upper layer film.

Furthermore, the present invention provides a patterning process comprising: forming a resist underlayer film on a body to be processed by using the above composition for forming a resist underlayer film; forming a resist middle layer film on the resist underlayer film by using a silicon-containing resist middle layer film composition; forming a resist upper layer film on the resist middle layer film by using a resist upper layer film composition which is a photoresist composition; forming a circuit pattern on the resist upper layer film; etching the resist middle layer film by using the resist upper layer film having the formed pattern as a mask; etching the resist underlayer film by using the resist middle layer film having the formed pattern as a mask; further etching the body to be processed by using the resist underlayer film having the formed pattern as a mask, whereby the pattern is formed in the body to be processed.

The pattern process using the inventive composition for forming a resist underlayer film enables the pattern of the resist upper layer film to be transferred and formed to the body to be processed with high precision.

Furthermore, the present invention provides a patterning process comprising: forming a resist underlayer film on a body to be processed by using the above composition for forming a resist underlayer film; forming a resist middle layer film on the resist underlayer film by using a silicon-containing resist middle layer film composition; forming an organic antireflective film (BARC) on the resist middle layer film; forming a resist upper layer film on the BARC by using a resist upper layer film composition which is a photoresist composition and thereby forming a 4-layered resist film; forming a circuit pattern on the resist upper layer film; etching the BARC film and the resist middle layer film by using the resist upper layer film having the formed pattern as a mask; etching the resist underlayer film by using the resist middle layer film having the formed pattern as a mask; further etching the body to be processed by using the resist underlayer film having the formed pattern as a mask, whereby the pattern is formed in the body to be processed.

The inventive patterning process allows the BARC to be formed between the resist middle layer film and the resist upper layer film.

Furthermore, the present invention provides a patterning process comprising: forming a resist underlayer film on a body to be processed by using the above composition for forming a resist underlayer film; forming an inorganic hard mask intermediate film selected from a silicon oxide film, a silicon nitride film, and a silicon oxynitride film on the resist underlayer film; forming a resist upper layer film on the inorganic hard mask intermediate film by using a resist upper layer film composition which is a photoresist composition; forming a circuit pattern on the resist upper layer film; etching the inorganic hard mask intermediate film by using the resist upper layer film having the formed pattern as a mask; etching the resist underlayer film by using the inorganic hard mask intermediate film having the formed pattern as a mask; further etching the body to be processed by using the resist underlayer film having the formed pattern as a mask, whereby the pattern is formed in the body to be processed.

Even in the case of using the inorganic hard mask intermediate film, the inventive patterning process, which uses the inventive composition for forming a resist underlayer film, enables the pattern to be formed in the body to be processed with high precision.

Furthermore, the present invention provides a patterning process comprising: forming a resist underlayer film on a body to be processed by using the above composition for forming a resist underlayer film; forming an inorganic hard mask intermediate film selected from a silicon oxide film, a silicon nitride film, and a silicon oxynitride film on the resist underlayer film; forming an organic antireflective film (BARC) on the inorganic hard mask intermediate film; forming a resist upper layer film on the BARC by using a resist upper layer film composition which is a photoresist composition and thereby forming a 4-layered resist film; forming a circuit pattern on the resist upper layer film; etching the BARC film and the inorganic hard mask intermediate film by using the resist upper layer film having the formed pattern as a mask; etching the resist underlayer film by using the inorganic hard mask intermediate film having the formed pattern as a mask; further etching the body to be processed by using the resist underlayer film having the formed pattern as a mask, whereby the pattern is formed in the body to be processed.

Forming the BARC on the hard mask intermediate film enables reflectance to be suppressed by the two-layered antireflective film even in the liquid immersion exposure with high NA exceeding 1.0. Moreover, footing profile of the photoresist pattern on the hard mask intermediate film can be reduced.

The inorganic hard mask intermediate film may be formed by a CVD method or an ALD method.

The etching resistance can be improved by forming the inorganic hard mask intermediate film by the CVD method or the ALD method.

The resist upper layer film may be patterned by a photolithography with a wavelength ranging from 10 nm to 300 nm, a direct drawing by electron beam, a nanoimprinting, or a combination thereof.

In this manner, the pattern can be formed in the resist upper layer film by the photolithography with a wavelength ranging from 10 nm to 300 nm, the direct drawing by electron beam, the nanoimprinting, or the combination thereof.

A development method in the patterning process may be an alkaline development or a development with an organic solvent.

In this manner, the present invention can employ the alkaline development or the development with an organic solvent.

The body to be processed is preferably a semiconductor apparatus substrate or the semiconductor apparatus substrate coated with any of a metal film, a metal carbide film, a metal oxide film, a metal nitride film, a metal oxycarbide film, and a metal oxynitride film.

In this case, the metal may be silicon, titanium, tungsten, hafnium, zirconium, chromium, germanium, copper, silver, gold, aluminum, indium, gallium, arsenic, palladium, iron, tantalum, iridium, molybdenum, or an alloy thereof.

In the present invention, such materials can be used as the body to be processed and the metal.

As mentioned above, the resist underlayer film formed by using the inventive composition for forming a resist underlayer film can reduce reflectance, specifically, has suitable n-value and k-value as an antireflective film, as well as having great strength, excellent pattern-bend resistance at processing a substrate, and prevents line fall and wiggling after etching of a high aspect line especially thinner than 60 nm.

In addition, the inventive patterning process enables the pattern of the resist upper layer film to be transferred and formed to the body to be processed with high precision.

DETAILED DESCRIPTION OF THE PREFERRED EMBODIMENTS

Figure 1:
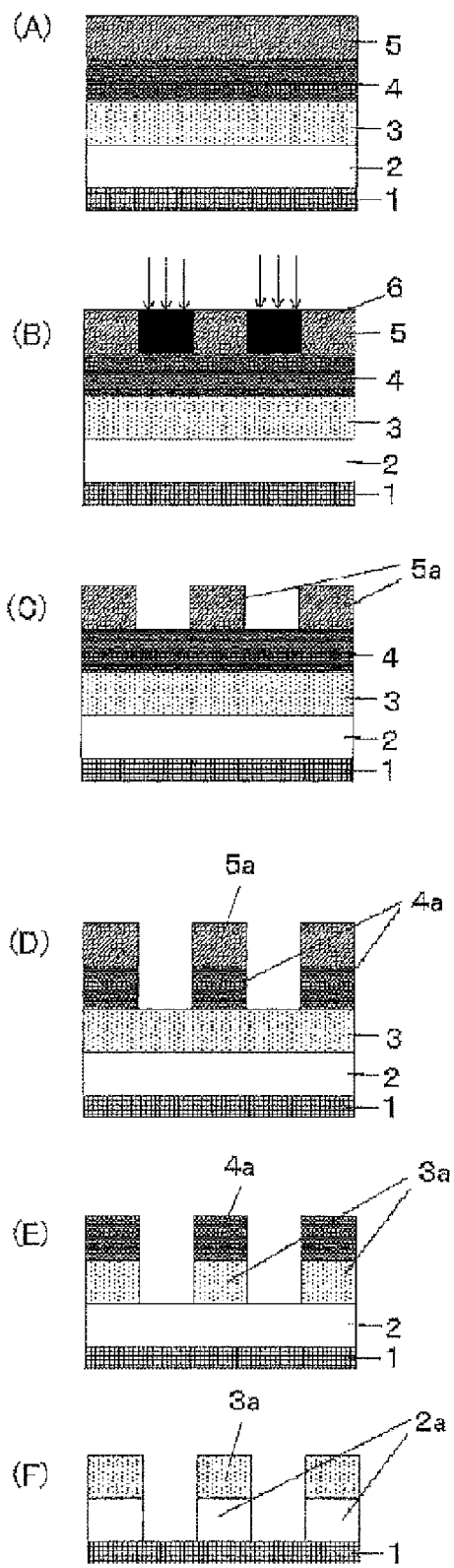
FIG. 1 is an explanatory view showing a patterning process (three-layer resist process) according to an embodiment of the present invention.
Figure 2:
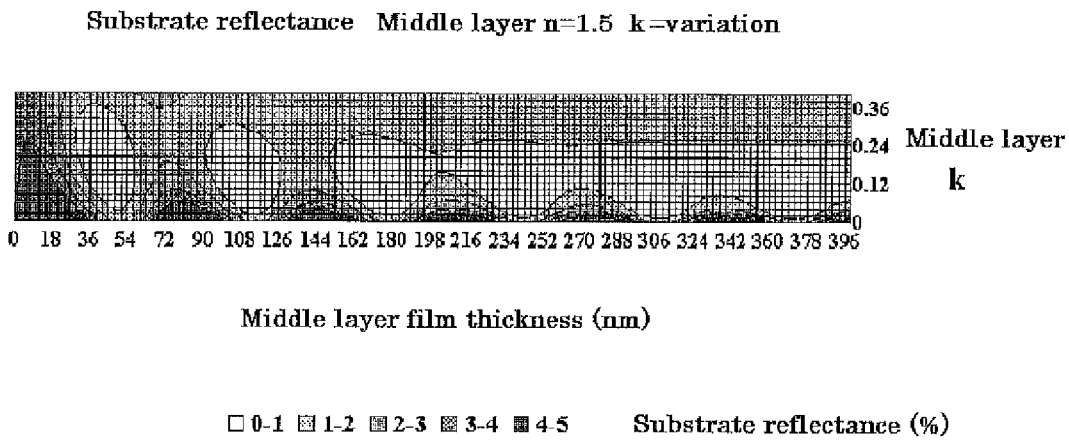
FIG. 2 is a graph showing a relationship of the substrate reflectance when the k-value and the film thickness of the middle layer film are changed within the range of 0 to 0.4 and the range of 0 to 400 nm, respectively, while the refractive index n-value, the k-value, and the film thickness of the underlayer film and the n-value of the middle layer film are fixed at 1.5, 0.6, 500 nm, and 1.5, respectively, in the three-layer process.
Figure 3:
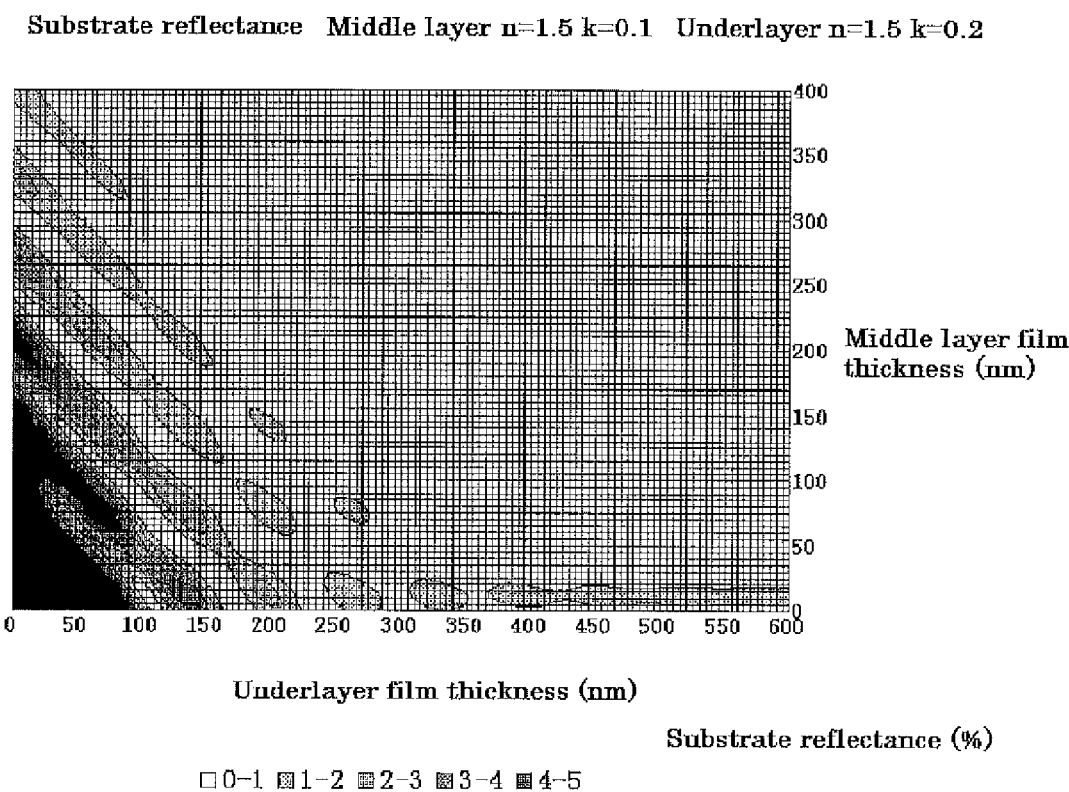
FIG. 3 is a graph showing a relationship of the substrate reflectance when the film thicknesses of the underlayer film and the middle layer film are changed while the refractive index n-value and the k-value of the underlayer film and the n-value and the k-value of the middle layer film are fixed at 1.5, 0.2, 1.5, and 0.1, respectively, in the three-layer process.
Figure 4:
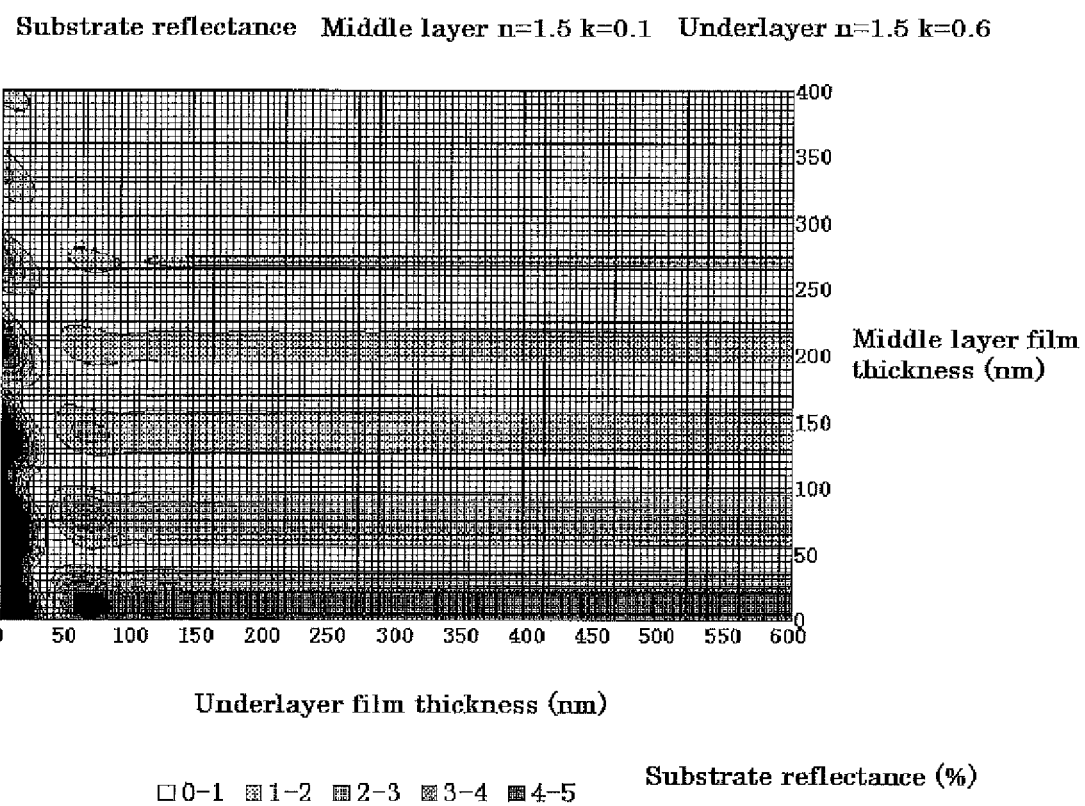
FIG. 4 is a graph showing a relationship of the substrate reflectance when the film thicknesses of the underlayer film and the middle layer film are changed while the refractive index n-value and the k-value of the underlayer film and the n-value and the k-value of the middle layer film are fixed at 1.5, 0.6, 1.5, and 0.1, respectively, in the three-layer process.

As mentioned above, it is desired to develop a composition for forming a resist underlayer film capable of forming an underlayer film, for use in a multilayer resist process, that has high pattern-bend resistance, and prevents line fall and wiggling after etching of a high aspect line especially thinner than 60 nm; and a patterning process using the same.

The present inventors have earnestly studied to accomplish the above object, and consequently found a resist underlayer film obtained from the composition for forming a resist underlayer film that contains the compound having a dibenzochrysene skeleton with a rigid structure and the condensate thereof not only is free from line fall and wiggling after etching but also has suitable optical properties capable of controlling reflectance, thereby bringing the present invention to completion.

That is, the present invention is a composition for forming a resist underlayer film, comprising an organic solvent and either or both of a compound shown by the following general formula (1) and a condensate of the compound,

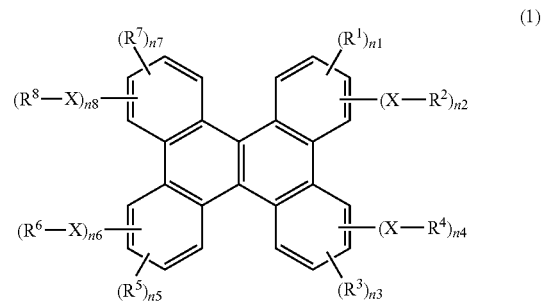

(1)

wherein $R^1$, $R^3$, $R^5$, and $R^7$ represent $Z^1$, a diglycidylamino group, or a dipropargylamino group; $R^2$, $R^4$, $R^6$, and $R^8$ represent $Z^2$, a glycidyl group, a diglycidylamino group, or a dipropargylamino group; X represents a group shown by the following formula (1-1); n1 to n8 are each a number satisfying $0 \leq n1 \leq 4$, $0 \leq n2 \leq 4$, $0 \leq n3 \leq 4$, $0 \leq n4 \leq 4$, $0 \leq n5 \leq 4$, $0 \leq n6 \leq 4$, $0 \leq n7 \leq 4$, $0 \leq n8 \leq 4$, $0 \leq n1+n2 \leq 4$, $0 \leq n3+n4 \leq 4$, $0 \leq n5+n6 \leq 4$, $0 \leq n7+n8 \leq 4$, and $1 \leq n1+n2+n3+n4+n5+n6+n7+n8 \leq 16$, where $Z^1$ represents an alkyl group having 1 to 20 carbon atoms, an alkenyl group or alkynyl group having 2 to 20 carbon atoms, or an aryl group having 6 to 30 carbon atoms, and $Z^2$ represents $Z^1$, a hydrogen atom, or a hydroxyaryl group having 6 to 14 carbon atoms,

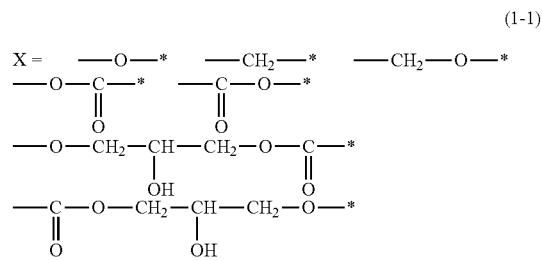

(1-1)

wherein * represents a binding site with $R^p$ where p represents 2, 4, 6, or 8.

Hereinafter, embodiments of the present invention will be described, but the present invention is not limited thereto.

The inventive composition for forming a resist underlayer film contains either or both of a compound shown by the following general formula (1) and a condensate of the compound,

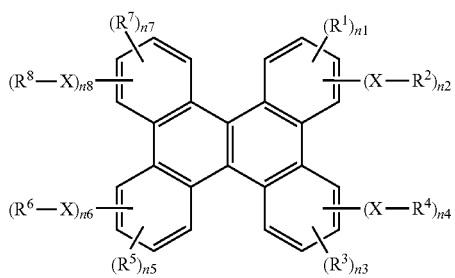

(1)

wherein $R^1$, $R^3$, $R^5$, and $R^7$ represent $Z^1$, a diglycidylamino group, or a dipropargylamino group; $R^2$, $R^4$, $R^6$, and $R^8$ represent $Z^2$, a glycidyl group, a diglycidylamino group, or a dipropargylamino group; X represents a group shown by the following formula (1-1); n1 to n8 are each a number satisfying $0 \leq n1 \leq 4$, $0 \leq n2 \leq 4$, $0 \leq n3 \leq 4$, $0 \leq n4 \leq 4$, $0 \leq n5 \leq 4$, $0 \leq n6 \leq 4$, $0 \leq n7 \leq 4$, $0 \leq n8 \leq 4$, $0 \leq n1+n2 \leq 4$, $0 \leq n3+n4 \leq 4$, $0 \leq n5+n6 \leq 4$, $0 \leq n7+n8 \leq 4$, and $1 \leq n1+n2+n3+n4+n5+n6+n7+n8 \leq 16$, where $Z^1$ represents an alkyl group having 1 to 20 carbon atoms, an alkenyl group or alkynyl group having 2 to 20 carbon atoms, or an aryl group having 6 to 30 carbon atoms, and $Z^2$ represents $Z^1$, a hydrogen atom, or a hydroxyaryl group having 6 to 14 carbon atoms,

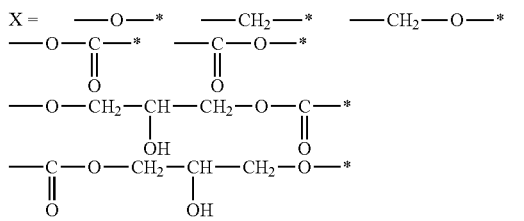

(1-1)

wherein * represents a binding site with $R^p$ where p represents 2, 4, 6, or 8.

Illustrative examples of the compound shown by the general formula (1) include the following compounds.

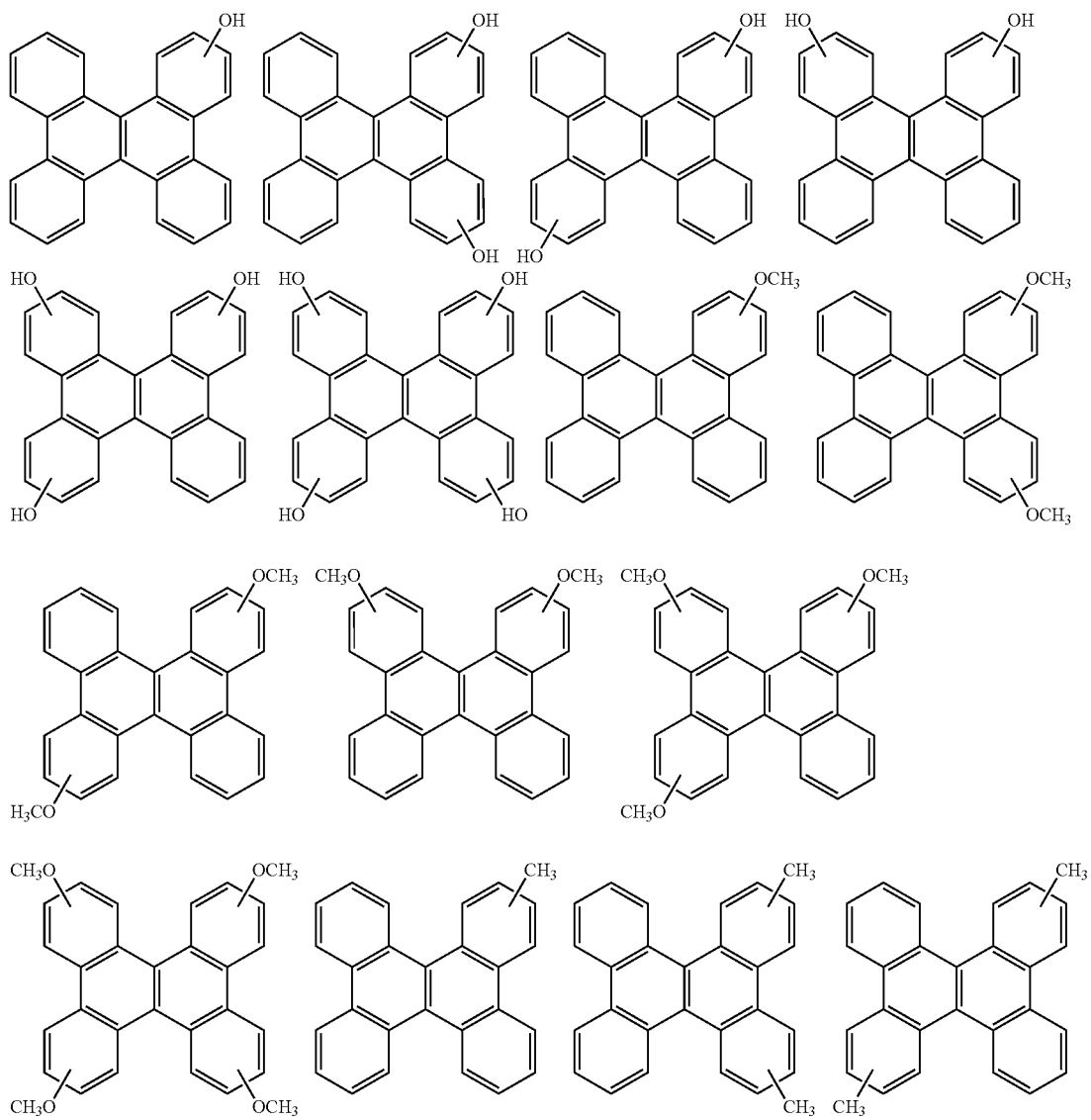

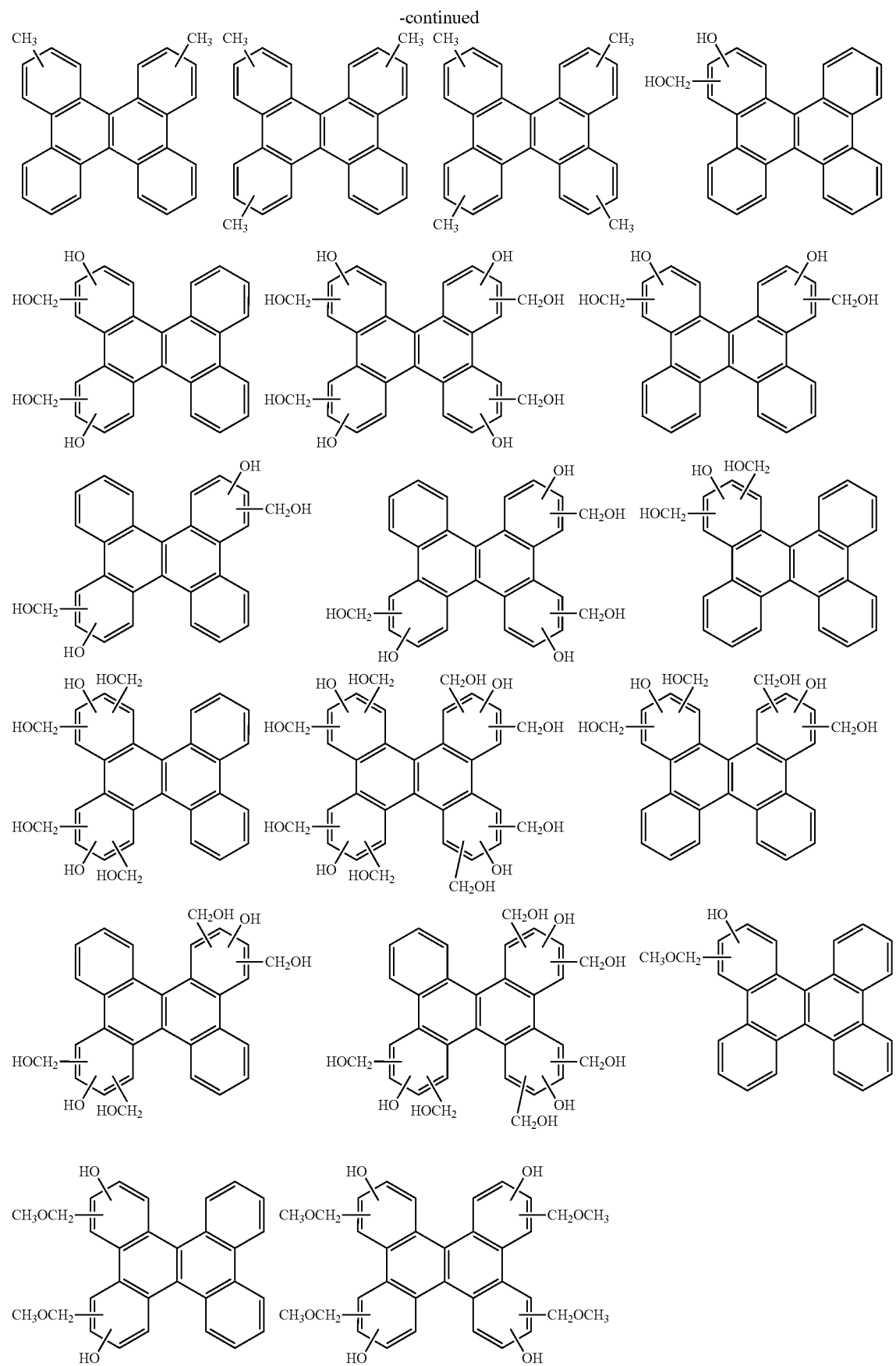

-continued
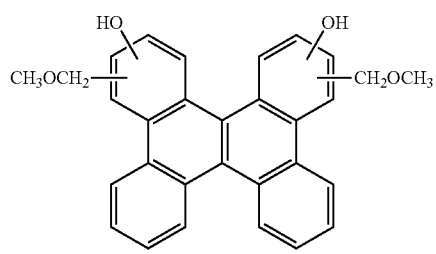 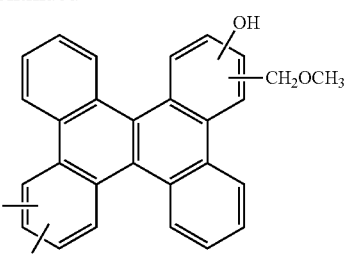
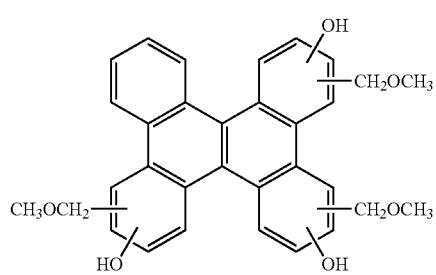 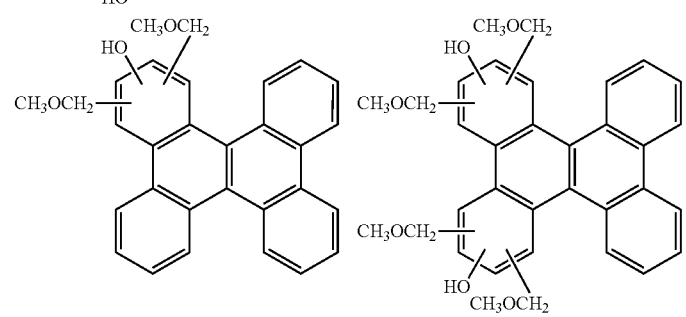
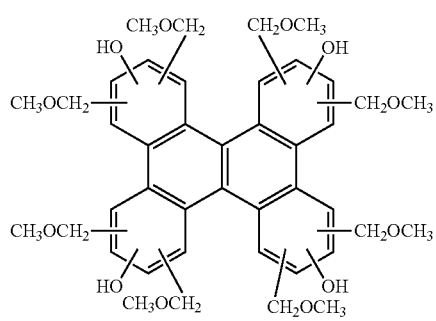 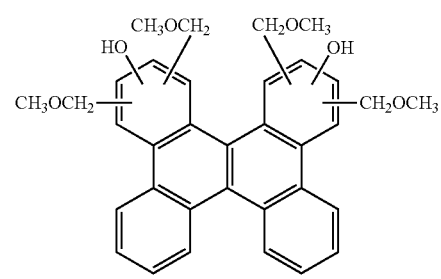
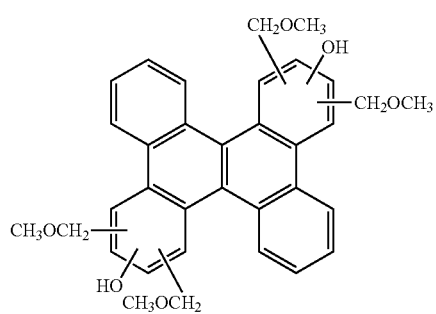 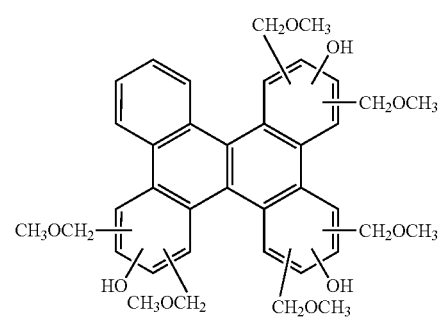
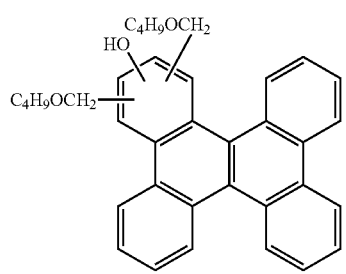 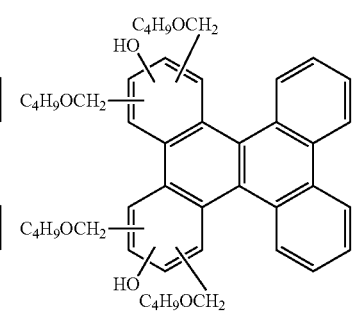 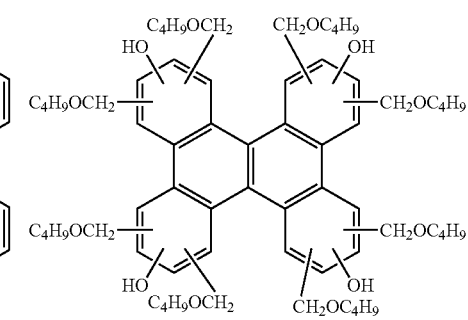

-continued
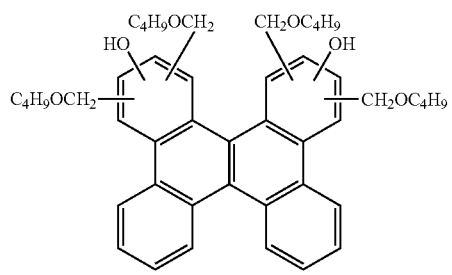 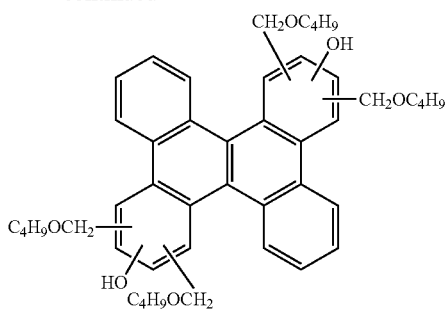
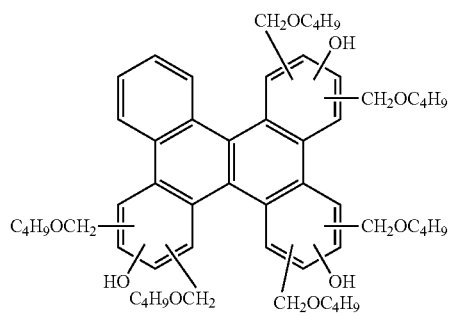 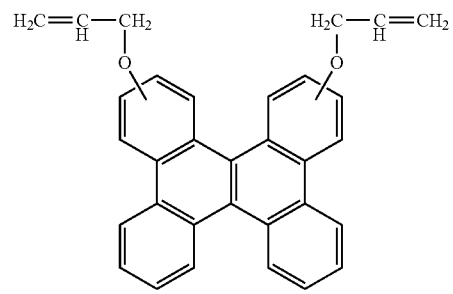
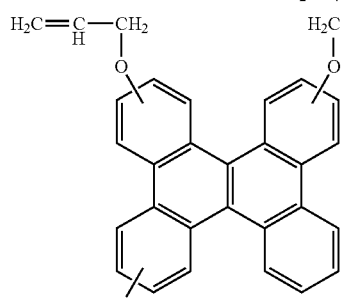 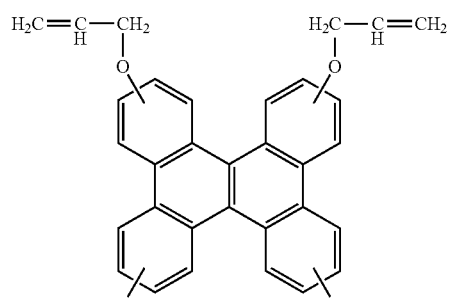
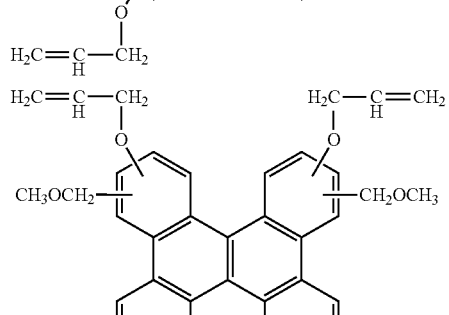 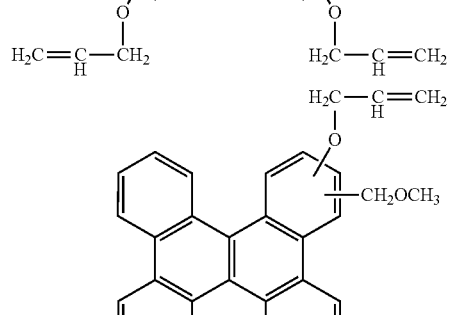
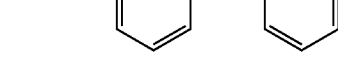 
 
 
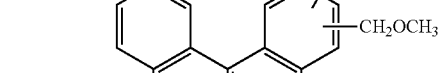 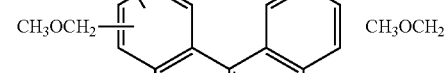
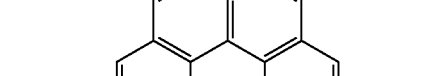 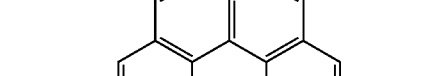
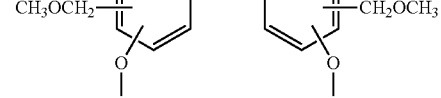 
 

-continued
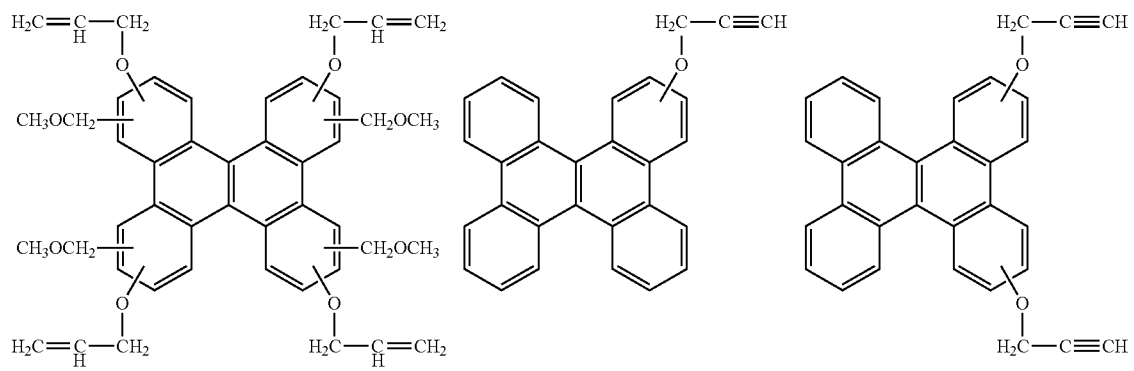
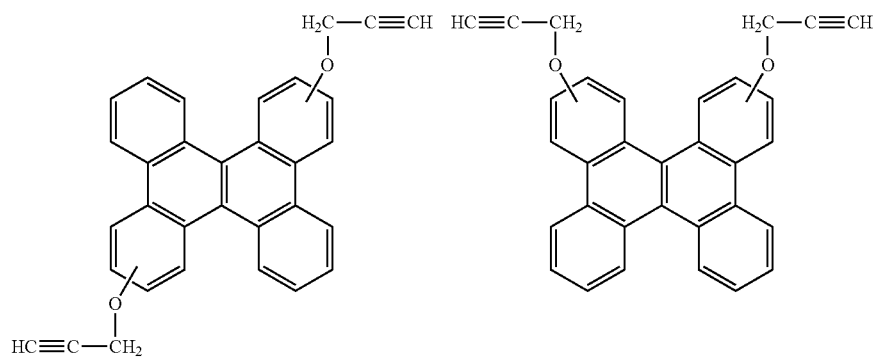
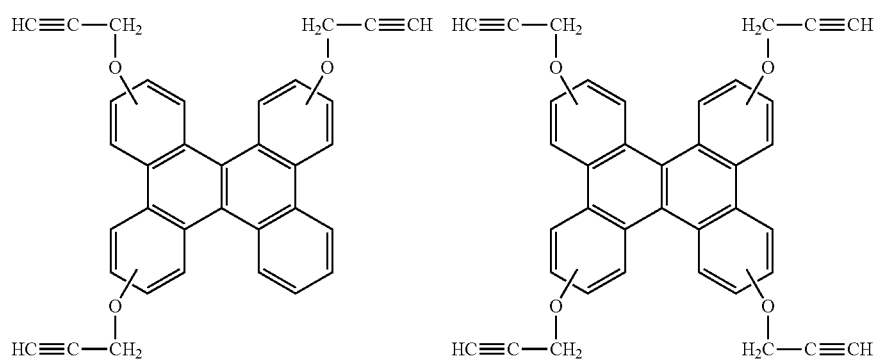
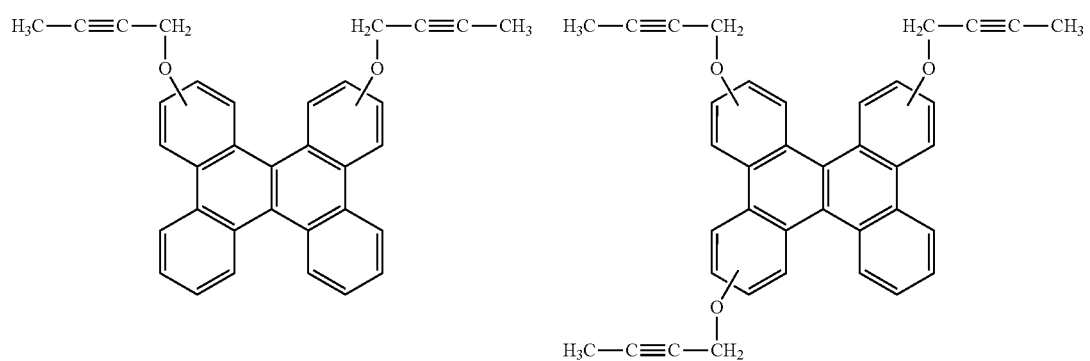

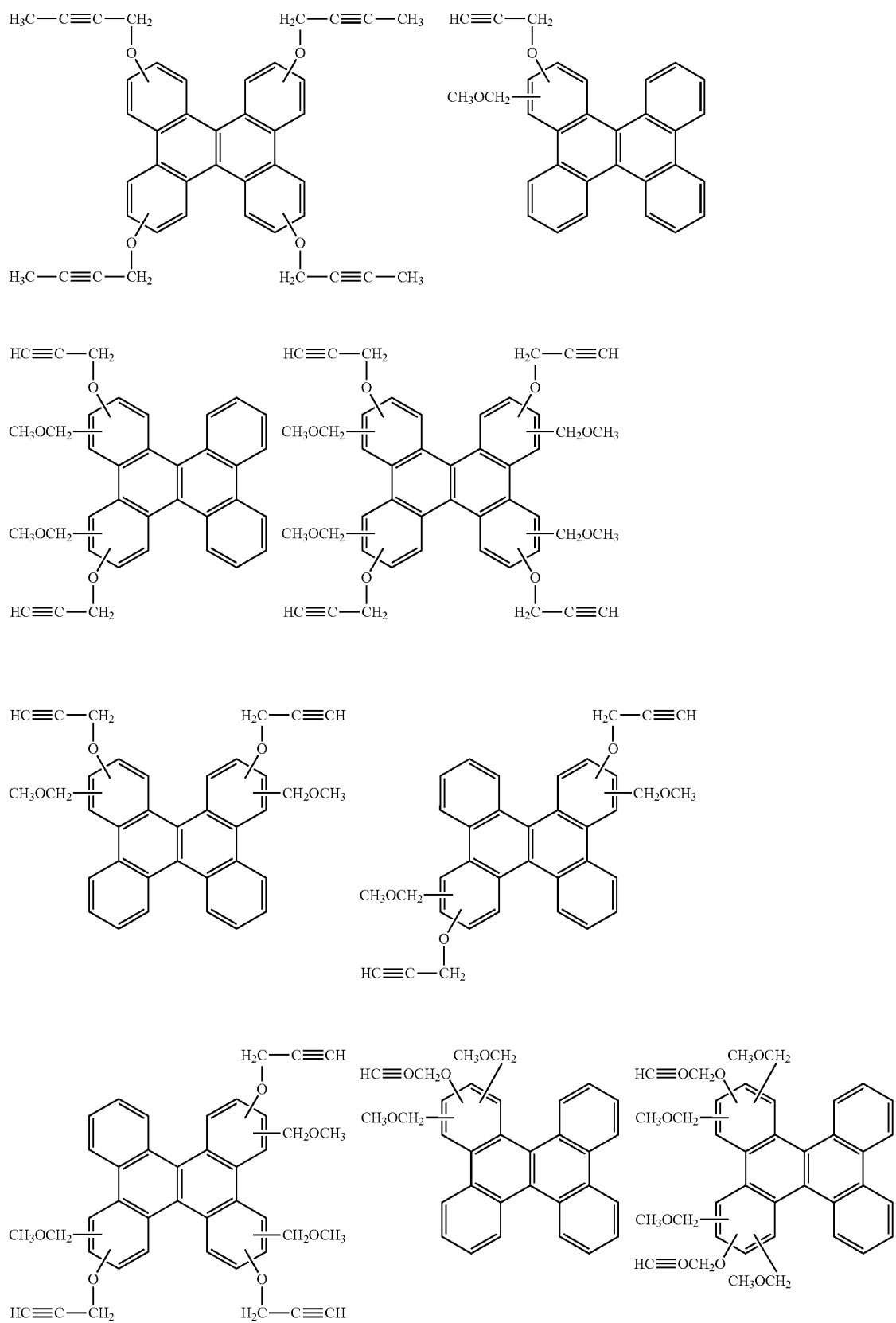

23
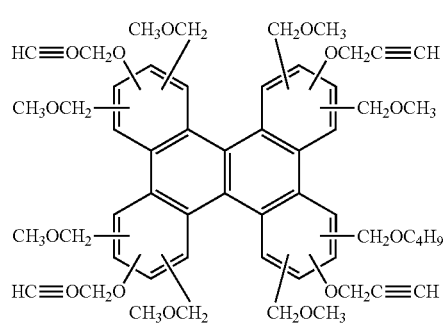
-continued
24
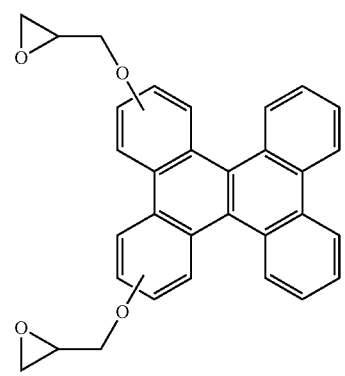
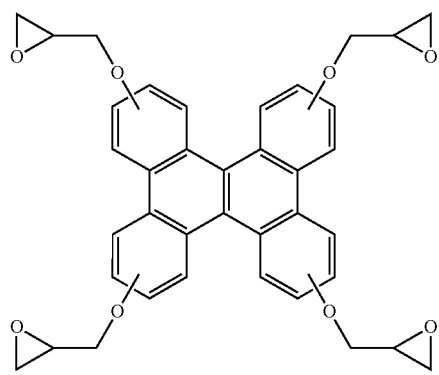
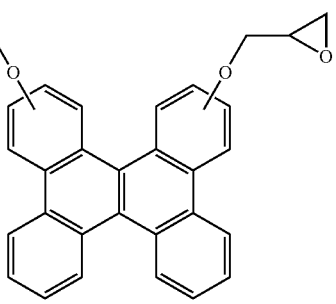
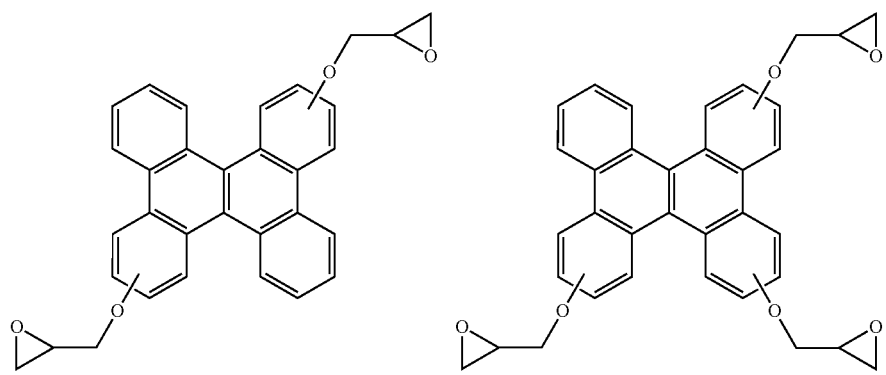
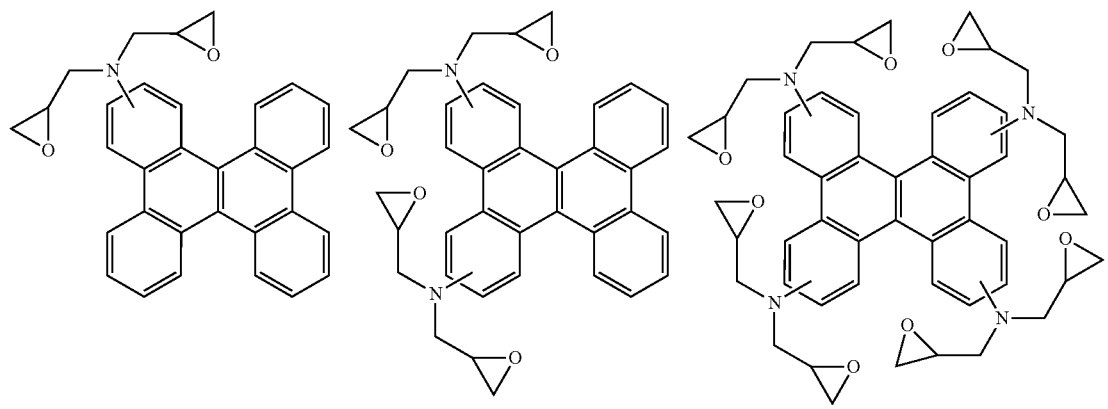

-continued
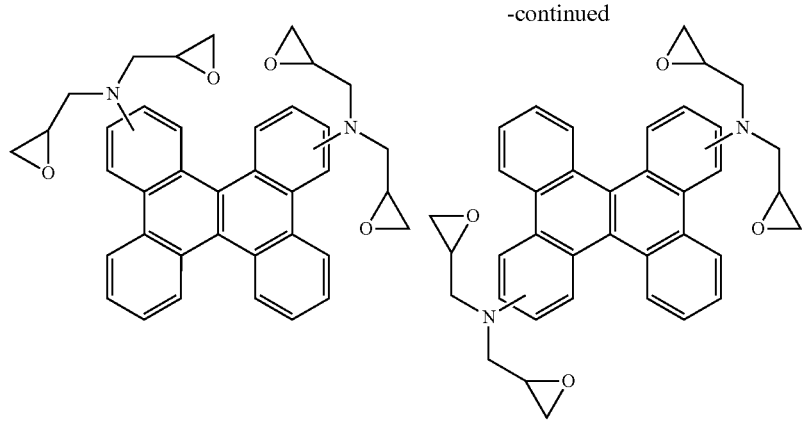
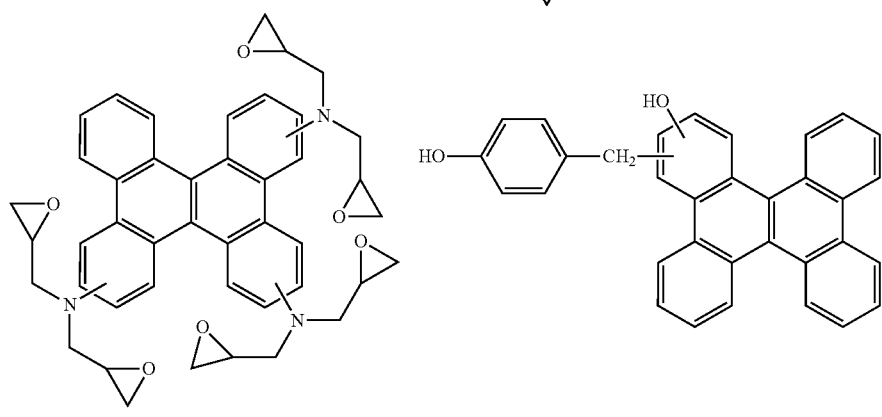
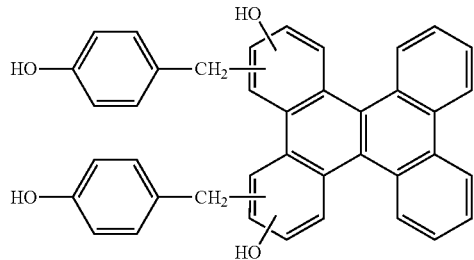
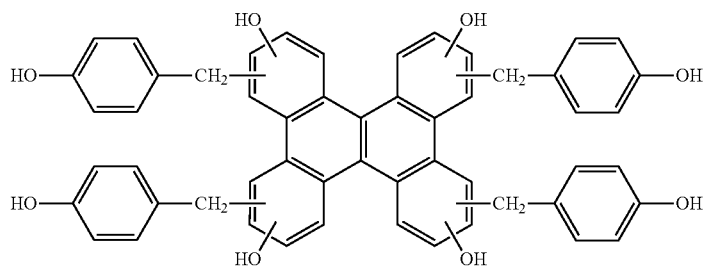
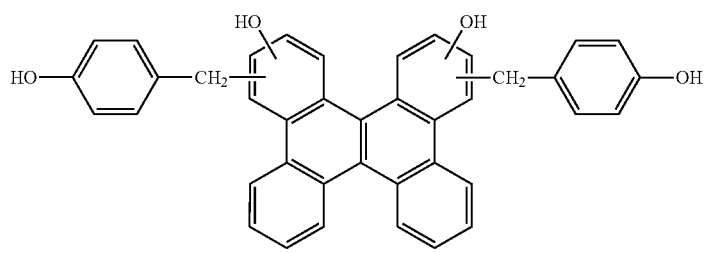

-continued
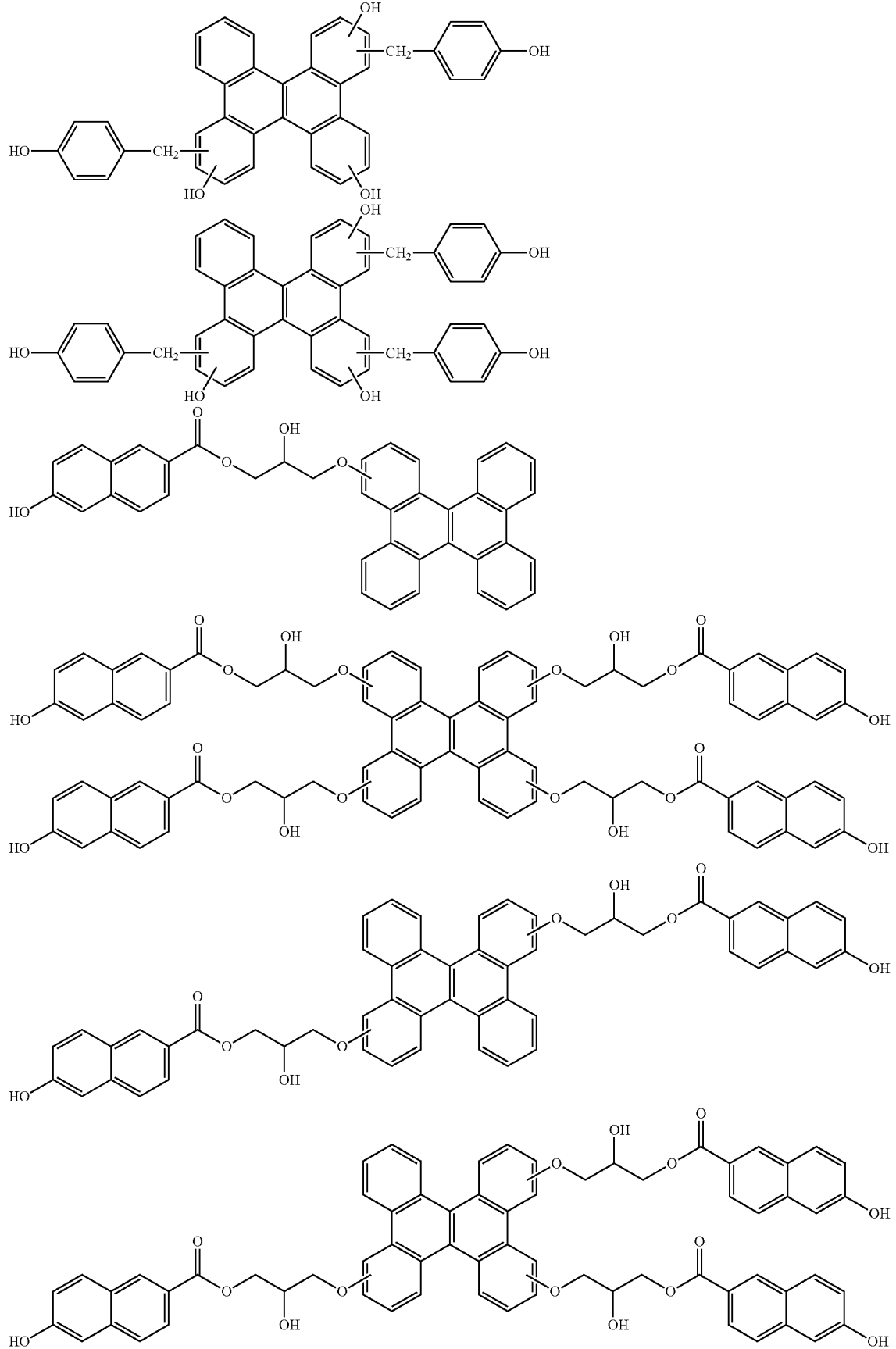

-continued
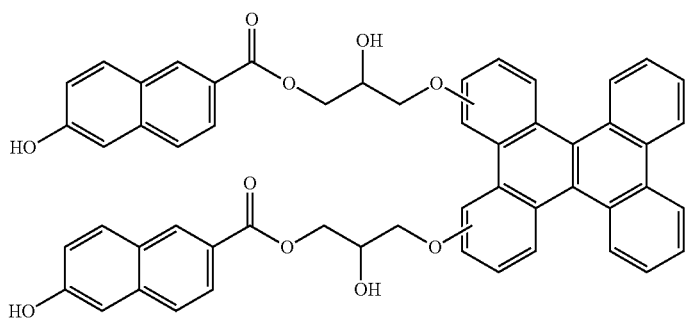
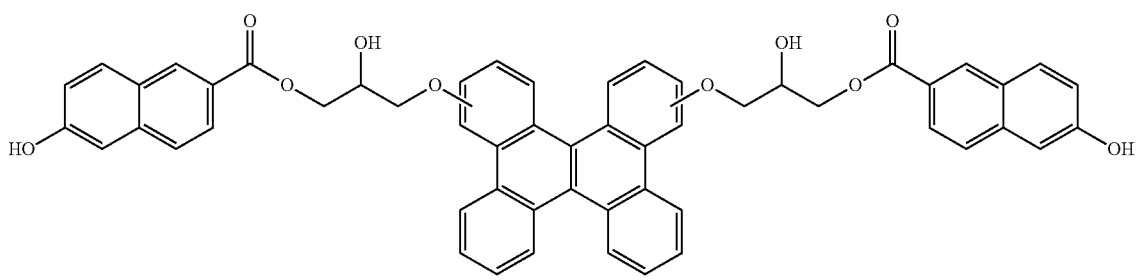
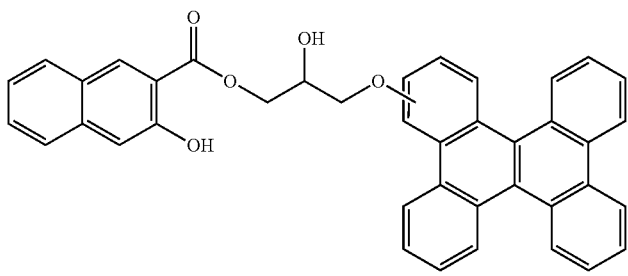
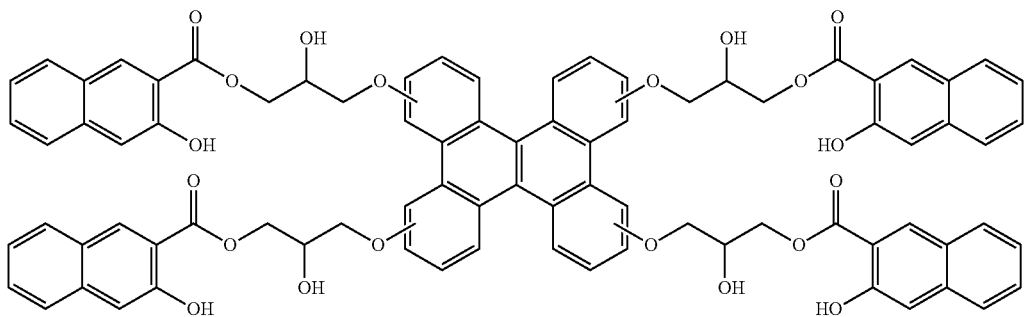
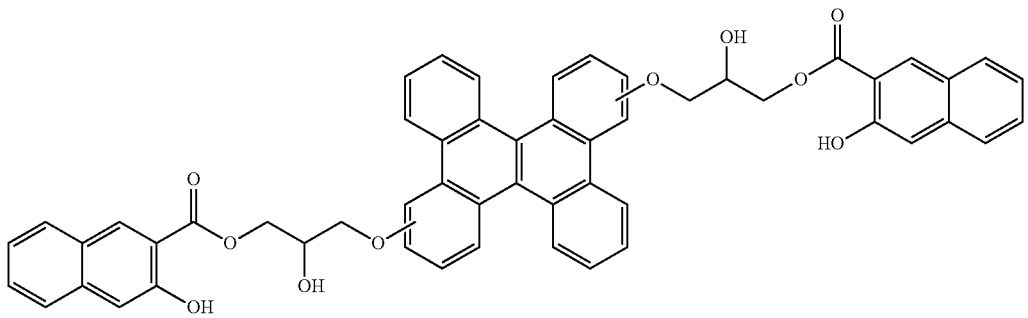

-continued
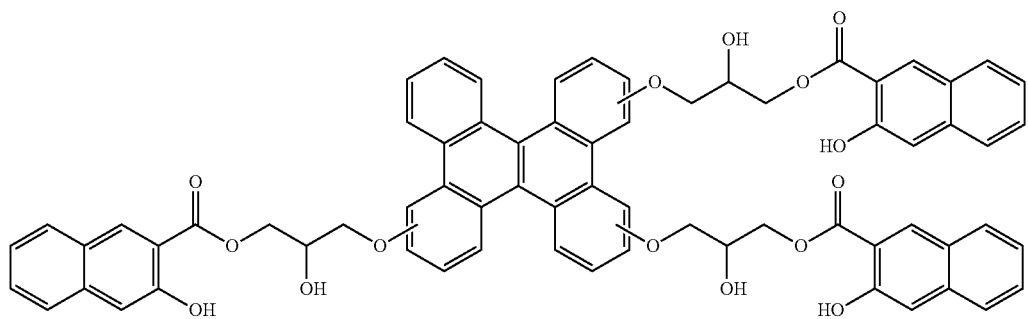
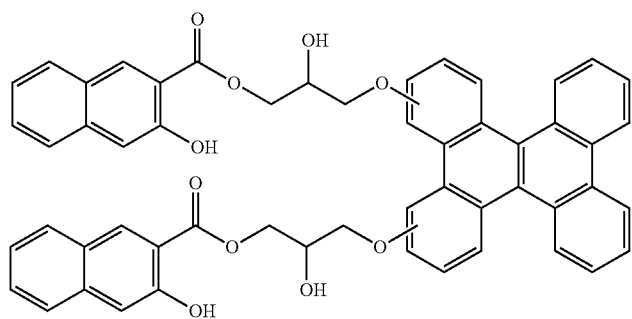
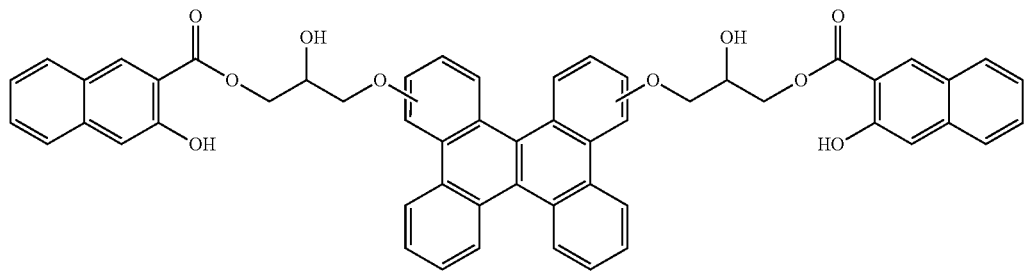
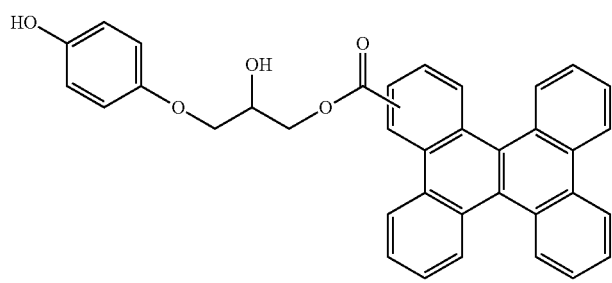
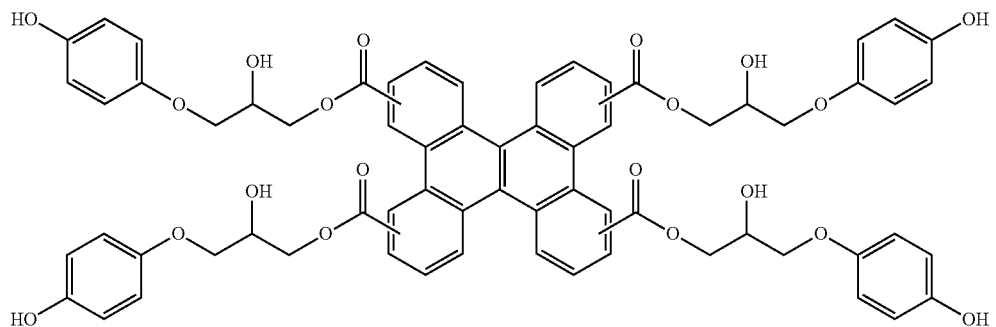

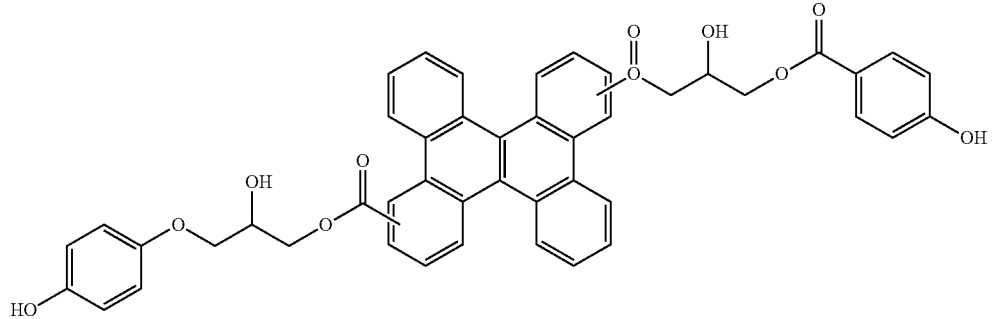
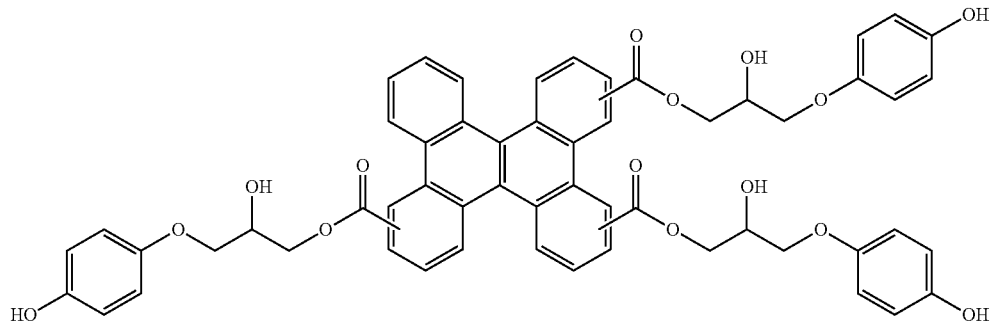
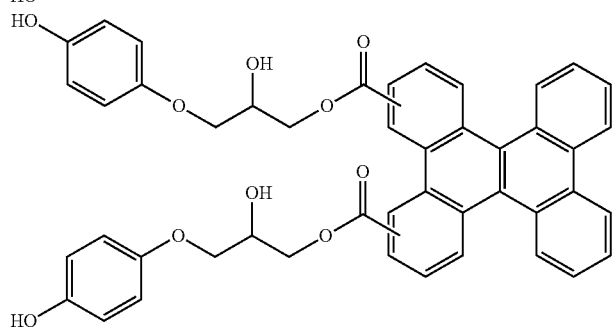
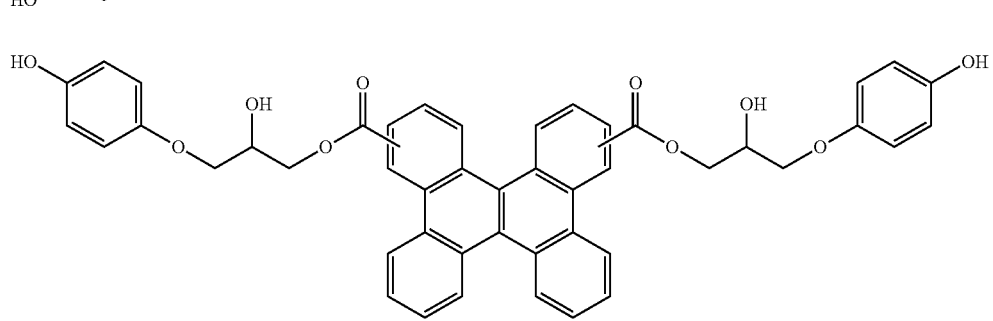
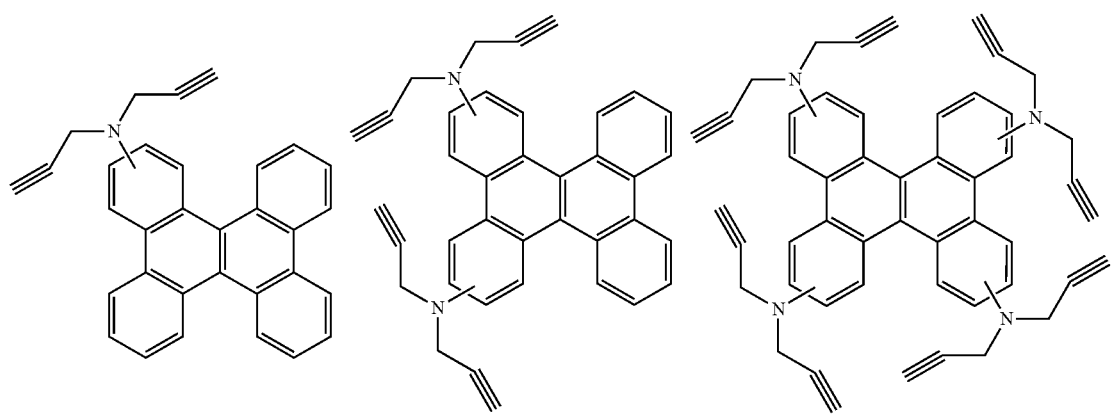

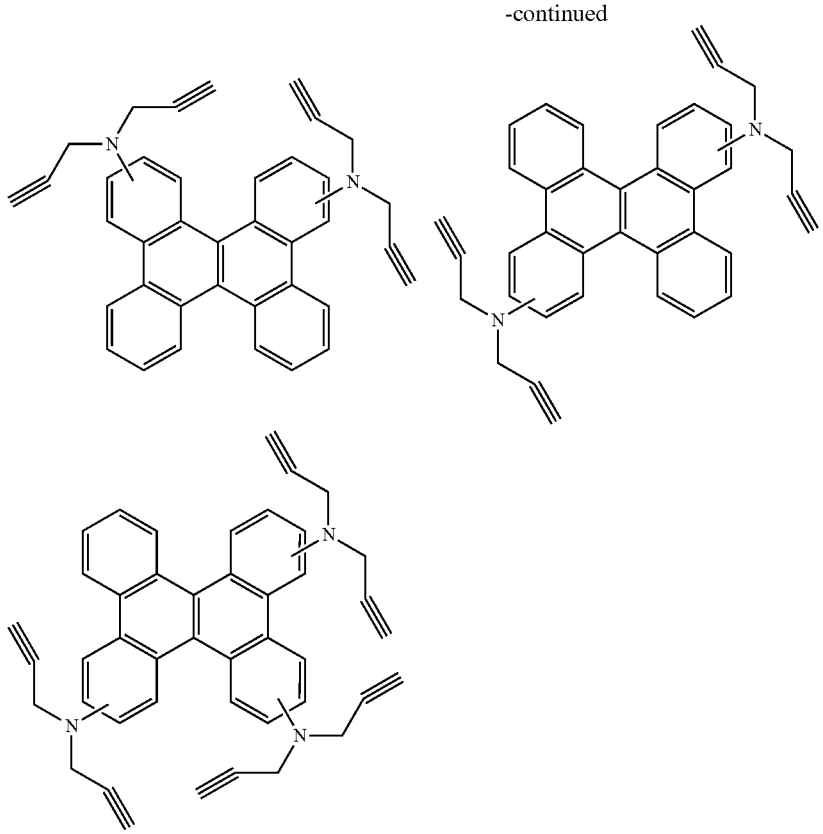

The inventive composition for forming a resist underlayer film preferably contains, as the condensate, a condensate obtained by a reaction of one or more compounds shown by the general formula (1) with one or more compounds selected from a compound shown by the following general formula (2-1), a compound shown by the following general formula (2-2), trioxane, paraformaldehyde, and fluorenone, $$Y^1\text{—CHO} \quad (2\text{-}1)$$

wherein $Y^1$ represents a hydrogen atom or a monovalent organic group having 1 to 30 carbon atoms and optionally containing a substituent, $$R^9\text{—CH}_2\text{—}Y^2\text{—CH}_2\text{—}R^9 \quad (2\text{-}2)$$

wherein $Y^2$ represents an aromatic group having 6 or more carbon atoms and optionally containing a substituent; $R^9$ represents an alkoxy group or alkanoyloxy group having 1 to 6 carbon atoms, or a halogen atom.

Illustrative examples of the aldehyde compound shown by the general formula (2-1) include formaldehyde, furfurylaldehyde, benzaldehyde, naphthaldehyde, p-hydroxybenzaldehyde, and compounds described in Japanese Patent Application Publication No. 2012-098431, No. 2012-118300, and No. 2012-145897.

In addition, an equivalent of the formula (2-1) may also be used. Examples of the equivalent include compounds shown by the following general formulae,

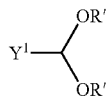 (2-1A)

wherein $Y^1$ is as defined above, and each R' may be the same or different and represents a monovalent hydrocarbon group having 1 to 10 carbon atoms,

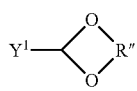 (2-1B)

wherein $Y^1$ is as defined above, and R" represents a divalent hydrocarbon group having 1 to 10 carbon atoms; and compounds in which the α-carbon atom of the formyl group bonds to a hydrogen atom, shown by the following general formula,

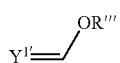 (2-1C)

wherein $Y^{1'}$ represents an organic group that has one hydrogen atom fewer than $Y^1$, and R'" represents a monovalent hydrocarbon group having 1 to 10 carbon atoms. For example, trioxane and paraformaldehyde are equivalent of formaldehyde.

Illustrative examples of the compound shown by the general formula (2-2) include the following compounds.

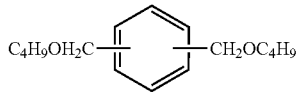
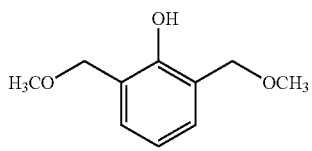
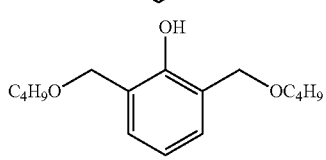
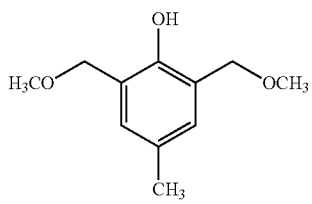
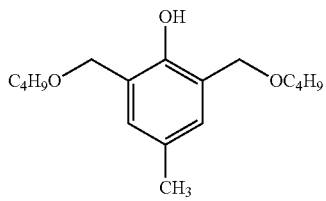
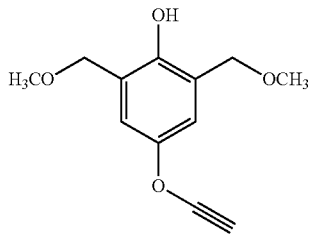
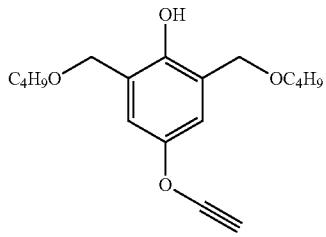
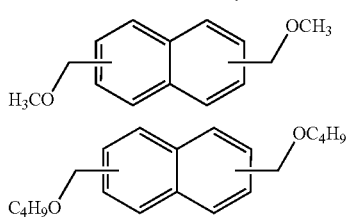
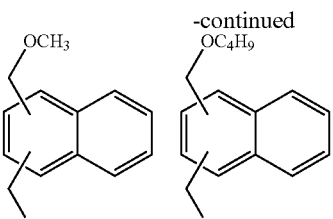
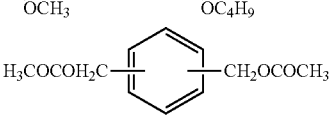
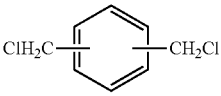

In addition, the inventive composition for forming a resist underlayer film preferably contains, as the condensate, a condensate obtained by a reaction with one or more compounds selected from compounds shown by the following general formulae (3-1), (3-2), (3-3), (3-4), and (3-5),

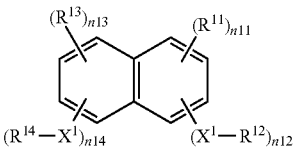

(3-1)

wherein $R^{11}$ and $R^{13}$ represent $Z^1$, where $Z^1$ is as defined above, an amino group, a diglycidylamino group, or a dipropargylamino group; $R^{12}$ and $R^{14}$ represent $Z^2$, where $Z^2$ is as defined above, a glycidyl group, a diglycidylamino group, or a dipropargylamino group; a single bond contained in $R^{11}$ to $R^{14}$ may be substituted by a double bond, a triple bond, an ether group, a carbonyl group, or a carbonyloxy group; a hydrogen atom contained in $R^{11}$ to $R^{14}$ may be substituted by a fluorine atom, a chlorine atom, or a hydroxyl group; two substituents selected from $R^{11}$, $R^{12}$, $R^{13}$, and $R^{14}$ may be bonded intramolecularly to form a cyclic substituent; $X^1$ represents a group shown by the following formula (3-6); and n11 to n14 are each a number satisfying $0 \leq n11 \leq 4$, $0 \leq n12 \leq 4$, $0 \leq n13 \leq 4$, $0 \leq n14 \leq 4$, $0 \leq n11+n12 \leq 4$, $0 \leq n13+n14 \leq 4$, and $1 \leq n11+n12+n13+n14 \leq 8$,

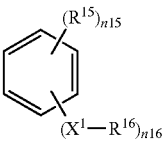

(3-2)

wherein $R^{15}$ represents a fluorine atom, a chlorine atom, $Z^1$, where $Z^1$ is as defined above, a diglycidylamino group, or a dipropargylamino group; $R^{16}$ represents $Z^2$, where $Z^2$ is as defined above, a glycidyl group, a diglycidylamino group, or a dipropargylamino group; a single bond contained in $R^{15}$ and $R^{16}$ may be substituted by a double bond, a triple bond, an ether group, a carbonyl group, or a carbonyloxy group; a hydrogen atom contained in $R^{15}$ and $R^{16}$ may be substituted by a fluorine atom, a chlorine atom, or a hydroxyl group; two substituents selected from $R^{15}$ and $R^{16}$ may be bonded intramolecularly to form a cyclic substituent; $X^1$ represents a group shown by the following formula (3-6); and n15 and n16 are each a number satisfying $0 \leq n15 \leq 6$, $0 \leq n16 \leq 6$, and $1 \leq n15+n16 \leq 6$, (3-3)

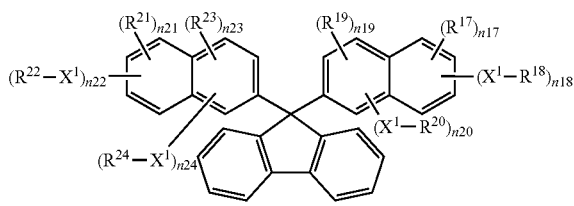

wherein $R^{17}$, $R^{19}$, $R^{21}$, and $R^{23}$ represent $Z^1$, where $Z^1$ is as defined above, a diglycidylamino group, or a dipropargylamino group; $R^{18}$ and $R^{22}$ represent $Z^2$, where $Z^2$ is as defined above, a glycidyl group, a glycidyloxyethyl group, a diglycidylamino group, or a dipropargylamino group; $R^{20}$ and $R^{24}$ represent $Z^2$, where $Z^2$ is as defined above, a glycidyl group, a diglycidylamino group, or a dipropargylamino group; a single bond contained in $R^{17}$ to $R^{24}$ may be substituted by a double bond, a triple bond, an ether group, a carbonyl group, or a carbonyloxy group; a hydrogen atom contained in $R^{17}$ to $R^{24}$ may be substituted by a fluorine atom, a chlorine atom, or a hydroxyl group; $X^1$ represents a group shown by the following formula (3-6); and n17 to n24 are each a number satisfying $0 \leq n17 \leq 4$, $0 \leq n18 \leq 4$, $0 \leq n19 \leq 3$, $0 \leq n20 \leq 3$, $0 \leq n21 \leq 4$, $0 \leq n22 \leq 4$, $0 \leq n23 \leq 3$, $0 \leq n24 \leq 3$, $0 \leq n17+n18 \leq 4$, $0 \leq n19+n20 \leq 3$, $0 \leq n21+n22 \leq 4$, $0 \leq n23+n24 \leq 3$, $1 \leq n17+n18+n19+n20 \leq 7$, and $1 \leq n21+n22+n23+n24 \leq 7$, (3-4)

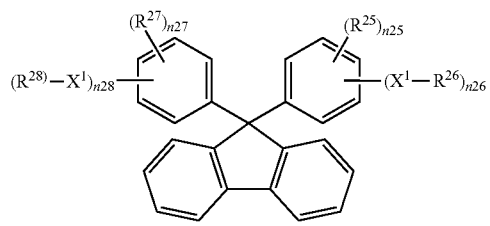

wherein $R^{25}$ and $R^{27}$ represent $Z^1$, where $Z^1$ is as defined above, a diglycidylamino group, or a dipropargylamino group; $R^{26}$ and $R^{28}$ represent $Z^2$, where $Z^2$ is as defined above, a glycidyl group, a glycidyloxyethyl group, a diglycidylamino group, or a dipropargylamino group; a single bond contained in $R^{25}$ to $R^{28}$ may be substituted by a double bond, a triple bond, an ether group, a carbonyl group, or a carbonyloxy group; a hydrogen atom contained in $R^{25}$ to $R^{28}$ may be substituted by a fluorine atom, a chlorine atom, or a hydroxyl group; $X^1$ represents a group shown by the following formula (3-6); and n25 to n28 are each a number satisfying $0 \leq n25 \leq 5$, $0 \leq n26 \leq 5$, $0 \leq n27 \leq 5$, $0 \leq n28 \leq 5$, $1 \leq n25+n26 \leq 5$, and $1 \leq n27+n28 \leq 5$, (3-5)

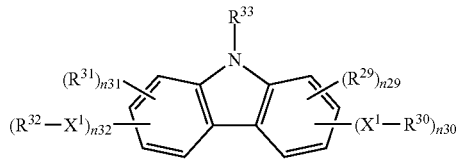

wherein $R^{29}$ and $R^{31}$ represent $Z^1$, where $Z^1$ is as defined above, a diglycidylamino group, or a dipropargylamino group; $R^{30}$, $R^{32}$, and $R^{33}$ represent $Z^2$, where $Z^2$ is as defined above, a glycidyl group, a diglycidylamino group, or a dipropargylamino group; a single bond contained in $R^{29}$ to $R^{33}$ may be substituted by a double bond, a triple bond, an ether group, a carbonyl group, or a carbonyloxy group; a hydrogen atom contained in $R^{29}$ to $R^{33}$ may be substituted by a fluorine atom, a chlorine atom, or a hydroxyl group; $X^1$ represents a group shown by the following formula (3-6); and n29 to n32 are each a number satisfying $0 \leq n29 \leq 4$, $0 \leq n30 \leq 4$, $0 \leq n31 \leq 4$, $0 \leq n32 \leq 4$, $0 \leq n29+n30 \leq 4$, and $0 \leq n31+n32 \leq 4$, (3-6)

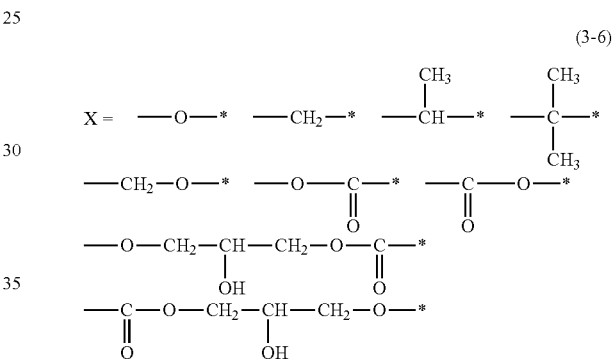

wherein * represents a binding site with $R^q$ where q represents 12, 14, 16, 18, 20, 22, 24, 26, 28, 30, or 32.

Illustrative examples of the compound shown by the general formula (3-1) include 1-methylnaphthalene, 2-methylnaphthalene, 1,3-dimethylnaphthalene, 1,5-dimethylnaphthalene, 1,7-dimethylnaphthalene, 2,7-dimethylnaphthalene, 2-vinylnaphthalene, 2,6-divinylnaphthalene, acenaphthene, acenaphthylene, anthracene, 1-methoxynaphthalene, 2-methoxynaphthalene, 1,4-dimethoxynaphthalene, 2,7-dimethoxynaphthalene, 1-naphthol, 2-naphthol, 2-methyl-1-naphthol, 4-methoxy-1-naphthol, 7-methoxy-2-naphthol, 1,2-dihydroxynaphthalene, 1,3-dihydroxynaphthalene, 2,3-dihydroxynaphthalene, 1,4-dihydroxynaphthalene, 1,5-dihydroxynaphthalene, 1,6-dihydroxynaphthalene, 2,6-dihydroxynaphthalene, 1,7-dihydroxynaphthalene, 2,7-dihydroxynaphthalene, 1,8-dihydroxynaphthalene, 5-amino-1-naphthol, 2-methoxycarbonyl-1-naphthol, 1-(4-hydroxyphenyl) naphthalene, 6-(4-hydroxyphenyl)-2-naphthol, 6-(cyclohexyl)-2-naphthol, 1,1'-bi-2,2'-naphthol, 6,6'-bi-2,2'-naphthol, 9,9-bis(6-hydroxy-2-naphthyl)fluorene, 6-hydroxy-2-vinylnaphthalene, 1-hydroxymethylnaphthalene, 2-hydroxymethylnaphthalene, 1-glycidoxynaphthalene, 2-glycidoxynaphthalene, 1,3-diglycidoxynaphthalene, 1,5-diglycidoxynaphthalene, 1,7-diglycidoxynaphthalene, and 2,7-diglycidoxynaphthalene.

Illustrative examples of the compound shown by the general formula (3-2) include toluene, o-xylene, m-xylene, p-xylene, cumene, indane, indene, mesitylene, biphenyl, fluorene, phenol, anisole, o-cresol, m-cresol, p-cresol, 2,3-dimethylphenol, 2,5-dimethylphenol, 3,4-dimethylphenol, 3,5-dimethylphenol, 2,4-dimethylphenol, 2,6-dimethylphenol, 2,3,5-trimethylphenol, 3,4,5-trimethylphenol, 2-t-butylphenol, 3-t-butylphenol, 4-t-butylphenol, resorcinol, 2-methylresorcinol, 4-methylresorcinol, 5-methylresorcinol, catechol, 4-t-butylcatechol, 2-methoxyphenol, 3-methoxyphenol, 2-propylphenol, 3-propylphenol, 4-propylphenol, 2-isopropylphenol, 3-isopropylphenol, 4-isopropylphenol, 2-methoxy-5-methylphenol, 2-t-butyl-5-methylphenol, 4-phenylphenol, tritylphenol, pyrogallol, thymol, phenylglycidyl ether, 4-fluorophenol, 3,4-difluorophenol, 4-trifluoromethylphenol, 4-chlorophenol, 9,9-bis(4-hydroxyphenyl)fluorene, styrene, 4-t-butoxystyrene, 4-acetoxystyrene, 4-methoxystyrene, divinylbenzene, and benzyl alcohol.

Illustrative examples of the compound shown by the general formula (3-3) include the following compounds.

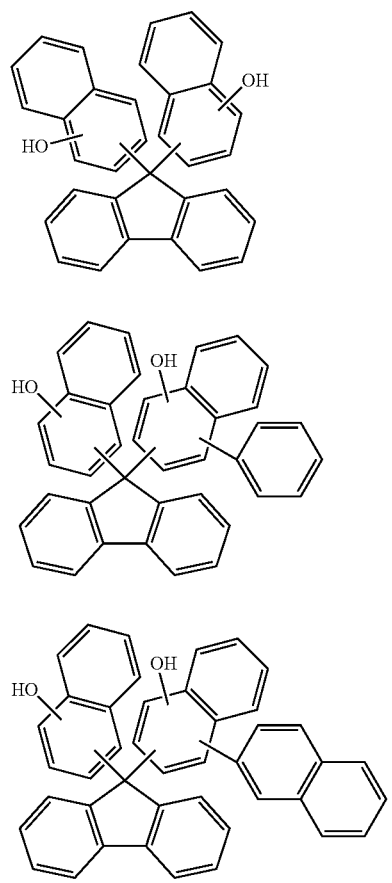

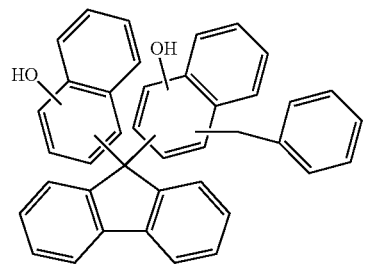

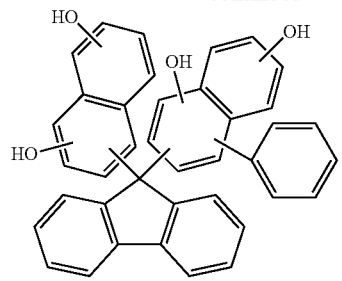

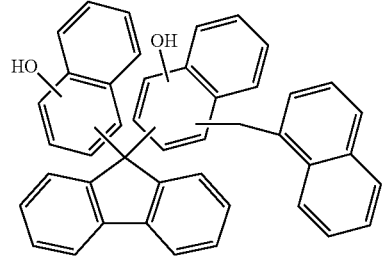

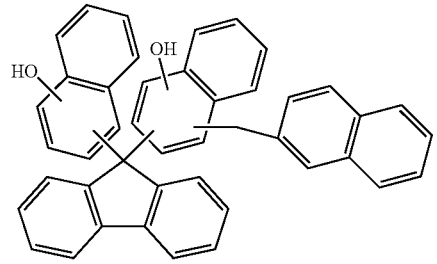

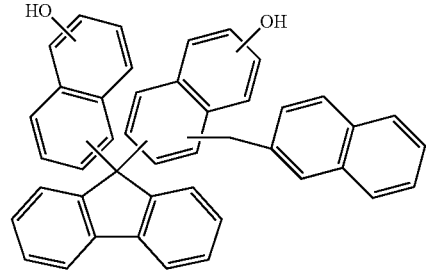

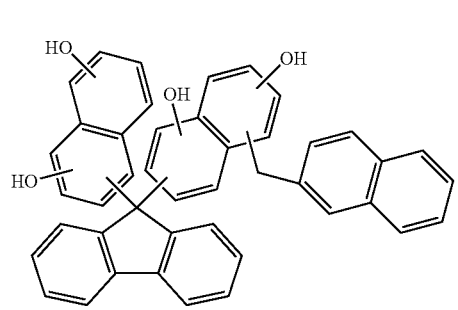

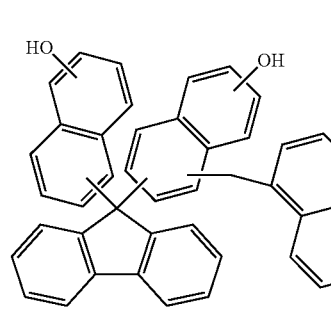

-continued
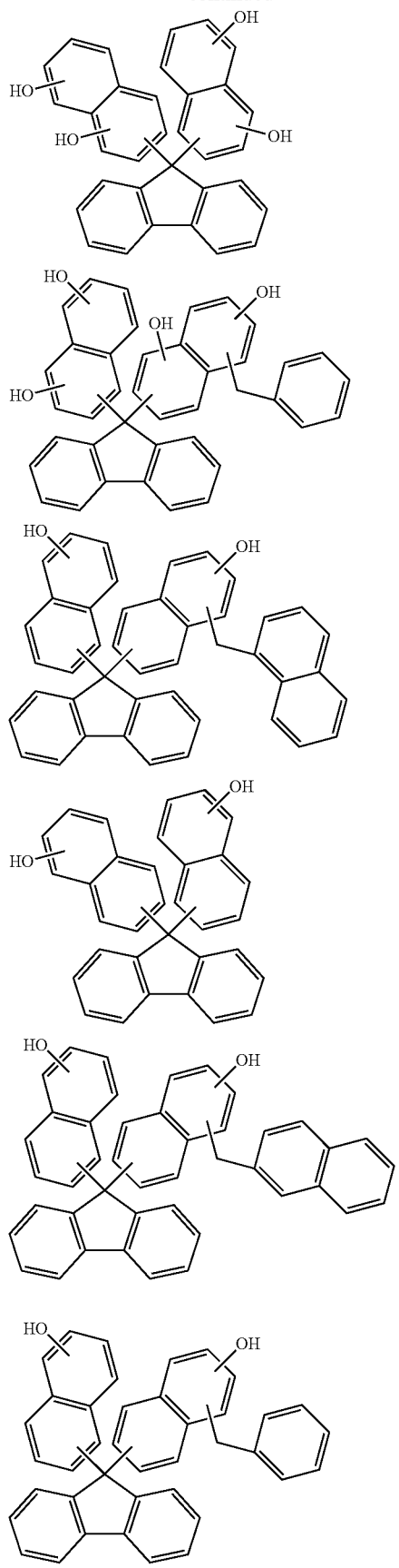
-continued
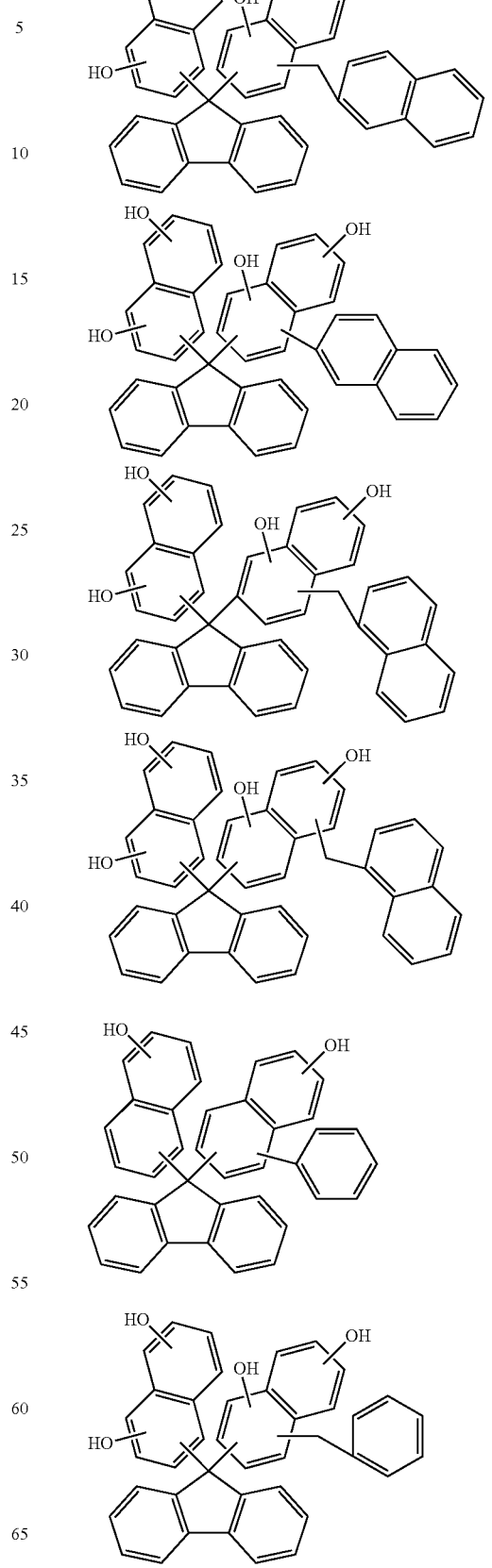

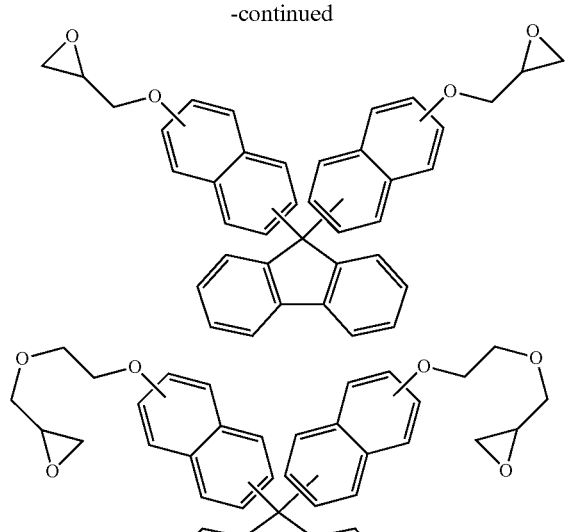
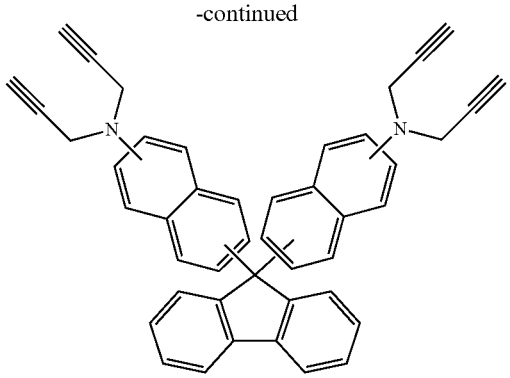
Illustrative examples of the compound shown by the general formula (3-4) include the following compounds.
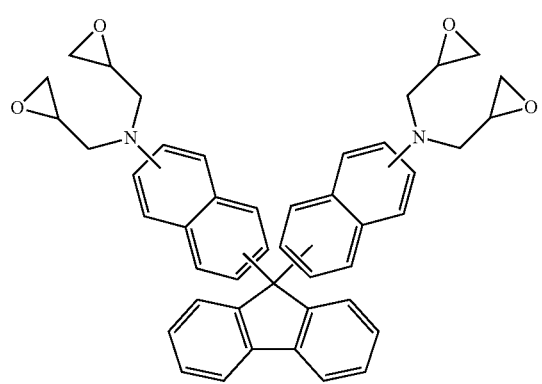
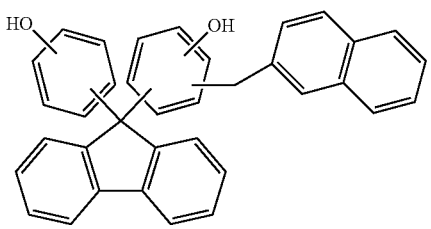
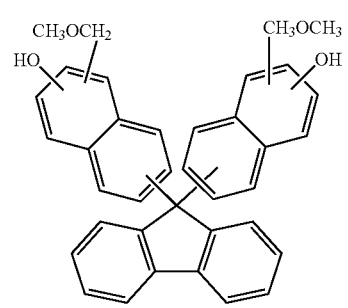
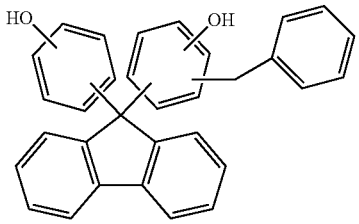
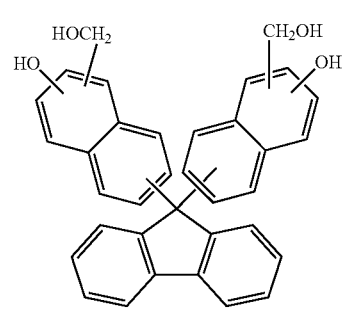
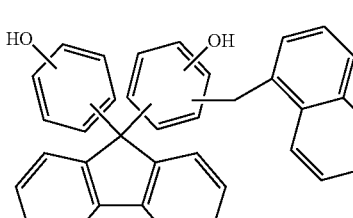

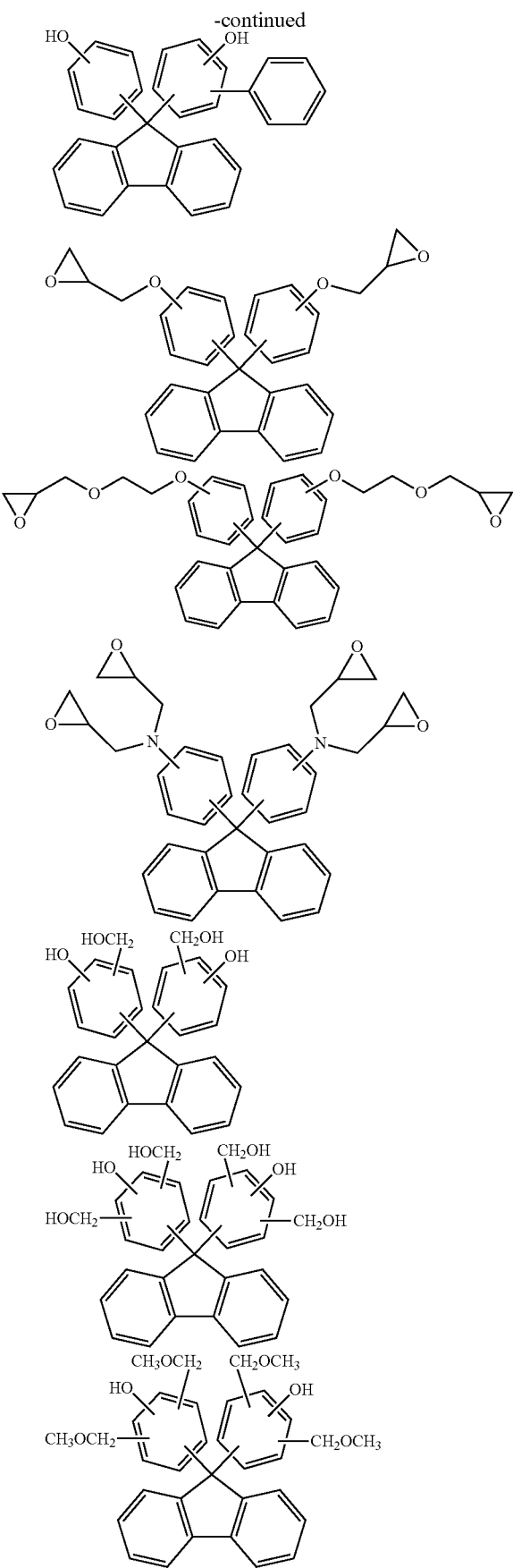
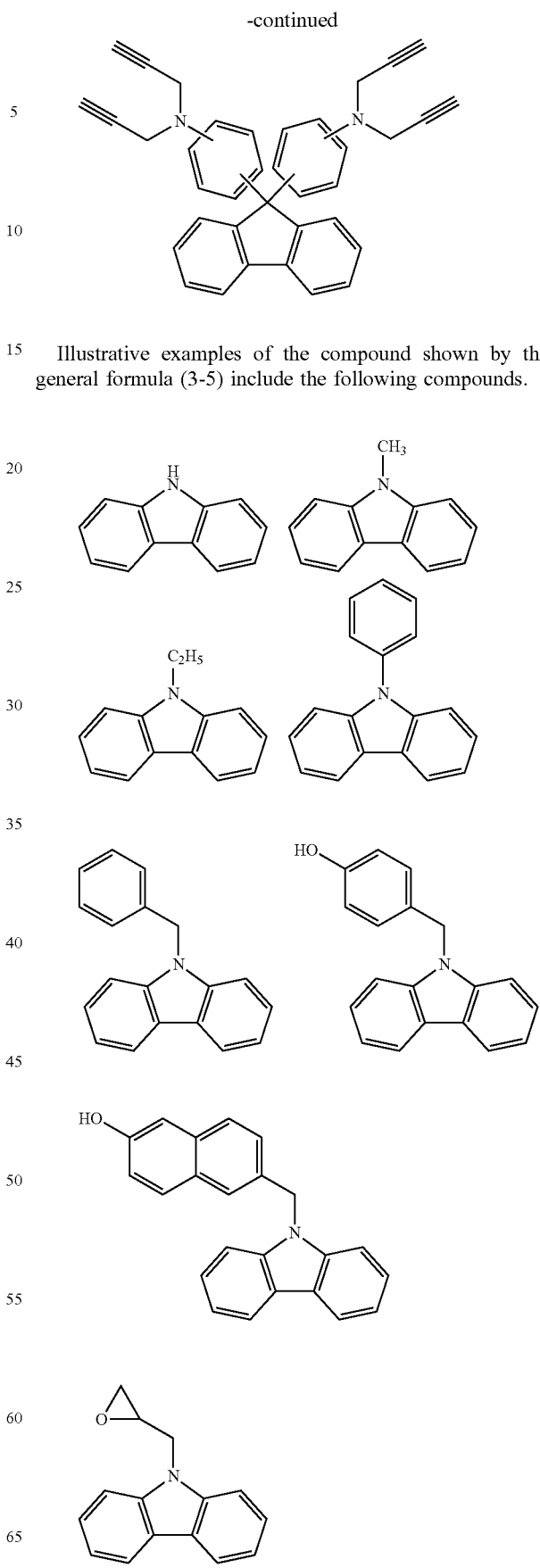
Illustrative examples of the compound shown by the general formula (3-5) include the following compounds.

-continued

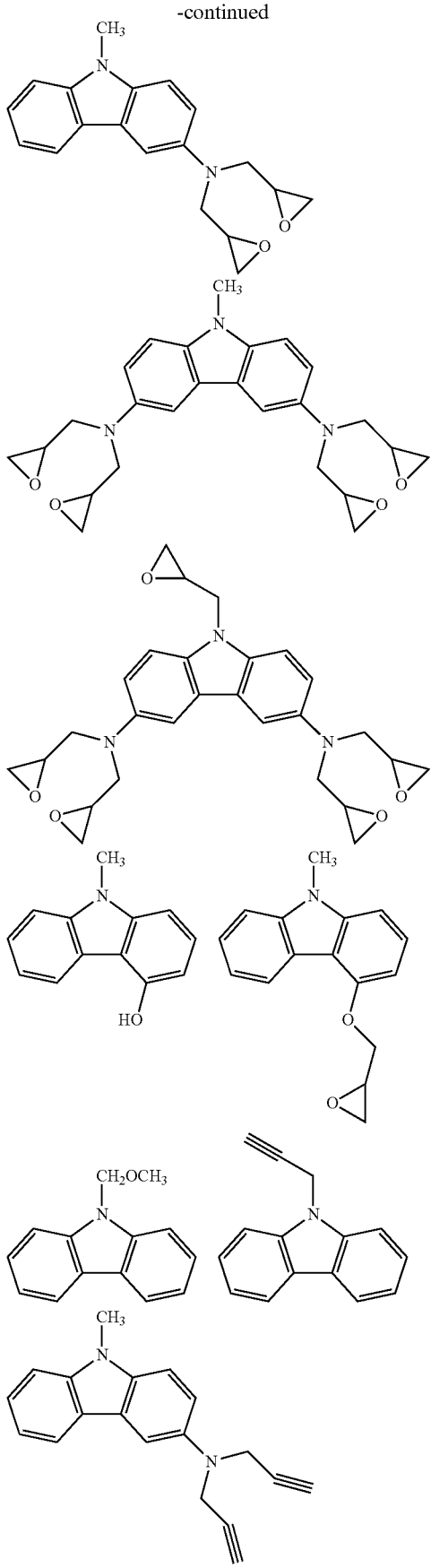

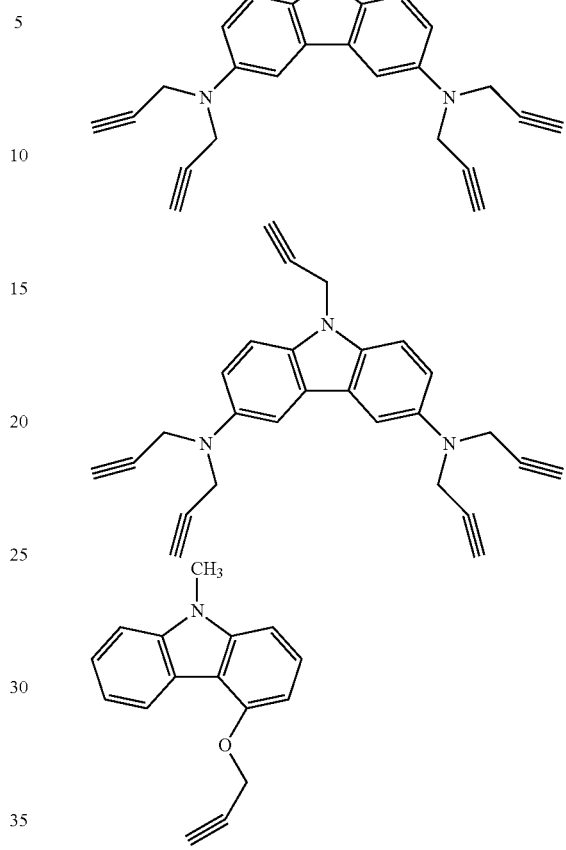

The compounds shown by the general formulae (3-1), (3-2), (3-3), (3-4), and (3-5) may be used solely, or may be used in combination of two or more kinds and react with one or more compounds shown by the general formula (1) to control the n-value, k-value, and etching resistance. Moreover, these compounds may react with one or more compounds shown by the general formula (1) together with one or more compounds selected from the compound shown by the general formula (2-1), the compound shown by the general formula (2-2), trioxane, paraformaldehyde, and fluorenone.

In addition, the inventive composition for forming a resist underlayer film may contain a substituted condensate obtained by substituting a part of hydrogen atoms contained in the above-mentioned condensate by a glycidyl group.

Furthermore, the inventive composition for forming a resist underlayer film preferably contains two or more of the compound shown by the general formula (1), the condensate of the compound, and the substituted condensate obtained by substituting a part of hydrogen atoms of the condensate by a glycidyl group.

The condensate obtained by polycondensation reaction of the above-mentioned raw materials can be usually produced by using an acid or a base as a catalyst in a solvent or without solvent at room temperature or under cooling or heating as needed.

Illustrative examples of the solvent to be used include alcohols such as methanol, ethanol, isopropyl alcohol, butanol, ethylene glycol, propylene glycol, diethylene glycol, glycerol, methyl cellosolve, ethyl cellosolve, butyl cellosolve, and propylene glycol monomethyl ether; ethers such as diethyl ether, dibutyl ether, diethylene glycol diethyl ether, diethylene glycol dimethyl ether, tetrahydrofuran, and 1,4-dioxane; chlorinated solvents such as methylene chloride, chloroform, dichloroethane, and trichloroethylene; hydrocarbons such as hexane, heptane, benzene, toluene, xylene, and cumene; nitriles such as acetonitrile; ketones such as acetone, ethyl methyl ketone, and isobutyl methyl ketone; esters such as ethyl acetate, n-butyl acetate, and propylene glycol methyl ether acetate; lactones such as γ-butyrolactone; and non-protic polar solvents such as dimethyl sulfoxide, N,N-dimethyl formamide, and hexamethyl phosphoric triamide. These solvents may be used solely or in combination of two or more kinds thereof. These solvents may be used in the range of 0 and 2,000 parts by mass based on 100 parts by mass of the reaction raw materials.

Illustrative examples of the acid catalyst to be used include inorganic acids such as hydrochloric acid, hydrobromic acid, sulfuric acid, nitric acid, phosphoric acid, and heteropolyacid; organic acids such as oxalic acid, trifluoroacetic acid, methanesulfonic acid, benzenesulfonic acid, p-toluenesulfonic acid, and trifluoromethanesulfonic acid; and Lewis acids such as aluminum trichloride, aluminum ethoxide, aluminum isopropoxide, boron trifluoride, boron trichloride, boron tribromide, tin tetrachloride, tin tetrabromide, dibutyltin dichloride, dibutyltin dimethoxide, dibutyltin oxide, titanium tetrachloride, titanium tetrabromide, titanium(IV) methoxide, titanium(IV) ethoxide, titanium(IV) isopropoxide, and titanium(IV) oxide.

Illustrative examples of the base catalyst to be used include inorganic bases such as sodium hydroxide, potassium hydroxide, barium hydroxide, sodium carbonate, sodium hydrogencarbonate, potassium carbonate, lithium hydride, sodium hydride, potassium hydride, and calcium hydride; alkyl metals such as methyl lithium, n-butyl lithium, methyl magnesium chloride, and ethyl magnesium bromide; alkoxides such as sodium methoxide, sodium ethoxide, and potassium t-butoxide; and organic bases such as triethyl amine, diisopropyl ethyl amine, N,N-dimethylaniline, pyridine, and 4-dimethylamino pyridine.

The amount of the catalyst to be used is in the range of 0.001 to 100 mass %, preferably 0.005 to 50 mass % with respect to the raw materials. The reaction temperature is preferably from −50° C. to about boiling point of the solvent, more preferably from room temperature to 100° C.

The polycondensation reaction may be performed by charging the compounds used as raw materials and the catalyst all at once or by adding dropwise the compounds used as raw materials in the presence of the catalyst.

After completion of the polycondensation reaction, an unreacted raw material, catalyst, and so on in the reaction system can be removed by a suitable method, including increasing the temperature of the reaction vessel to 130 to 230° C. at about 1 to 50 mmHg to remove volatile components; adding an appropriate solvent or water to fractionate the condensate; or dissolving the condensate in a good solvent and then reprecipitating the condensate in a poor solvent, depending on characteristics of the reaction product to be obtained.

The molecular weight of the condensate thus obtained in terms of polystyrene is preferably a weight average molecular weight (Mw) of 500 to 500,000, particularly 1,000 to 100,000. The molecular weight dispersity is preferably in the range of 1.2 to 20. When monomer components, oligomer components, or low-molecular weight components having a molecular weight (Mw) of 1,000 or less are cut, volatile components during baking can be reduced so that pollution around a baking cup and surface defects due to drop of the volatile components can be prevented.

Into this condensate, a condensed aromatic or alicyclic substituent may be introduced.

Illustrative examples of the introducible substituent are shown below.

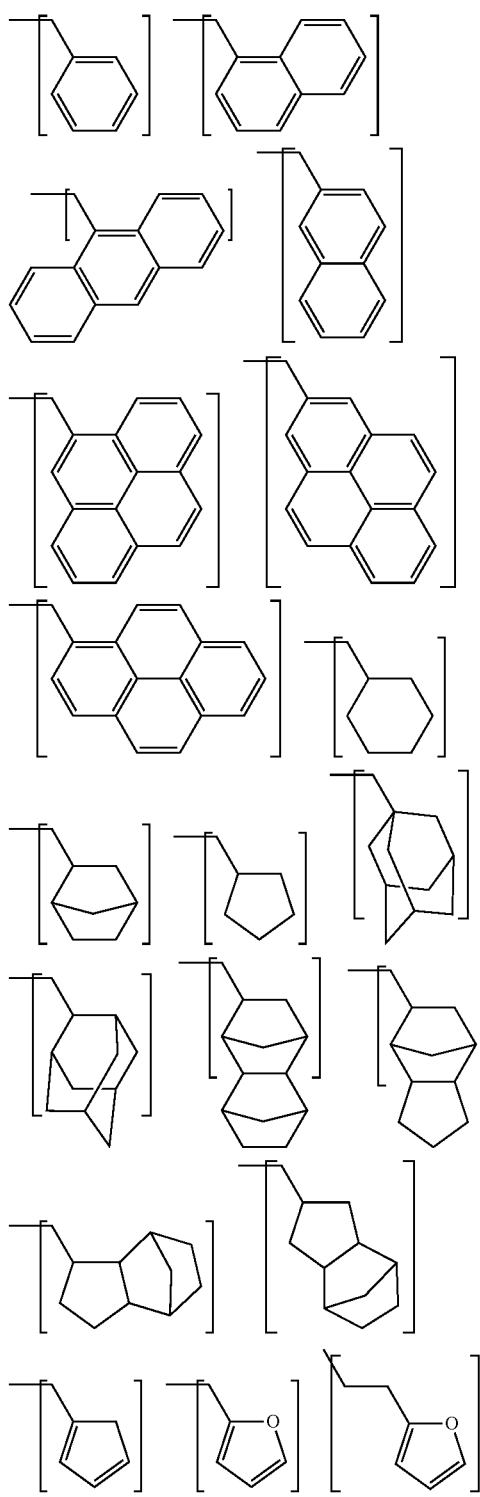

-continued

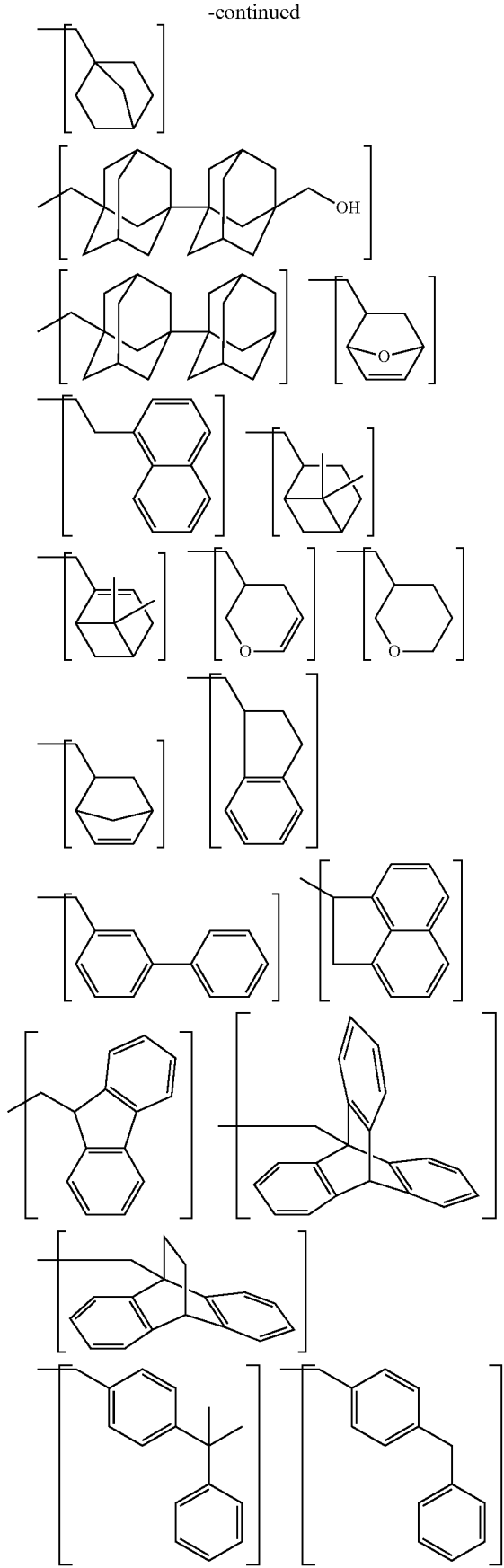

-continued

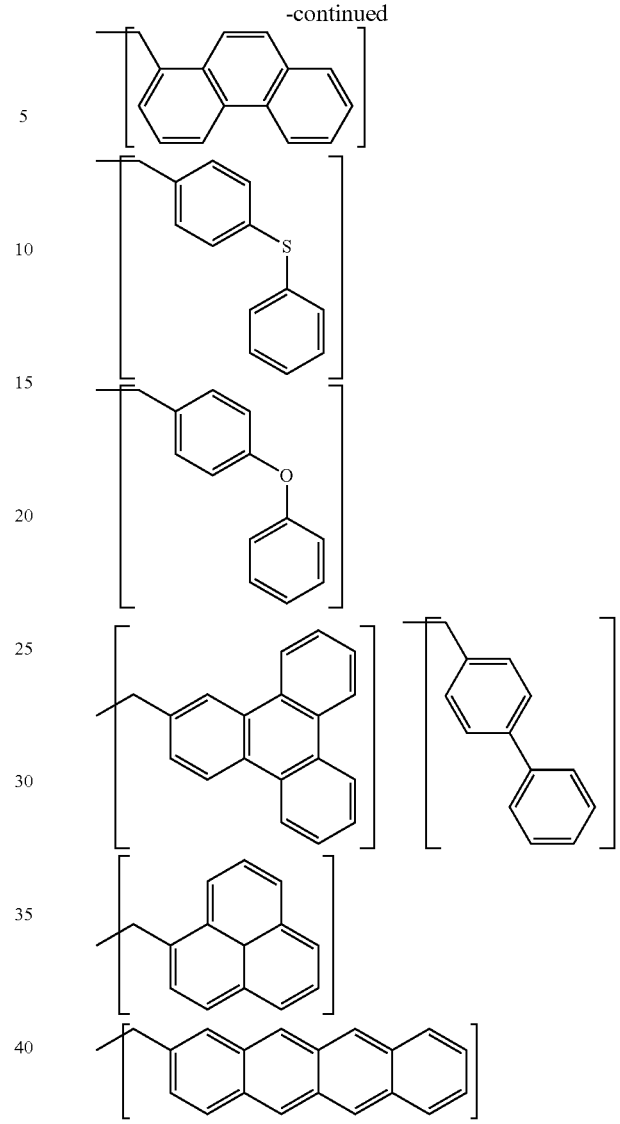

Among them, polycyclic aromatic groups, such as an anthracenemethyl group and a pyrenemethyl group, are most preferably used for photo-exposure with 248 nm wavelength. To increase transparency at 193 nm wavelength, a group having an alicyclic structure or a naphthalene structure is preferably used. On the other hand, a benzene ring has a window to increase transparency at 157 nm wavelength, and thus absorption wavelength is preferably shifted to increase absorption. A furane ring, which has an absorption at a shorter wavelength than a benzene ring, slightly increases the absorption at 157 nm, though its effect is small. A naphthalene ring, an anthracene ring, and a pyrene ring increase the absorption due to shifting of the absorption wavelength toward a longer wavelength. These aromatic rings also have an effect to increase etching resistance. Thus, they are preferably used.

The substituent can be introduced, for example, in such a manner that an alcohol in which a binding site of the substituent has a hydroxyl group is introduced into the condensate at the ortho-position or the para-position relative to a hydroxyl group or an alkyl group, in the presence of an acid catalyst in accordance with a reaction mechanism of an aromatic electrophilic substitution. Illustrative examples of the acid catalyst include hydrochloric acid, nitric acid, sulfuric acid, formic acid, oxalic acid, acetic acid, methanesulfonic acid, n-butanesulfonic acid, camphorsulfonic acid, tosic acid, and trifluoromethanesulfonic acid. The amount of the acid catalyst to be used is 0.001 to 20 parts by mass, based on 100 parts by mass of the condensate before the reaction. The amount of the introduced substituent is in the range of 0 to 0.8 mol per 1 mol of the monomer unit in the condensate.

Furthermore, other polymers may be blended to the inventive composition for forming a resist underlayer film. Examples of the blend polymer include known novolak resins and polymers that are obtained from the compounds shown by the general formulae (3-1), (3-2), (3-3), (3-4), and (3-5) as raw materials while having a different composition. When such polymers are blended to the inventive composition for forming a resist underlayer film, coating property by spin coating and filling property to an uneven substrate can be improved. In addition, a material having high carbon density and high etching resistance may be selected.

Illustrative examples of the known novolak resin include dehydration condensation products of formaldehyde with phenol, o-cresol, m-cresol, p-cresol, 2,3-dimethyl phenol, 2,5-dimethyl phenol, 3,4-dimethyl phenol, 3,5-dimethyl phenol, 2,4-dimethyl phenol, 2,6-dimethyl phenol, 2,3,5-trimethyl phenol, 3,4,5-trimethyl phenol, 2-t-butyl phenol, 3-t-butyl phenol, 4-t-butyl phenol, 2-phenyl phenol, 3-phenyl phenol, 4-phenyl phenol, 3,5-diphenyl phenol, 2-naphthyl phenol, 3-naphthyl phenol, 4-naphthyl phenol, 4-trityl phenol, resorcinol, 2-methyl resorcinol, 4-methyl resorcinol, 5-methyl resorcinol, catechol, 4-t-butyl catechol, 2-methoxy phenol, 3-methoxy phenol, 2-propyl phenol, 3-propyl phenol, 4-propyl phenol, 2-isopropyl phenol, 3-isopropyl phenol, 4-isopropyl phenol, 2-methoxy-5-methyl phenol, 2-t-butyl-5-methyl phenol, pyrogallol, thymol, isothymol, 4,4'-(9H-fluorene-9-ylidene)bisphenol, 2,2'dimethyl-4,4'-(9H-fluorene-9-ylidene)bisphenol, 2,2'diallyl-4,4'-(9H-fluorene-9-ylidene)bisphenol, 2,2'difluoro-4,4'-(9H-fluorene-9-ylidene)bisphenol, 2,2'diphenyl-4,4'-(9H-fluorene-9-ylidene)bisphenol, 2,2'dimethoxy-4,4'-(9H-fluorene-9-ylidene)bisphenol, 2,3,2',3'-tetrahydro-(1,1')-spirobiindene-6,6'-diol, 3,3,3',3'-tetramethyl-2,3,2',3'-tetrahydro-(1,1')-spirobiindene-6,6'-diol, 3,3,3',3',4,4'-hexamethyl-2,3,2',3'-tetrahydro-(1,1')-spirobiindene-6,6'-diol, 2,3,2',3'-tetrahydro-(1,1')-spirobiindene-5,5'-diol, 5,5'-dimethyl-3,3,3',3'-tetramethyl-2,3,2',3'-tetrahydro-(1,1')-spirobiindene-6,6'-diol, 1-naphthol, 2-naphthol, 2-methyl-1-naphthol, 4-methoxy-1-naphthol, and 7-methoxy-2-naphthol, dihydroxynaphthalene such as 1,5-dihydroxynaphthalene, 1,7-dihydroxynaphthalene, and 2,6-dihydroxynaphthalene, methyl-3-hydroxy-naphthalene-2-carboxylate, hydroxyl indene, hydroxyl anthracene, bisphenol, and trisphenol; polystyrene, polyvinyl naphthalene, polyvinyl anthracene, polyvinyl carbazole, polyindene, polyacenaphthylene, polynorbornene, polycyclodecene, polytetracyclododecene, polynortricyclene, poly(meth)acrylate, and a copolymer thereof.

The following resin compounds may also be blended: a nortricyclene copolymer, a hydrogenated naphthol novolak resin, a naphthol dicyclopentadiene copolymer, a phenol dicyclopentadiene copolymer, a fluorene bisphenol novolak, acenaphthylene copolymer, an indene copolymer, phenol-containing fullerene, a bisphenol compound and a novolak resin thereof, a dibisphenol compound and a novolak resin thereof, an adamantane phenol novolak resin, a hydroxyl vinylnaphthalene copolymer, a bisnaphthol compound and a novolak resin thereof, a ROMP polymer, a tricyclopentadiene copolymer, and a fullerene resin compound.

The formulation amount of the blend compound or the blend polymer is 0 to 1,000 parts by mass, preferably 0 to 500 parts by mass, based on 100 parts by mass of the compound shown by the general formula (1), the condensate thereof, or the total of them.

The inventive composition for forming a resist underlayer film may further contain a crosslinking agent. Examples of the crosslinking agent that can be used in the present invention include materials described in paragraphs (0055) to (0060) of Japanese Patent Application Publication No. 2007-199653.

In the present invention, an acid generator may be added to accelerate thermal crosslinking reaction. The acid generator can be classified into a material that generates an acid by thermal decomposition or a material that generates an acid by light irradiation; and any acid generators can be added. Illustrative examples thereof include materials described in paragraphs (0061) to (0085) of Japanese Patent Application Publication No. 2007-199653.

The inventive composition for forming a resist underlayer film may further contain a basic compound for improving preservation stability. The basic compound acts as a quencher relative to an acid to prevent crosslinking reaction from promoting by a trace of acid generated from the acid generator.

Illustrative examples of the basic compound include materials described in paragraphs (0086) to (0090) of Japanese Patent Application Publication No. 2007-199653.

The inventive composition for forming a resist underlayer film contains an organic solvent. In the present invention, any solvents capable of dissolving the above-mentioned compound, the condensate thereof, the acid generator, the crosslinking agent, and other additives can be used without any limitation. Illustrative examples thereof include ketones such as cyclohexanone and methyl-2-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, dipropylene glycol monomethyl ether, diethylene glycol monomethyl ether, dipropylene glycol monoethyl ether, diethylene glycol monoethyl ether, tripropylene glycol monomethyl ether, triethylene glycol monomethyl ether, tripropylene glycol monoethyl ether, triethylene glycol monoethyl ether, propylene glycol dimethyl ether, diethylene glycol dimethyl ether, dipropylene glycol dimethyl ether, triethylene glycol dimethyl ether, tripropylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, t-butyl acetate, t-butyl propionate, and propylene glycol mono-t-butyl ether acetate.

The inventive composition for forming a resist underlayer film may further contain a surfactant to improve coating property by spin coating. Illustrative examples of the surfactant include materials described in paragraphs (0165) and (0166) of Japanese Patent Application Publication No. 2008-111103.

The present invention provides a patterning process using the composition for forming a resist underlayer film as described above, including: forming a resist underlayer film on a body to be processed by using the inventive composition for forming a resist underlayer film; forming a resist middle layer film on the resist underlayer film by using a silicon-containing resist middle layer film composition; forming a resist upper layer film on the resist middle layer film by using a resist upper layer film composition which is a photoresist composition; forming a circuit pattern on the resist upper layer film; etching the resist middle layer film by using the resist upper layer film having the formed pattern as a mask; etching the resist underlayer film by using the resist middle layer film having the formed pattern as a mask; further etching the body to be processed by using the resist underlayer film having the formed pattern as a mask, whereby the pattern is formed in the body to be processed.

To form a resist underlayer film by using the inventive composition for forming a resist underlayer film, for example, the composition for forming a resist underlayer film is applied on the substrate to be processed by spin coating or other method, in the same manner as the photoresist is formed. The spin coating method enables the film to have good filling property. After spin coating, the solvent is evaporated, and baking is carried out to prevent mixing with the resist upper layer film or the resist middle layer film and to accelerate crosslinking reaction. The baking is carried out at higher than 100° C. and 600° C. or lower for 10 to 600 seconds, preferably 10 to 300 seconds. The baking temperature is more preferably 150° C. or higher and 500° C. or lower, much more preferably 180° C. or higher and 400° C. or lower. In view of effects on device damage and wafer deformation, upper limit of the heatable temperature in the lithography wafer process is 600° C. or lower, preferably 500° C. or lower.

The atmosphere during baking may be in air. An inert gas, such as $N_2$, Ar, and He, is preferably introduced to reduce oxygen so that the resist underlayer film is prevented from oxidizing. To prevent the oxidation, oxygen concentration needs to be controlled, preferably in the level of 1,000 ppm or lower, more preferably 100 ppm or lower. Preventing the resist underlayer film from oxidizing during baking is desirable to prevent an increase in absorption and a decrease in etching resistance.

The thickness of the resist underlayer film is appropriately selected, and is preferably 30 to 20,000 nm, particularly 50 to 15,000 nm. In the case of the three-layer process, after forming the resist underlayer film, the silicon-containing resist middle layer film may be formed thereon, followed by formation of the resist upper layer film not containing a silicon atom (monolayer resist film).

As the silicon-containing resist middle layer film in the three-layer process, a middle layer film based on polysiloxane is preferably used. When this silicon-containing resist middle layer film has an antireflective effect, reflection can be suppressed. Illustrative examples thereof include silicon-containing resist middle layer films obtained from compositions described in Japanese Patent Application Publication No. 2004-310019, No. 2007-302873, and No. 2009-126940. Especially in photo-exposure at 193 nm, use of a resist underlayer film composed of a composition containing many aromatic groups with high substrate etching resistance increases the k-value and thus substrate reflectance. This substrate reflectance can be reduced to 0.5% or lower by suppressing the reflection by the resist middle layer film.

In the case that an inorganic hard mask intermediate film is formed on the resist underlayer film, a silicon oxide film, a silicon nitride film, a silicon oxynitride film (SiON film), or the like may be formed by the CVD method or the ALD method.

A photoresist film may be formed as the resist upper layer film on the resist middle layer film or the inorganic hard mask intermediate film. Alternatively, an organic antireflective film (BARC) may be formed on the resist middle layer film or on the inorganic hard mask intermediate film by spin coating, and then the photoresist film may be formed thereon to form a 4-layered resist film.

In the case that the SiON film is used as the inorganic hard mask intermediate film, the two layers of the SiON film and the BARC can suppress the reflection even in liquid immersion exposure with a high NA exceeding 1.0. The formation of the BARC has also an advantage of reducing footing profile of the photoresist pattern on the SiON film.

The resist upper layer film in the three-layered resist film may be a positive resist or a negative resist, and any common photoresist composition may be used. When the resist upper layer film is formed from the photoresist composition, the spin coating method is preferably used as in the case of forming the resist underlayer film. After spin coating of the photoresist composition, pre-baking is performed preferably at 60 to 180° C. for 10 to 300 seconds. Thereafter, photo-exposure, post-exposure bake (PEB), and development are carried out according to conventional methods to obtain a resist pattern. The thickness of the resist upper layer film is preferably, but not particularly limited to, 30 to 500 nm, more preferably 50 to 400 nm.

Examples of the exposure light include high energy beam having a wavelength of 300 nm or less, more specifically, excimer laser beam with 248 nm, 193 nm, or 157 nm wavelength, $Kr_2$ laser beam with 146 nm wavelength, $Ar_2$ laser beam with 126 nm wavelength, soft X-ray having a wavelength of 3 to 20 nm, electron beam, and X-rays.

The resist upper layer film may be patterned by a photolithography with a wavelength ranging from 10 nm to 300 nm, a direct drawing by electron beam, a nanoimprinting, or a combination thereof.

In addition, the development method in the patterning process may be an alkaline development or a development with an organic solvent.

Then, etching is carried out by using the obtained resist pattern as a mask. The resist middle layer film in the three-layer process, especially the inorganic hard mask intermediate film, is etched with a fluorocarbon gas by using the resist pattern as a mask. Then, the resist underlayer film is etched with an oxygen gas or a hydrogen gas by using the resist middle layer film pattern, especially the inorganic hard mask intermediate film pattern, as a mask.

Subsequent etching of the substrate to be processed may also be carried out according to the conventional method. For example, the substrate made of $SiO_2$, SiN, or silica low-dielectric insulating film is etched with a gas mainly consisting of a fluorocarbon gas; the substrate made of p-Si, Al, or W is etched with a gas mainly consisting of a chlorine- or bromine-based gas. When the substrate is processed by etching with the fluorocarbon gas, the silicon-containing middle layer film in the three-layer process is removed at the same time as processing the substrate. When the substrate is etched with the chlorine- or bromine-based gas, the silicon-containing middle layer film needs to be removed by another dry etching with a fluorocarbon gas after processing the substrate.

The resist underlayer film formed from the inventive composition for forming a resist underlayer film has excellent resistance to etching of these substrates to be processed.

Meanwhile, the substrate to be processed may be a semiconductor apparatus substrate or those in which any of a metal film, a metal carbide film, a metal oxide film, a metal nitride film, a metal oxycarbide film, and a metal oxynitride film are formed on the semiconductor apparatus substrate as a layer to be processed.

The substrate may be made of a material different from the layer to be processed, such as Si, a-Si, p-Si, SiO$_2$, SiN, SiON, W, TiN, and Al, although not particularly limited thereto.

The layer to be processed may include metal such as silicon, titanium, tungsten, hafnium, zirconium, chromium, germanium, copper, silver, gold, aluminum, indium, gallium, arsenic, palladium, iron, tantalum, iridium, and molybdenum, or an alloy thereof. Examples of the layer to be processed including such metal include various Low-k films made of Si, SiO$_2$, SiON, SiN, p-Si, a-Si, W, W—Si, Al, Cu or Al—Si, and stopper films thereof, which are typically formed with a thickness of 50 to 10,000 nm, particularly 100 to 5,000 nm.

An example of the three-layer process will be specifically described below with reference to FIG. 1.

In the three-layer process, as shown in FIG. 1 (A), after the resist underlayer film 3 is formed by using the inventive composition for forming a resist underlayer film on the layer to be processed 2 that is laminated on the substrate 1, the resist middle layer film 4 is formed thereon, and the resist upper layer film 5 is formed thereon.

Then, as shown in FIG. 1 (B), the intended part 6 of the resist upper layer film is exposed to a light, followed by PEB and development to form the resist pattern 5a (FIG. 1 (C)). The resist middle layer film 4 is processed by etching with a CF gas by using the resist pattern 5a thus obtained as a mask to form the resist middle layer film pattern 4a (FIG. 1 (D)). After the resist pattern 5a is removed, the resist underlayer film 3 is etched with oxygen plasma by using the resist middle layer film pattern 4a thus obtained as a mask to form the resist underlayer film pattern 3a (FIG. 1 (E)). Further, after the resist middle layer film pattern 4a is removed, the layer to be processed 2 is processed by etching using the resist underlayer film pattern 3a as a mask to form the pattern 2a in the substrate (FIG. 1 (F)).

In the case that the inorganic hard mask intermediate film is used, the resist middle layer film 4 is replaced with the inorganic hard mask intermediate film. In the case that BARC is formed, the BARC film is provided between the resist middle layer film 4 and the resist upper layer film 5. Etching of the BARC may be carried out continuously in advance of etching of the resist middle layer film 4. Alternatively, after the BARC is etched alone, an etching apparatus may be changed to etch the resist middle layer film 4.

EXAMPLES

Hereinafter, the present invention will be specifically explained with reference to Synthesis Examples, Examples, and Comparative Examples, but the present invention is not limited thereto.

Meanwhile, molecular weight and dispersity of the polymer were determined in the following manner. Weight average molecular weight (Mw) and number average molecular weight (Mn) in terms of polystyrene were measured by gel permeation chromatography (GPC), and dispersity (Mw/Mn) was calculated therefrom.

Synthesis of (A-1) to (A-13)

Compounds (A-1) to (A-13) were synthesized as follows.

Synthesis Example 1

Synthesis of Compound (A-1)

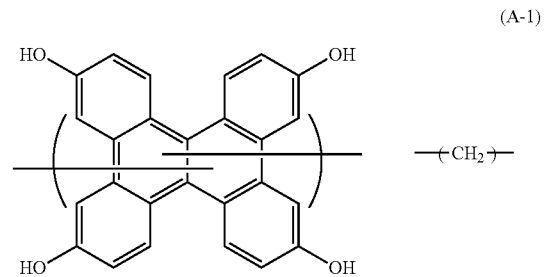

(A-1)

30.0 g of 3,6,11,14-tetrahydroxydibenzochrysene, 90 g of 1-methoxy-2-propanol, and 0.9 g of p-toluenesulfonic acid were mixed to form a homogeneous solution at 80° C. in a nitrogen atmosphere. 3.72 g of 37% formalin was added dropwise thereto gently, and the mixture was stirred under heating at 120° C. for 24 hours. After cooling to room temperature, 300 g of methyl isobutyl ketone and 100 g of pure water were added thereto. An insoluble matter was then removed by filtration, the water layer was removed, and the organic layer was washed with 100 g of pure water four times. The organic layer was then evaporated under reduced pressure to dryness to obtain 30.3 g of compound (A-1).

The molecular weight (Mw) and dispersity (Mw/Mn) were determined by GPC.

(A-1): Mw=3,120 Mw/Mn=2.25

Synthesis Example 2

Synthesis of Compound (A-2)

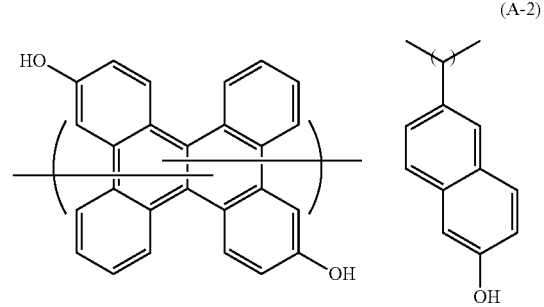

(A-2)

20.0 g of 3,11-dihydroxydibenzochrysene, 18.1 g of 6-hydroxy-2-naphthaldehyde, and 100 g of 2-methoxy-1-propanol were mixed to form a homogeneous solution at 100° C. in a nitrogen atmosphere. 3 g of a 2-methoxy-1-propanol solution containing 20 wt % p-toluenesulfonic acid monohydride was added dropwise thereto gently, and the mixture was stirred under heating at 120° C. for 24 hours. After cooling to room temperature, 300 g of methyl isobutyl ketone and 100 g of pure water were added thereto. An insoluble matter was then removed by filtration, the water layer was removed, and the organic layer was washed with 100 g of pure water four times. The organic layer was then evaporated under reduced pressure to dryness to obtain 36.3 g of compound (A-2).

The molecular weight (Mw) and dispersity (Mw/Mn) were determined by GPC.

(A-2): Mw=2,650 Mw/Mn=1.92

Synthesis Example 3

Synthesis of Compound (A-3)

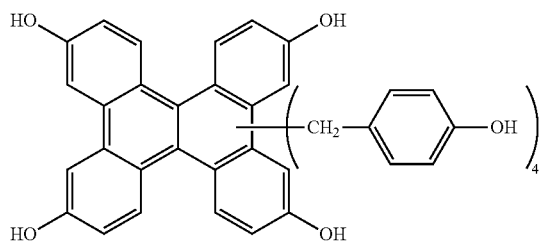

20.0 g of 3,6,11,14-tetrahydroxydibenzochrysene, 25.3 g of 4-hydroxybenzyl alcohol, and 150 g of 2-methoxy-1-propanol were mixed to form a homogeneous solution at 90° C. in a nitrogen atmosphere. 5 g of a 2-methoxy-1-propanol solution containing 20 wt % p-toluenesulfonic acid monohydride was added dropwise thereto gently, and the mixture was stirred at 120° C. for 24 hours. After cooling to room temperature, 200 g of methyl isobutyl ketone was added thereto, and the organic layer was washed with 100 g of pure water five times. The organic layer was then evaporated under reduced pressure to dryness to obtain 42.6 g of compound (A-3).

The number of substituted hydroxyphenylmethyl groups determined by $^1$HNMR was 4.0 per molecule of 3,6,11,14-tetrahydroxydibenzochrysene.

Synthesis Example 4

Synthesis of Compound (A-4)

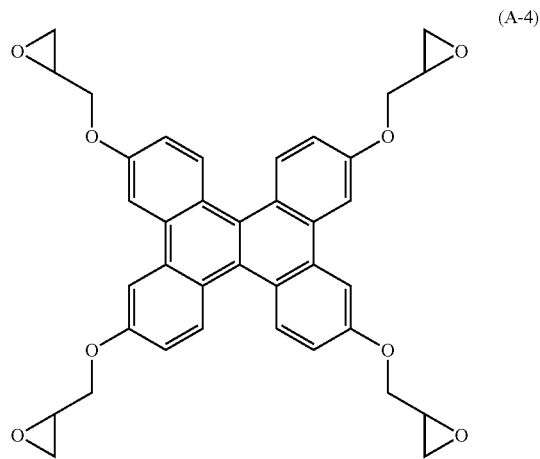 [SMILES: c1cc2c(cc1OCC1CO1)c1cc(OCC3CO3)ccc1c1c3ccc(OCC4CO4)cc3c3cc(OCC4CO4)ccc3c21]

100.0 g of 3,6,11,14-tetrahydroxydibenzochrysene and 236.5 g of epichlorohydrin were mixed to form a homogeneous solution at 40° C. in a nitrogen atmosphere, and the solution was heated to 50° C. 224.3 g of a 20% sodium hydroxide aqueous solution was added dropwise thereto over 1 hour, and the mixture was stirred at 50° C. for 12 hours. Then, 0.74 g of benzyltriethylammonium chloride was added thereto, and the mixture was stirred at 120° C. for 6 hours. After cooling to room temperature, 500 g of methyl isobutyl ketone and 100 g of pure water were added thereto. The water layer was then removed, and the organic layer was washed with 100 g of pure water five times. The organic layer was then collected and evaporated under reduced pressure to dryness to obtain 152 g of compound (A-4). Epoxy equivalent thereof was 165 g/eq, and softening point was 125° C.

Synthesis Example 5

Synthesis of Compound (A-5)

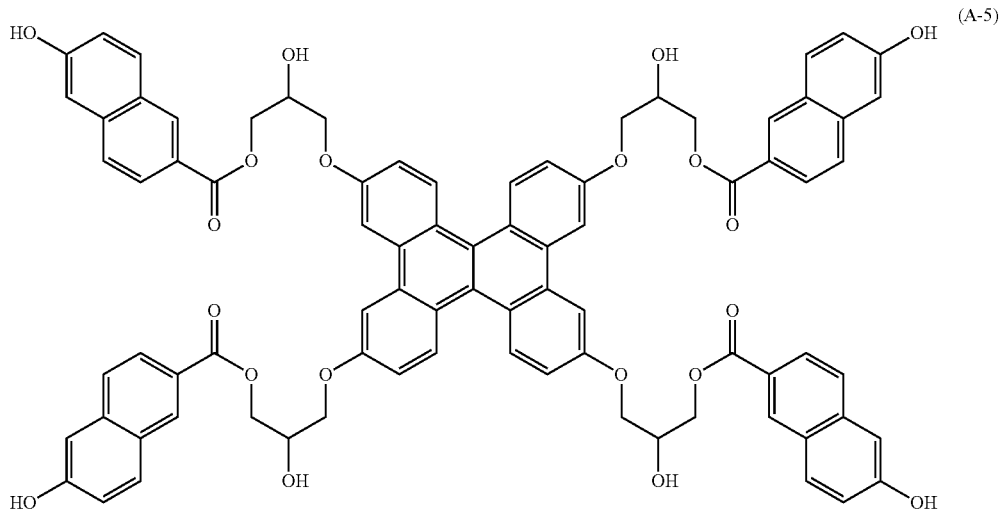 [SMILES: O=C(OCC(O)COc1ccc2c(c1)c1cc(OCC(O)COC(=O)c3ccc4cc(O)ccc4c3)ccc1c1c3ccc(OCC(O)COC(=O)c4ccc5cc(O)ccc5c4)cc3c3cc(OCC(O)COC(=O)c4ccc5cc(O)ccc5c4)ccc3c21)c1ccc2cc(O)ccc2c1]

16.5 g of compound (A-4), 18.2 g of 6-hydroxy-2-naphthoic acid, and 70 g of 2-methoxy-1-propanol were mixed to form a homogeneous solution at 90° C. in a nitrogen atmosphere. 2.3 g of benzyltriethylammonium chloride was added thereto, and the mixture was stirred at 120° C. for 24 hours. After cooling to room temperature, 200 g of methyl isobutyl ketone was added thereto, and the organic layer was washed with 50 g of pure water five times. The organic layer was then evaporated under reduced pressure to dryness to obtain 34.6 g of compound (A-5).

Synthesis Example 6

Synthesis of Compound (A-6)

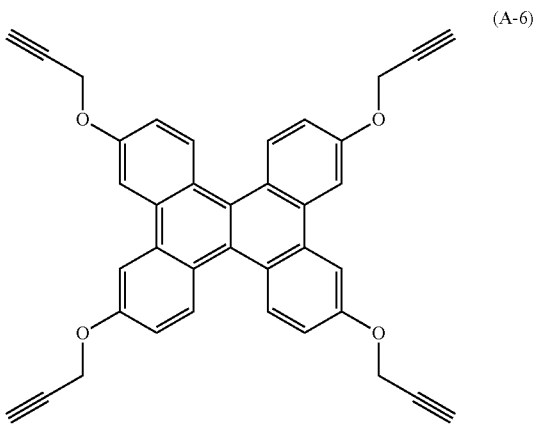 [SMILES: C#CCOc1ccc2c(c1)c1cc(OCC#C)ccc1c1c3ccc(OCC#C)cc3c3cc(OCC#C)ccc3c21]

(A-6)

39.2 g of 3,6,11,14-tetrahydroxydibenzochrysene, 66.9 g of potassium carbonate, and 180 g of dimethylformamide were stirred at 50° C. in a nitrogen atmosphere, and 52.3 g of propargyl bromide was added dropwise thereto over 40 minutes under stirring. After completion of dropwise addition, the mixture was continuously stirred at 50° C. for 24 hours. Then, 500 g of methyl isobutyl ketone and 100 g of pure water were added thereto. An insoluble matter was then removed by filtration, the water layer was removed, and the organic layer was washed with 100 g of pure water four times. The organic layer was then evaporated under reduced pressure to dryness and dissolved in 150 g of toluene. Then, 1000 g of methanol was added to precipitate a crystal. The crystal was collected by filtration with Kiriyama funnel, washed with 200 g of methanol twice, and then dried at 50° C. under vacuum to obtain 36.3 g of compound (A-6).

Synthesis Example 7

Synthesis of Compound (A-7)

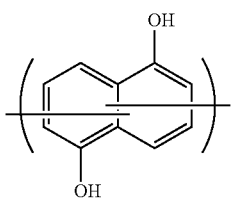

(A-7)

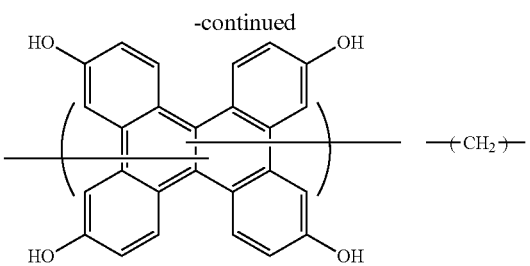

15.0 g of 3,6,11,14-tetrahydroxydibenzochrysene, 6.1 g of 1,5-dihydroxynaphthalene, 65 g of 1-methoxy-2-propanol, and 0.6 g of p-toluenesulfonic acid monohydride were mixed to form a homogeneous solution at 80° C. in a nitrogen atmosphere. 3.72 g of 37% formalin was added dropwise thereto gently, and the mixture was stirred at 120° C. for 24 hours. After cooling to room temperature, 300 g of methyl isobutyl ketone and 100 g of pure water were added thereto. An insoluble matter was then removed by filtration, the water layer was removed, and the organic layer was washed with 100 g of pure water four times. The organic layer was then evaporated under reduced pressure to dryness to obtain 21.5 g of compound (A-7).

The molecular weight (Mw) and dispersity (Mw/Mn) were determined by GPC.

(A-7): Mw=4,320 Mw/Mn=2.72

Synthesis Example 8

Synthesis of Compound (A-8)

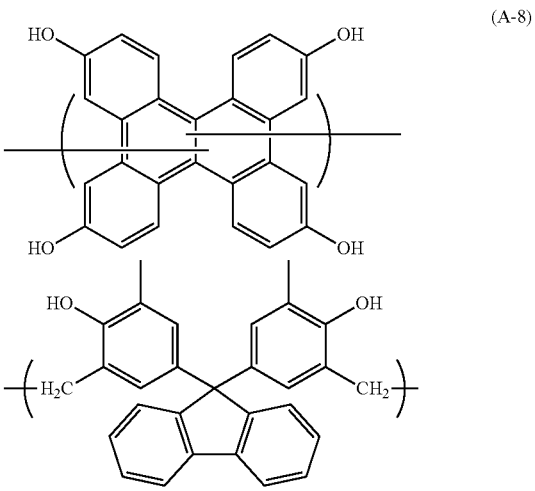

(A-8)

15.0 g of 3,6,11,14-tetrahydroxydibenzochrysene, 12.5 g of 9,9-bis(3-methoxymethyl-4-hydroxy-5-methylphenyl)fluorene, and 55 g of 1-methoxy-2-propanol were mixed to form a homogeneous solution at 80° C. in a nitrogen atmosphere. 3.0 g of a 1-methoxy-2-propanol solution containing 20 wt % p-toluenesulfonic acid monohydride was added dropwise thereto gently, and the mixture was stirred at 120° C. for 6 hours. After cooling to room temperature, 300 g of methyl isobutyl ketone and 100 g of pure water were added thereto. An insoluble matter was then removed by filtration, the water layer was removed, and the organic layer was washed with 100 g of pure water four times. The organic layer was then evaporated under reduced pressure to dryness to obtain 26.0 g of compound (A-8).

The molecular weight (Mw) and dispersity (Mw/Mn) were determined by GPC.

(A-8): Mw=3,640 Mw/Mn=2.32

Synthesis Example 9

Synthesis of Compound (A-9)

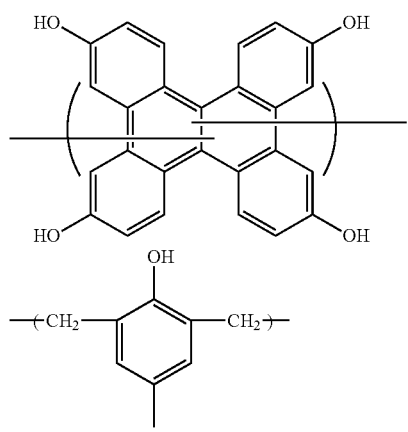

20.0 g of 3,6,11,14-tetrahydroxydibenzochrysene, 6.0 g of 2,6-bis(hydroxymethyl)-p-cresol, and 55 g of 1-methoxy-2-propanol were mixed to form a homogeneous solution at 80° C. in a nitrogen atmosphere. 4.0 g of a 1-methoxy-2-propanol solution containing 20 wt % p-toluenesulfonic acid monohydride was added dropwise thereto gently, and the mixture was stirred at 120° C. for 6 hours. After cooling to room temperature, 300 g of methyl isobutyl ketone and 100 g of pure water were added thereto. An insoluble matter was then removed by filtration, the water layer was removed, and the organic layer was washed with 100 g of pure water four times. The organic layer was then evaporated under reduced pressure to dryness to obtain 26.0 g of compound (A-9).

The molecular weight (Mw) and dispersity (Mw/Mn) were determined by GPC.

(A-9): Mw=3,210 Mw/Mn=2.53

Synthesis Example 10

Synthesis of Compound (A-10)

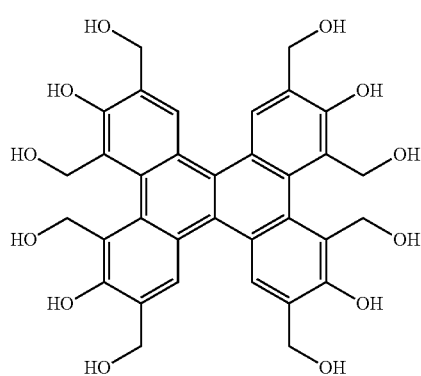

50.0 g of 3,6,11,14-tetrahydroxydibenzochrysene, 25.5 g of sodium hydroxide, and 200 g of water were mixed to form a homogeneous solution at 40° C. in a nitrogen atmosphere. 61.2 g of 37% formalin was added dropwise thereto over 1 hour, and the mixture was stirred at 40° C. for 8 hours. After 800 g of methyl isobutyl ketone was added, 120 g of a 20% hydrochloric acid aqueous solution was added under ice-cooling to quench the reaction. An insoluble matter was then removed by filtration, the water layer was removed, and the organic layer was washed with 200 g of pure water five times. The organic layer was then evaporated under reduced pressure to dryness and dissolved in 250 g of tetrahydrofuran. Then, 1000 g of diisopropyl ether was added to precipitate a crystal. The crystal was collected by filtration with Kiriyama funnel, washed with 200 g of diisopropyl ether twice, and then dried at 50° C. under vacuum to obtain 65.3 g of compound (A-10).

Synthesis Example 11

Synthesis of Compound (A-11)

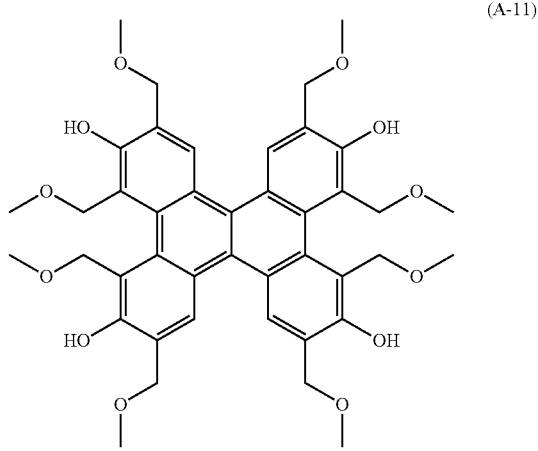

20.0 g of compound (A-10) and 121.6 g of methanol were mixed to form a homogeneous solution at 50° C. in a nitrogen atmosphere. 6.2 g of a methanol solution containing 10 wt % of sulfuric acid was added dropwise thereto gently, and the mixture was stirred for 8 hours under reflux. After cooling to room temperature, 300 g of methyl isobutyl ketone and 100 g of water were added thereto. An insoluble matter was then removed by filtration, the water layer was removed, and the organic layer was washed with 100 g of pure water five times. The organic layer was then evaporated under reduced pressure to dryness and dissolved in 60 g of toluene. Then, 480 g of hexane was added to precipitate a crystal. The crystal was collected by filtration with Kiriyama funnel, washed with 100 g of hexane twice, and then dried at 50° C. under vacuum to obtain 19.3 g of compound (A-11).

Synthesis Example 12

Synthesis of Compound (A-12)

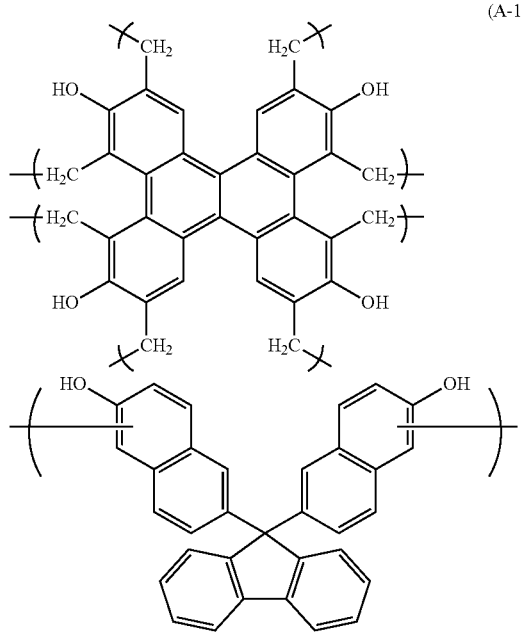

3.7 g of compound (A-11), 15.0 g of 6,6-(9-fluorenylidene)-di(2-naphthol), and 40 g of 1-methoxy-2-propanol were mixed to form a homogeneous solution at 80° C. in a nitrogen atmosphere. 3.8 g of a 1-methoxy-2-propanol solution containing 20 wt % p-toluenesulfonic acid monohydride was added dropwise thereto gently, and the mixture was stirred at 120° C. for 6 hours. After cooling to room temperature, 300 g of methyl isobutyl ketone and 100 g of pure water were added thereto. An insoluble matter was then removed by filtration, the water layer was removed, and the organic layer was washed with 100 g of pure water four times. The organic layer was then evaporated under reduced pressure to dryness to obtain 17.0 g of compound (A-12).

The molecular weight (Mw) and dispersity (Mw/Mn) were determined by GPC.

(A-12): Mw=4,210 Mw/Mn=2.86

Synthesis Example 13

Synthesis of Compound (A-13)

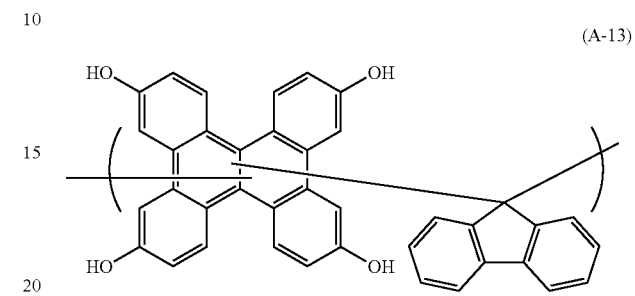

10.0 g of 3,6,11,14-tetrahydroxydibenzochrysene, 3.7 g of 9-fluorenone, and 50 g of 1,4-dioxane were mixed to form a homogeneous solution at 80° C. in a nitrogen atmosphere. A mixed liquid of 2.0 g of methanesulfonic acid and 0.4 g of 3-mercaptopropionic acid was added dropwise thereto gently, and the mixture was stirred at 100° C. for 24 hours. After cooling to room temperature, 300 g of methyl isobutyl ketone and 100 g of pure water were added thereto. An insoluble matter was then removed by filtration, the water layer was removed, and the organic layer was washed with 100 g of pure water five times. The organic layer was then evaporated under reduced pressure to dryness and dissolved in 100 g of tetrahydrofuran. Then, 600 g of diisopropyl ether was added to precipitate a crystal. The crystal was collected by filtration with Kiriyama funnel, washed with 100 g of diisopropyl ether twice, and then dried at 50° C. under vacuum to obtain 15.3 g of compound (A-13).

The molecular weight (Mw) and dispersity (Mw/Mn) were determined by GPC.

(A-13): Mw=3,210 Mw/Mn=2.72

In Examples and Comparative Examples, compounds (A-1) to (A-13) synthesized in Synthesis Examples 1 to 13, shown in Table 1 and Table 2, and compounds (R-1) to (R-3) were used.

TABLE 1

| Synthesis Example | Compound | Product |
|---|---|---|
| 1 | (A-1) | 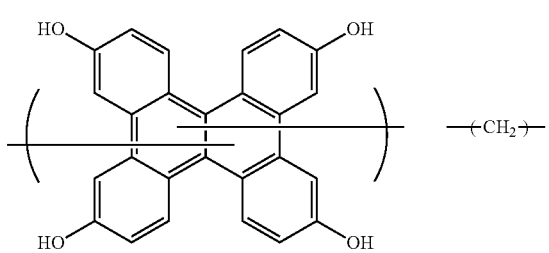 Mw 3,120 Mw/Mn 2.25 |

TABLE 1-continued
| Synthesis Example | Compound | Product |
|---|---|---|
| 2 | (A-2) | 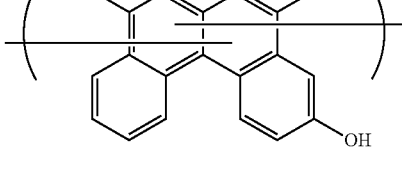 Mw 2,650 Mw/Mn 1.92 |
| 3 | (A-3) | 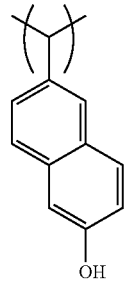 |
| 4 | (A-4) | 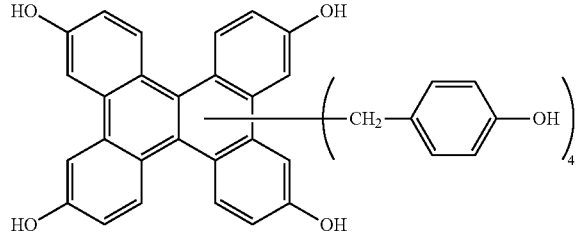 |
| 5 | (A-5) | 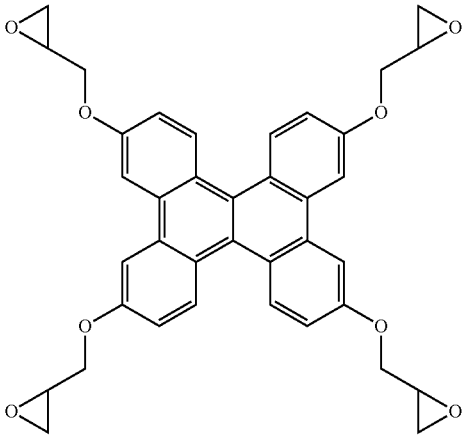 [SMILES: c1cc2c(cc1OCC1CO1)c1cc(OCC3CO3)ccc1c1c3ccc(OCC4CO4)cc3c3cc(OCC4CO4)ccc3c21] |

TABLE 1-continued

| Synthesis Example | Compound | Product |
|---|---|---|
| 6 | (A-6) | [structure: tetra(propargyloxy)-substituted dibenzo[g,p]chrysene] |

TABLE 2

| Synthesis Example | Compound | Product |
|---|---|---|
| 7 | (A-7) | [naphthalene-1,5-diol unit] / [tetraphenylethylene tetraol unit] −(CH₂)−  Mw 4,320 Mw/Mn 2.72 |
| 8 | (A-8) | [tetraphenylethylene tetraol unit] / [9,9-bis(hydroxymethylphenyl)fluorene unit]  Mw 3,640 Mw/Mn 2.32 |
| 9 | (A-9) | [tetraphenylethylene tetraol unit] / [methylenated cresol unit]  Mw 3,210 Mw/Mn 2.53 |

TABLE 2-continued

| Synthesis Example | Compound | Product |
|---|---|---|
| 10 | (A-10) | *structure of polycyclic aromatic with eight HO- and CH₂OH substituents* |
| 11 | (A-11) | *structure of polycyclic aromatic with methoxy, methoxymethyl, and hydroxyl substituents* |
| 12 | (A-12) | *polymeric structure with polycyclic aromatic units bearing OH and CH₂ linkages, and naphthol-fluorene repeat unit* <br> Mw 4,210 Mw/Mn 2.86 |
| 13 | (A-13) | *polymeric structure containing fluorene and hydroxyphenyl/naphthol units* <br> Mw 3,210 Mw/Mn 2.72 |

Compound (R-1)

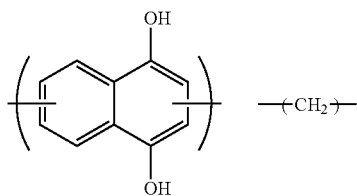

(R-1): Mw=3,000 Mw/Mn=2.65

(Compound (R-2))

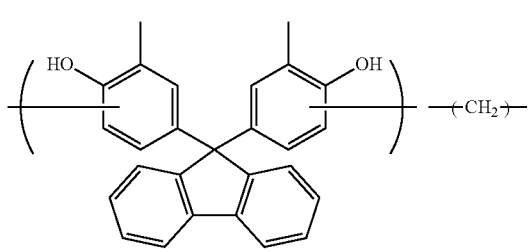

(R-2): Mw=4,000 Mw/Mn=3.21

Compound (R-3)

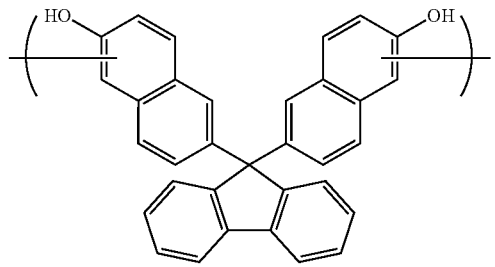

(R-3): Mw=3,700 Mw/Mn=2.82

Preparation of Composition for Forming Resist Underlayer Film

Examples and Comparative Examples

The compounds (A-1) to (A-13) and (R-1) to (R-3), a crosslinking agent (CR-1), an acid generator (AG-1), and an organic solvent were dissolved in a solvent containing 0.1 mass % FC-4430 (available from Sumitomo 3M Ltd.) with the proportion shown in Table 3. The solution was filtered through a 0.1-μm filter made of a fluorinated resin to prepare compositions for forming a resist underlayer film (UDL-1 to 23, Comparative UDL-1 to 3).

TABLE 3

| Composition for forming resist underlayer film | Compound (part by mass) | Compound (part by mass) | Crosslinking agent (part by mass) | Acid generator (part by mass) | Organic solvent (part by mass) |
|---|---|---|---|---|---|
| UDL-1 | A-1 (10) | | CR-1 (2) | AG-1 (0.5) | PGMEA (90) |
| UDL-2 | A-2 (10) | | CR-1 (2) | AG-1 (0.5) | PGMEA (90) |
| UDL-3 | A-3 (10) | | CR-1 (2) | AG-1 (0.5) | PGMEA (90) |
| UDL-4 | A-4 (10) | | | AG-1 (0.5) | PGMEA (90) |
| UDL-5 | A-5 (10) | | CR-1 (2) | AG-1 (0.5) | PGMEA (90) |
| UDL-6 | A-6 (10) | | | AG-1 (0.5) | PGMEA (90) |
| UDL-7 | A-7 (10) | | CR-1 (2) | AG-1 (0.5) | PGMEA (90) |
| UDL-8 | A-8 (10) | | CR-1 (2) | AG-1 (0.5) | PGMEA (90) |
| UDL-9 | A-9 (10) | | CR-1 (2) | AG-1 (0.5) | PGMEA (90) |
| UDL-10 | A-10 (10) | | | AG-1 (0.5) | PGMEA (90) |
| UDL-11 | A-11 (10) | | | AG-1 (0.5) | PGMEA (90) |
| UDL-12 | A-12 (10) | | CR-1 (2) | AG-1 (0.5) | PGMEA (90) |
| UDL-13 | A-13 (10) | | CR-1 (2) | AG-1 (0.5) | PGMEA (90) |
| UDL-14 | A-1 (5) | A-10 (5) | | AG-1 (0.5) | PGMEA (90) |
| UDL-15 | A-2 (5) | A-4 (5) | | AG-1 (0.5) | PGMEA (90) |
| UDL-16 | A-10 (5) | R-1 (5) | | AG-1 (0.5) | PGMEA (90) |
| UDL-17 | A-2 (5) | R-2 (5) | | | PGMEA (90) |
| UDL-18 | A-11 (5) | R-3 (5) | | | PGMEA (90) |
| UDL-19 | A-1 (10) | | | | PGMEA (90) |
| UDL-20 | A-5 (10) | | | | PGMEA (90) |
| UDL-21 | A-7 (10) | | | | PGMEA (90) |
| UDL-22 | A-12 (10) | | | | PGMEA (90) |
| UDL-23 | A-13 (10) | | | | PGMEA (90) |
| Comparative UDL-1 | R-1 (10) | | CR-1 (2) | AG-1 (0.5) | PGMEA (90) |
| Comparative UDL-2 | R-2 (10) | | CR-1 (2) | AG-1 (0.5) | PGMEA (90) |
| Comparative UDL-3 | R-3 (10) | | CR-1 (2) | AG-1 (0.5) | PGMEA (90) |

PGMEA: propylene glycol monomethyl ether acetate

The acid generator (AG-1) and the crosslinking agent (CR-1) were shown below.

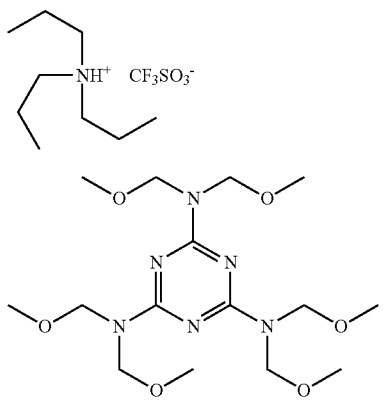

AG-1

CR-1

Optical Properties Measurement and Hardness Measurement

Examples 1-1 to 1-23 and Comparative Examples 1-1 to 1-3

Compositions for forming a resist underlayer film prepared above (UDL-1 to 23 and comparative UDL-1 to 3) were each applied onto a silicon substrate and baked under a condition shown in Table 4 to form a coating film 200 nm thick. With respect to these film, optical properties (n-value and k-value) at 193 nm wavelength were measured by a spectroscopic ellipsometer with a variable incident light angle (VASE) manufactured by J. A. Woollam Co., Inc. The result is given in Table 4. Furthermore, nanoindentation test was conducted to measure hardness of the coating films by SA-2 nanoindenter instrument, manufactured by Toyo Corporation. The result is also given in Table 4.

TABLE 4

| Composition for forming resist underlayer film | Firing temperature | Optical properties (193 nm) | | Hardness (GPa) |
|---|---|---|---|---|
| | | n-value | k-value | |
| Example 1-1 | UDL-1 | 250° C., 60 sec | 1.48 | 0.41 | 0.80 |
| Example 1-2 | UDL-2 | 250° C., 60 sec | 1.47 | 0.38 | 0.76 |
| Example 1-3 | UDL-3 | 250° C., 60 sec | 1.47 | 0.45 | 0.78 |
| Example 1-4 | UDL-4 | 250° C., 60 sec | 1.43 | 0.46 | 0.69 |
| Example 1-5 | UDL-5 | 250° C., 60 sec | 1.58 | 0.26 | 0.64 |
| Example 1-6 | UDL-6 | 250° C., 60 sec | 1.47 | 0.26 | 0.62 |
| Example 1-7 | UDL-7 | 250° C., 60 sec | 1.48 | 0.40 | 0.68 |
| Example 1-8 | UDL-8 | 250° C., 60 sec | 1.49 | 0.48 | 0.66 |
| Example 1-9 | UDL-9 | 250° C., 60 sec | 1.48 | 0.44 | 0.75 |
| Example 1-10 | UDL-10 | 250° C., 60 sec | 1.44 | 0.45 | 0.80 |
| Example 1-11 | UDL-11 | 250° C., 60 sec | 1.43 | 0.45 | 0.80 |
| Example 1-12 | UDL-12 | 250° C., 60 sec | 1.39 | 0.40 | 0.68 |
| Example 1-13 | UDL-13 | 250° C., 60 sec | 1.41 | 0.43 | 0.66 |
| Example 1-14 | UDL-14 | 250° C., 60 sec | 1.46 | 0.43 | 0.82 |
| Example 1-15 | UDL-15 | 250° C., 60 sec | 1.46 | 0.40 | 0.67 |
| Example 1-16 | UDL-16 | 250° C., 60 sec | 1.45 | 0.39 | 0.65 |
| Example 1-17 | UDL-17 | 250° C., 60 sec | 1.48 | 0.49 | 0.63 |
| Example 1-18 | UDL-18 | 250° C., 60 sec | 1.43 | 0.41 | 0.70 |
| Example 1-19 | UDL-19 | 350° C., 60 sec | 1.43 | 0.46 | 0.82 |
| Example 1-20 | UDL-20 | 350° C., 60 sec | 1.53 | 0.29 | 0.70 |
| Example 1-21 | UDL-21 | 350° C., 60 sec | 1.43 | 0.45 | 0.74 |
| Example 1-22 | UDL-22 | 350° C., 60 sec | 1.34 | 0.44 | 0.66 |
| Example 1-23 | UDL-23 | 350° C., 60 sec | 1.36 | 0.48 | 0.67 |
| Comparative Example 1-1 | Comparative UDL-1 | 250° C., 60 sec | 1.45 | 0.33 | 0.48 |
| Comparative Example 1-2 | Comparative UDL-2 | 250° C., 60 sec | 1.49 | 0.61 | 0.52 |
| Comparative Example 1-3 | Comparative UDL-3 | 250° C., 60 sec | 1.37 | 0.41 | 0.58 |

As shown in Table 4, the resist underlayer films in Examples 1-1 to 1-23 had a n-value (refractive index) of about 1.5 and a k-value (extinction coefficient) ranging from 0.25 to 0.49, and the optical properties meet the target value. Thus, these films are expected to exhibit a sufficient antireflective effect especially with a thickness of 200 nm or more, as the underlayer film for a three-layered resist.

Regarding hardness, the result of Examples 1-1 to 1-23 and Comparative Examples 1-1 to 1-3 indicates that the films using UDL-1 to 23 as the resist underlayer film composition had larger hardness, and thus were denser and stronger than the films using Comparative UDL-1 to 3. In particular, Examples 1-7, 1-8, and 1-12, which introduced the same repeating units as compounds (R-1) to (R-3) into the resin structure, and Examples 1-16 to 1-18, which combined compound (R-1) to (R-3), had larger hardness than Comparative Examples 1-1 to 1-3. This comparison emphasizes that introduction of the dibenzochrysene structure strengthened the film.

Pattern Etching Test

Examples 2-1 to 2-23 and Comparative Examples 2-1 to 2-3

Compositions for forming a resist underlayer film (UDL-1 to 23 and comparative UDL-1 to 3) were each applied onto a 300-mm diameter Si wafer on which a $SiO_2$ film 200 nm thick has been formed, and then baked at a firing temperature shown in Table 7 to form a resist underlayer film 200 nm thick. A silicon-containing resist middle layer film composition (SOG-1) was applied thereon and baked at 220° C. for 60 seconds to form a resist middle layer film 35 nm thick. A resist upper layer film composition (SL resist solution for ArF) was applied thereon and baked at 105° C. for 60 seconds to form a resist upper layer film 100 nm thick. Further, an immersion top coat composition (TC-1) was applied on the resist upper layer film and baked at 90° C. for 60 seconds to form a top coat 50 nm thick. The upper resist layer was prepared in the following manner: a polymer, an acid generator, and a basic compound were dissolved in a solvent containing 0.1 mass % FC-430 (available from Sumitomo 3M Ltd.) with the proportion shown in Table 5; and the solution was filtered through a 0.1-μm filter made of a fluorinated resin.

TABLE 5

| No. | Polymer (part by mass) | Acid generator (part by mass) | Basic compound (part by mass) | Solvent (part by mass) |
|---|---|---|---|---|
| SL resist for ArF | ArF monolayer resist polymer 1 (100) | PAG 1 (6.6) | Amine 1 (0.8) | PGMEA (2500) |

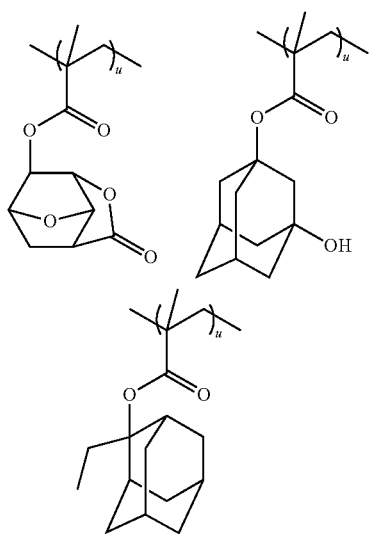

ArF monolayer resist polymer 1
(u = 0.40, v = 0.30, w = 0.30 Mw 7,800)

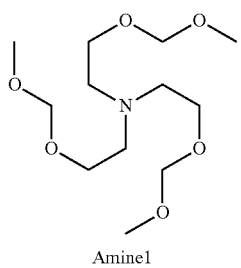

Amine1

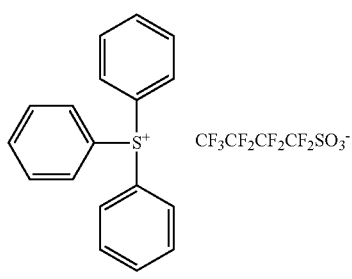

PAG1

PGMEA  2-methoxypropyl acetate

The silicon-containing resist middle layer film composition (SOG-1) used was prepared by dissolving the following polymer in a solvent.

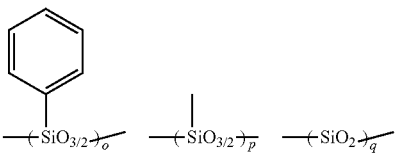

ArF silicon-containing middle layer polymer 1
(o = 0.20, p = 0.50, q = 0.30 Mw = 3,400)

The immersion top coat composition (TC-1) was prepared by dissolving the polymer in an organic solvent with the proportion shown in Table 6, followed by filtration through a 0.1-μm filter made of a fluorinated resin.

TABLE 6

| | Polymer (part by mass) | Organic solvent (part by mass) |
|---|---|---|
| TC-1 | Top coat polymer (100) | Diisoamyl ether (2700) 2-Methyl-1-butanol (270) |

Top Coat Polymer

Molecular weight (Mw)=8,800

Dispersity (Mw/Mn)=1.69

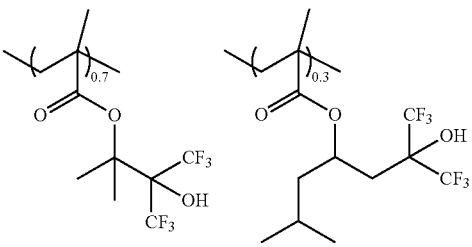

Top coat polymer

Subsequently, the wafer was exposed to light while the exposure dose is changed with an ArF liquid immersion exposure apparatus (NSR-S610C manufactured by Nikon Corporation, NA: 1.30, σ: 0.98/0.65, 35° s-polarized dipole illumination, 6% halftone phase shift mask), baked (PEB) at 100° C. for 60 seconds, and then developed with a 2.38 mass % tetramethylammonium hydroxide (TMAH) aqueous solution for 30 seconds to obtain a positive line-and-space pattern with a pitch of 100 nm and a resist line width ranging from 50 nm to 30 nm.

Then, the silicon-containing resist middle layer film was processed by dry etching using the resist pattern as a mask with an etching apparatus Telius, manufactured by Tokyo Electron Ltd. The resist underlayer film was then processed by using the obtained silicon-containing resist middle layer film pattern as a mask. The $SiO_2$ film was then processed by using the obtained resist underlayer film pattern as a mask.

Etching conditions are as follows.

Transfer Condition of the Resist Pattern to the Silicon-Containing Resist Middle Layer Film:

| | |
|---|---|
| Chamber pressure | 10.0 Pa |
| RF power | 1,500 W |
| $CF_4$ gas flow rate | 15 sccm |

-continued

| | |
|---|---|
| O₂ gas flow rate | 75 sccm |
| Time | 15 sec |

Transfer Condition of the Silicon-Containing Resist Middle Layer Film Pattern to the Resist Underlayer Film:

| | |
|---|---|
| Chamber pressure | 2.0 Pa |
| RF power | 500 W |
| Ar gas flow rate | 75 sccm |
| O₂ gas flow rate | 45 sccm |
| Time | 120 sec |

Transfer Condition of the Resist Underlayer Film Pattern to the SiO₂ Film:

| | |
|---|---|
| Chamber pressure | 2.0 Pa |
| RF power | 2,200 W |
| C₅F₁₂ gas flow rate | 20 sccm |
| C₂F₆ gas flow rate | 10 sccm |
| Ar gas flow rate | 300 sccm |
| O₂ gas flow rate | 60 sccm |
| Time | 90 sec |

Cross-section of the pattern was observed with an electron microscope (S-4700) manufactured by Hitachi, Ltd., and the shape was compared. The result is given in Table 7.

TABLE 7

| | Composition for forming resist underlayer film | Firing temperature | Pattern profile after development | Profile after etching for transferring to middle layer film | Profile after etching for transferring to underlayer film | Profile after etching for transferring to substrate | Minimum size (nm) without pattern wiggling after etching for transferring to substrate |
|---|---|---|---|---|---|---|---|
| Example 2-1 | UDL-1 | 250° C., 60 sec | Vertical profile | Vertical profile | Vertical profile | Vertical profile | 25 |
| Example 2-2 | UDL-2 | 250° C., 60 sec | Vertical profile | Vertical profile | Vertical profile | Vertical profile | 26 |
| Example 2-3 | UDL-3 | 250° C., 60 sec | Vertical profile | Vertical profile | Vertical profile | Vertical profile | 26 |
| Example 2-4 | UDL-4 | 250° C., 60 sec | Vertical profile | Vertical profile | Vertical profile | Vertical profile | 29 |
| Example 2-5 | UDL-5 | 250° C., 60 sec | Vertical profile | Vertical profile | Vertical profile | Vertical profile | 31 |
| Example 2-6 | UDL-6 | 250° C., 60 sec | Vertical profile | Vertical profile | Vertical profile | Vertical profile | 32 |
| Example 2-7 | UDL-7 | 250° C., 60 sec | Vertical profile | Vertical profile | Vertical profile | Vertical profile | 29 |
| Example 2-8 | UDL-8 | 250° C., 60 sec | Vertical profile | Vertical profile | Vertical profile | Vertical profile | 30 |
| Example 2-9 | UDL-9 | 250° C., 60 sec | Vertical profile | Vertical profile | Vertical profile | Vertical profile | 27 |
| Example 2-10 | UDL-10 | 250° C., 60 sec | Vertical profile | Vertical profile | Vertical profile | Vertical profile | 25 |
| Example 2-11 | UDL-11 | 250° C., 60 sec | Vertical profile | Vertical profile | Vertical profile | Vertical profile | 25 |
| Example 2-12 | UDL-12 | 250° C., 60 sec | Vertical profile | Vertical profile | Vertical profile | Vertical profile | 29 |
| Example 2-13 | UDL-13 | 250° C., 60 sec | Vertical profile | Vertical profile | Vertical profile | Vertical profile | 30 |
| Example 2-14 | UDL-14 | 250° C., 60 sec | Vertical profile | Vertical profile | Vertical profile | Vertical profile | 24 |
| Example 2-15 | UDL-15 | 250° C., 60 sec | Vertical profile | Vertical profile | Vertical profile | Vertical profile | 30 |
| Example 2-16 | UDL-16 | 250° C., 60 sec | Vertical profile | Vertical profile | Vertical profile | Vertical profile | 31 |
| Example 2-17 | UDL-17 | 250° C., 60 sec | Vertical profile | Vertical profile | Vertical profile | Vertical profile | 32 |
| Example 2-18 | UDL-18 | 250° C., 60 sec | Vertical profile | Vertical profile | Vertical profile | Vertical profile | 29 |
| Example 2-19 | UDL-19 | 350° C., 60 sec | Vertical profile | Vertical profile | Vertical profile | Vertical profile | 25 |
| Example 2-20 | UDL-20 | 350° C., 60 sec | Vertical profile | Vertical profile | Vertical profile | Vertical profile | 29 |
| Example 2-21 | UDL-21 | 350° C., 60 sec | Vertical profile | Vertical profile | Vertical profile | Vertical profile | 27 |
| Example 2-22 | UDL-22 | 350° C., 60 sec | Vertical profile | Vertical profile | Vertical profile | Vertical profile | 30 |
| Example 2-23 | UDL-23 | 350° C., 60 sec | Vertical profile | Vertical profile | Vertical profile | Vertical profile | 20 |

TABLE 7-continued

| Composition for forming resist underlayer film | Firing temperature | Pattern profile after development | Profile after etching for transferring to middle layer film | Profile after etching for transferring to underlayer film | Profile after etching for transferring to substrate | Minimum size (nm) without pattern wiggling after etching for transferring to substrate |
|---|---|---|---|---|---|---|
| Comparative Example 2-1 Comparative UDL-1 | 250° C., 60 sec | Vertical profile | Vertical profile | Vertical profile | Vertical profile | 42 |
| Comparative Example 2-2 Comparative UDL-2 | 250° C., 60 sec | Uneven profile | — | — | — | — |
| Comparative Example 2-3 Comparative UDL-3 | 250° C., 60 sec | Vertical profile | Vertical profile | Vertical profile | Vertical profile | 38 |

The resist underlayer films formed by using UDL-1 to 23, which are the inventive composition for forming a resist underlayer film, had n-value and k-value suited to practical use as the underlayer film of the three-layered resist for liquid immersion lithography, as shown in Table 4. Thus, these films had a good resist shape after development in the pattern evaluation shown in Table 7. By contrast, Comparative Example 2-2 (Comparative UDL-2) resulted in a poor resist shape, so that etching evaluation was impossible. This poor shape is supposed to be caused by insufficient antireflective effect because the combination of n-value and k-value of Comparative UDL-2 was out of the optimum values.

In addition, as shown in Table 7, when UDL-1 to 23, which are the inventive composition for forming a resist underlayer film, were used, the resist shape after development and the resist underlayer film shape after etching with oxygen and after etching for processing the substrate were good. The pattern size after substrate transfer changed in accordance with the resist line width formed by the photo-exposure. While Comparative UDL-1 and UDL-3 caused pattern wiggling at a line width of about 40 nm, UDL-1 to 23, which are the inventive composition for forming a resist underlayer film, did not cause wiggling until a pattern size of 35 nm or less, so that a high wiggling resistance could be confirmed.

This indicates that high wiggling resistance can be achieved by using a dense resist underlayer film having a hardness of more than 0.60 GPa, like the resist underlayer film formed by using the inventive composition for forming a resist underlayer film.

As described above, the resist underlayer film obtained from the inventive composition for forming a resist underlayer film has suitable optical properties for providing a sufficient antireflective effect and excellent wiggling resistance during etching, and thus is very useful as the underlayer film for a multilayer resist process, especially three-layer resist process, for ultra-fine patterning with high precision.

It is to be noted that the present invention is not restricted to the foregoing embodiment. The embodiment is just an exemplification, and any examples that have substantially the same feature and demonstrate the same functions and effects as those in the technical concept described in claims of the present invention are included in the technical scope of the present invention.

What is claimed is:

1. A composition for forming a resist underlayer film, comprising an organic solvent and either or both of a compound shown by the following general formula (1) and a condensate of the compound,

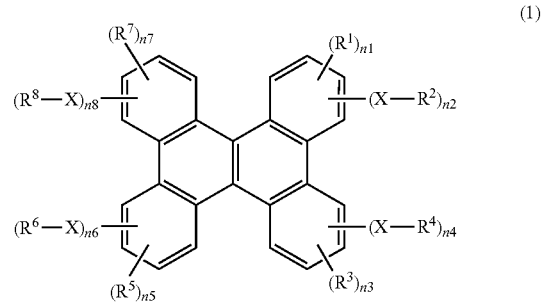

wherein $R^1$, $R^3$, $R^5$, and $R^7$ represent $Z^1$, a diglycidylamino group, or a dipropargylamino group; $R^2$, $R^4$, $R^6$, and $R^8$ represent $Z^2$, a glycidyl group, a diglycidylamino group, or a dipropargylamino group; X represents a group shown by the following formula (1-1); n1 to n8 are each a number satisfying $0 \leq n1 \leq 4$, $0 \leq n2 \leq 4$, $0 \leq n3 \leq 4$, $0 \leq n4 \leq 4$, $0 \leq n5 \leq 4$, $0 \leq n6 \leq 4$, $0 \leq n7 \leq 4$, $0 \leq n8 \leq 4$, $0 \leq n1+n2 \leq 4$, $0 \leq n3+n4 \leq 4$, $0 \leq n5+n6 \leq 4$, $0 \leq n7+n8 \leq 4$, and $1 \leq n1+n2+n3+n4+n5+n6+n7+n8 \leq 16$, where $Z^1$ represents an alkyl group having 1 to 20 carbon atoms, an alkenyl group or alkynyl group having 2 to 20 carbon atoms, or an aryl group having 6 to 30 carbon atoms, and $Z^2$ represents $Z^1$, a hydrogen atom, or a hydroxyaryl group having 6 to 14 carbon atoms,

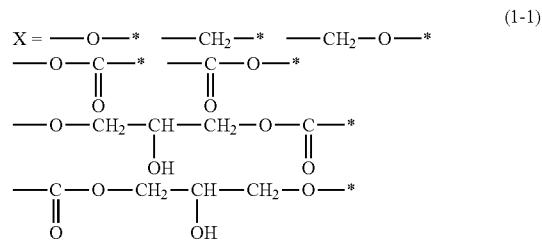

wherein * represents a binding site with $R^p$ where p represents 2, 4, 6, or 8.

2. The composition for forming a resist underlayer film according to claim 1, wherein the condensate is obtained by a reaction of one or more compounds shown by the general formula (1) with one or more compounds selected from a compound shown by the following general formula (2-1), a compound shown by the following general formula (2-2), trioxane, paraformaldehyde, and fluorenone, $$Y^1\text{—CHO} \tag{2-1}$$

wherein $Y^1$ represents a hydrogen atom or a monovalent organic group having 1 to 30 carbon atoms and optionally containing a substituent, $$R^9\text{—CH}_2\text{—}Y^2\text{—CH}_2\text{—}R^9 \tag{2-2}$$

wherein $Y^2$ represents an aromatic group having 6 or more carbon atoms and optionally containing a substituent; $R^9$ represents an alkoxy group or alkanoyloxy group having 1 to 6 carbon atoms, or a halogen atom.

3. The composition for forming a resist underlayer film according to claim 1, wherein the condensate is obtained by a reaction with one or more compounds selected from compounds shown by the following general formulae (3-1), (3-2), (3-3), (3-4), and (3-5),

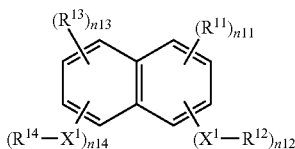
(3-1)

wherein $R^{11}$ and $R^{13}$ represent $Z^1$, where $Z^1$ is as defined above, an amino group, a diglycidylamino group, or a dipropargylamino group; $R^{12}$ and $R^{14}$ represent $Z^2$, where $Z^2$ is as defined above, a glycidyl group, a diglycidylamino group, or a dipropargylamino group; a single bond contained in $R^{11}$ to $R^{14}$ may be substituted by a double bond, a triple bond, an ether group, a carbonyl group, or a carbonyloxy group; a hydrogen atom contained in $R^{11}$ to $R^{14}$ may be substituted by a fluorine atom, a chlorine atom, or a hydroxyl group; two substituents selected from $R^{11}$, $R^{12}$, $R^{13}$, and $R^{14}$ may be bonded intramolecularly to form a cyclic substituent; $X^1$ represents a group shown by the following formula (3-6); and n11 to n14 are each a number satisfying $0 \leq n11 \leq 4$, $0 \leq n12 \leq 4$, $0 \leq n13 \leq 4$, $0 \leq n14 \leq 4$, $0 \leq n11+n12 \leq 4$, $0 \leq n13+n14 \leq 4$, and $1 \leq n11+n12+n13+n14 \leq 8$,

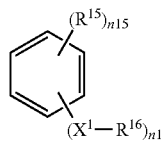
(3-2)

wherein $R^{15}$ represents a fluorine atom, a chlorine atom, $Z^1$, where $Z^1$ is as defined above, a diglycidylamino group, or a dipropargylamino group; $R^{16}$ represents $Z^2$, where $Z^2$ is as defined above, a glycidyl group, a diglycidylamino group, or a dipropargylamino group; a single bond contained in $R^{15}$ and $R^{16}$ may be substituted by a double bond, a triple bond, an ether group, a carbonyl group, or a carbonyloxy group; a hydrogen atom contained in $R^{15}$ and $R^{16}$ may be substituted by a fluorine atom, a chlorine atom, or a hydroxyl group; two substituents selected from $R^{15}$ and $R^{16}$ may be bonded intramolecularly to form a cyclic substituent; $X^1$ represents a group shown by the following formula (3-6); and n15 and n16 are each a number satisfying $0 \leq n15 \leq 6$, $0 \leq n16 \leq 6$, and $1 \leq n15+n16 \leq 6$,

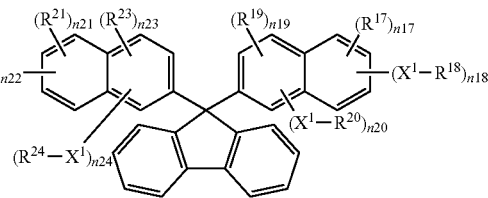
(3-3)

wherein $R^{17}$, $R^{19}$, $R^{21}$, and $R^{23}$ represent $Z^1$, where $Z^1$ is as defined above, a diglycidylamino group, or a dipropargylamino group; $R^{18}$ and $R^{22}$ represent $Z^2$, where $Z^2$ is as defined above, a glycidyl group, a glycidyloxyethyl group, a diglycidylamino group, or a dipropargylamino group; $R^{20}$ and $R^{24}$ represent $Z^2$, where $Z^2$ is as defined above, a glycidyl group, a diglycidylamino group, or a dipropargylamino group; a single bond contained in $R^{17}$ to $R^{24}$ may be substituted by a double bond, a triple bond, an ether group, a carbonyl group, or a carbonyloxy group; a hydrogen atom contained in $R^{17}$ to $R^{24}$ may be substituted by a fluorine atom, a chlorine atom, or a hydroxyl group; $X^1$ represents a group shown by the following formula (3-6); and n17 to n24 are each a number satisfying $0 \leq n17 \leq 4$, $0 \leq n18 \leq 4$, $0 \leq n19 \leq 3$, $0 \leq n20 \leq 3$, $0 \leq n21 \leq 4$, $0 \leq n22 \leq 4$, $0 \leq n23 \leq 3$, $0 \leq n24 \leq 3$, $0 \leq n17+n18 \leq 4$, $0 \leq n19+n20 \leq 3$, $0 \leq n21+n22 \leq 4$, $0 \leq n23+n24 \leq 3$, $1 \leq n17+n18+n19+n20 \leq 7$, and $1 \leq n21+n22+n23+n24 \leq 7$,

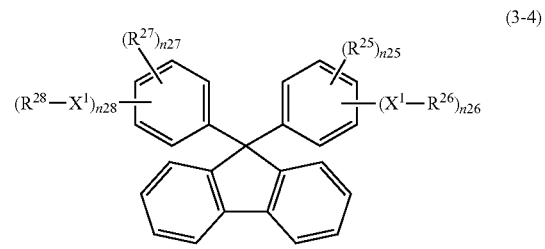
(3-4)

wherein $R^{25}$ and $R^{27}$ represent $Z^1$, where $Z^1$ is as defined above, a diglycidylamino group, or a dipropargylamino group; $R^{26}$ and $R^{28}$ represent $Z^2$, where $Z^2$ is as defined above, a glycidyl group, a glycidyloxyethyl group, a diglycidylamino group, or a dipropargylamino group; a single bond contained in $R^{25}$ to $R^{28}$ may be substituted by a double bond, a triple bond, an ether group, a carbonyl group, or a carbonyloxy group; a hydrogen atom contained in $R^{25}$ to $R^{28}$ may be substituted by a fluorine atom, a chlorine atom, or a hydroxyl group; $X^1$ represents a group shown by the following formula (3-6); and n25 to n28 are each a number satisfying $0 \leq n25 \leq 5$, $0 \leq n26 \leq 5$, $0 \leq n27 \leq 5$, $0 \leq n28 \leq 5$, $1 \leq n25+n26 \leq 5$, and $1 \leq n27+n28 \leq 5$,

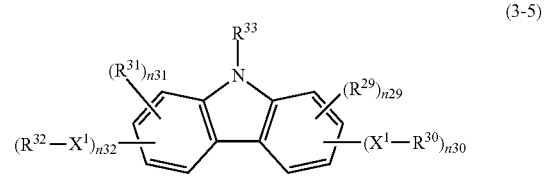
(3-5)

wherein $R^{29}$ and $R^{31}$ represent $Z^1$, where $Z^1$ is as defined above, a diglycidylamino group, or a dipropargylamino group; $R^{30}$, $R^{32}$, and $R^{33}$ represent $Z^2$, where $Z^2$ is as defined above, a glycidyl group, a diglycidylamino group, or a dipropargylamino group; a single bond contained in $R^{29}$ to $R^{33}$ may be substituted by a double bond, a triple bond, an ether group, a carbonyl group, or a carbonyloxy group; a hydrogen atom contained in $R^{29}$ to $R^{33}$ may be substituted by a fluorine atom, a chlorine atom, or a hydroxyl group; $X^1$ represents a group shown by the following formula (3-6); and n29 to n32 are each a number satisfying $0 \leq n29 \leq 4$, $0 \leq n30 \leq 4$, $0 \leq n31 \leq 4$, $0 \leq n32 \leq 4$, $0 \leq n29+n30 \leq 4$, and $0 \leq n31+n32 \leq 4$,

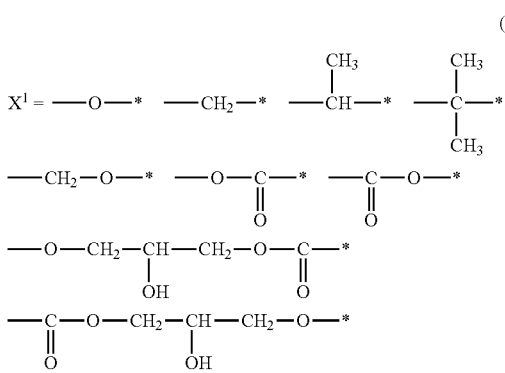

(3-6)

wherein * represents a binding site with $R^q$ where q represents 12, 14, 16, 18, 20, 22, 24, 26, 28, 30, or 32.

4. The composition for forming a resist underlayer film according to claim 2, wherein the condensate is obtained by a reaction with one or more compounds selected from compounds shown by the following general formulae (3-1), (3-2), (3-3), (3-4), and (3-5),

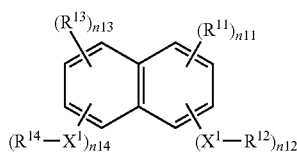

(3-1)

wherein $R^{11}$ and $R^{13}$ represent $Z^1$, where $Z^1$ is as defined above, an amino group, a diglycidylamino group, or a dipropargylamino group; $R^{12}$ and $R^{14}$ represent $Z^2$, where $Z^2$ is as defined above, a glycidyl group, a diglycidylamino group, or a dipropargylamino group; a single bond contained in $R^{11}$ to $R^{14}$ may be substituted by a double bond, a triple bond, an ether group, a carbonyl group, or a carbonyloxy group; a hydrogen atom contained in $R^1$ to $R^{14}$ may be substituted by a fluorine atom, a chlorine atom, or a hydroxyl group; two substituents selected from $R^{11}$, $R^{12}$, $R^{13}$, and $R^{14}$ may be bonded intramolecularly to form a cyclic substituent; $X^1$ represents a group shown by the following formula (3-6); and n11 to n14 are each a number satisfying $0 \leq n11 \leq 4$, $0 \leq n12 \leq 4$, $0 \leq n13 \leq 4$, $0 \leq n14 \leq 4$, $0 \leq n11+n12 \leq 4$, $0 \leq n13+n14 \leq 4$, and $1 \leq n11+n12+n13+n14 \leq 8$,

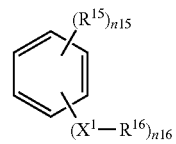

(3-2)

wherein $R^{15}$ represents a fluorine atom, a chlorine atom, $Z^1$, where $Z^1$ is as defined above, a diglycidylamino group, or a dipropargylamino group; $R^{16}$ represents $Z^2$, where $Z^2$ is as defined above, a glycidyl group, a diglycidylamino group, or a dipropargylamino group; a single bond contained in $R^{15}$ and $R^{16}$ may be substituted by a double bond, a triple bond, an ether group, a carbonyl group, or a carbonyloxy group; a hydrogen atom contained in $R^{15}$ and $R^{16}$ may be substituted by a fluorine atom, a chlorine atom, or a hydroxyl group; two substituents selected from $R^{15}$ and $R^{16}$ may be bonded intramolecularly to form a cyclic substituent; $X^1$ represents a group shown by the following formula (3-6); and n15 and n16 are each a number satisfying $0 \leq n15 \leq 6$, $0 \leq n16 \leq 6$, and $1 \leq n15+n16 \leq 6$,

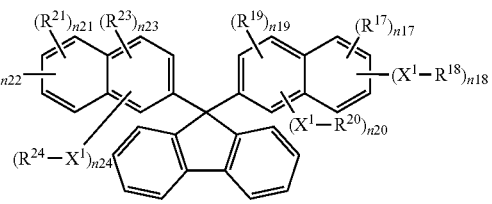

(3-3)

wherein $R^{17}$, $R^{19}$, $R^{21}$, and $R^{23}$ represent $Z^1$, where $Z^1$ is as defined above, a diglycidylamino group, or a dipropargylamino group; $R^{18}$ and $R^{22}$ represent $Z^2$, where $Z^2$ is as defined above, a glycidyl group, a glycidyloxyethyl group, a diglycidylamino group, or a dipropargylamino group; $R^{20}$ and $R^{24}$ represent $Z^2$, where $Z^2$ is as defined above, a glycidyl group, a diglycidylamino group, or a dipropargylamino group; a single bond contained in $R^{17}$ to $R^{24}$ may be substituted by a double bond, a triple bond, an ether group, a carbonyl group, or a carbonyloxy group; a hydrogen atom contained in $R^{17}$ to $R^{24}$ may be substituted by a fluorine atom, a chlorine atom, or a hydroxyl group; $X^1$ represents a group shown by the following formula (3-6); and n17 to n24 are each a number satisfying $0 \leq n17 \leq 4$, $0 \leq n18 \leq 4$, $0 \leq n19 \leq 3$, $0 \leq n20 \leq 3$, $0 \leq n21 \leq 4$, $0 \leq n22 \leq 4$, $0 \leq n23 \leq 3$, $0 \leq n24 \leq 3$, $0 \leq n17+n18 \leq 4$, $0 \leq n19+n20 \leq 3$, $0 \leq n21+n22 \leq 4$, $0 \leq n23+n24 \leq 3$, $1 \leq n17+n18+n19+n20 \leq 7$, and $1 \leq n21+n22+n23+n24 \leq 7$,

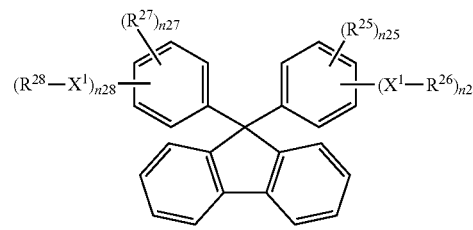

(3-4)

wherein $R^{25}$ and $R^{27}$ represent $Z^1$, where $Z^1$ is as defined above, a diglycidylamino group, or a dipropargylamino group; $R^{26}$ and $R^{28}$ represent $Z^2$, where $Z^2$ is as defined above, a glycidyl group, a glycidyloxyethyl group, a diglycidylamino group, or a dipropargylamino group; a single bond contained in $R^{25}$ to $R^{28}$ may be substituted by a double bond, a triple bond, an ether group, a carbonyl group, or a carbonyloxy group; a hydrogen atom contained in $R^{25}$ to $R^{28}$ may be substituted by a fluorine atom, a chlorine atom, or a hydroxyl group; $X^1$ represents a group shown by the following formula (3-6); and n25 to n28 are each a number satisfying $0 \leq n25 \leq 5$, $0 \leq n26 \leq 5$, $0 \leq n27 \leq 5$, $0 \leq n28 \leq 5$, $1 \leq n25+n26 \leq 5$, and $1 \leq n27+n28 \leq 5$,

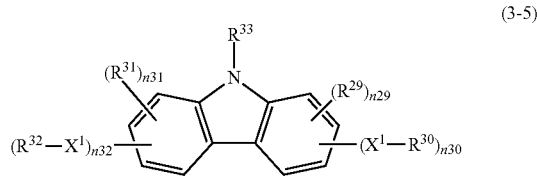

(3-5)

wherein $R^{29}$ and $R^{31}$ represent $Z^1$, where $Z^1$ is as defined above, a diglycidylamino group, or a dipropargylamino group; $R^{39}$, $R^{32}$, and $R^{33}$ represent $Z^2$, where $Z^2$ is as defined above, a glycidyl group, a diglycidylamino group, or a dipropargylamino group; a single bond contained in $R^{29}$ to $R^{33}$ may be substituted by a double bond, a triple bond, an ether group, a carbonyl group, or a carbonyloxy group; a hydrogen atom contained in $R^{29}$ to $R^{33}$ may be substituted by a fluorine atom, a chlorine atom, or a hydroxyl group; $X^1$ represents a group shown by the following formula (3-6); and n29 to n32 are each a number satisfying $0 \leq n29 \leq 4$, $0 \leq n30 \leq 4$, $0 \leq n31 \leq 4$, $0 \leq n32 \leq 4$, $0 \leq n29+n30 \leq 4$, and $0 \leq n31+n32 \leq 4$,

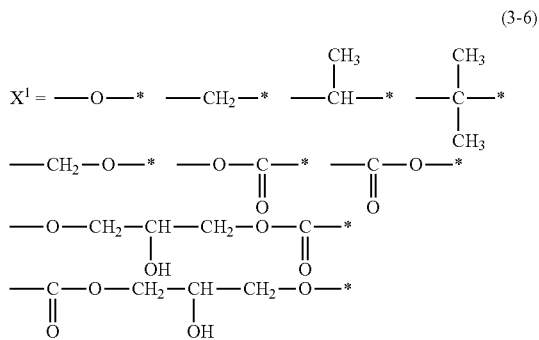

(3-6)

wherein * represents a binding site with $R^4$ where q represents 12, 14, 16, 18, 20, 22, 24, 26, 28, 30, or 32.

5. The composition for forming a resist underlayer film according to claim 1, further comprising a substituted condensate obtained by substituting a part of hydrogen atoms contained in the condensate by a glycidyl group.

6. The composition for forming a resist underlayer film according to claim 2, further comprising a substituted condensate obtained by substituting a part of hydrogen atoms contained in the condensate by a glycidyl group.

7. The composition for forming a resist underlayer film according to claim 3, further comprising a substituted condensate obtained by substituting a part of hydrogen atoms contained in the condensate by a glycidyl group.

8. The composition for forming a resist underlayer film according to claim 4, further comprising a substituted condensate obtained by substituting a part of hydrogen atoms contained in the condensate by a glycidyl group.

9. The composition for forming a resist underlayer film according to claim 1, wherein the composition for forming a resist underlayer film comprises two or more of the compound shown by the general formula (1), the condensate of the compound, and a substituted condensate obtained by substituting a part of hydrogen atoms of the condensate by a glycidyl group.

10. The composition for forming a resist underlayer film according to claim 2, wherein the composition for forming a resist underlayer film comprises two or more of the compound shown by the general formula (1), the condensate of the compound, and a substituted condensate obtained by substituting a part of hydrogen atoms of the condensate by a glycidyl group.

11. The composition for forming a resist underlayer film according to claim 1, further comprising either or both of a crosslinking agent and an acid generator.

12. A patterning process comprising: forming a resist underlayer film on a body to be processed by using the composition for forming a resist underlayer film according to claim 1; forming a resist middle layer film on the resist underlayer film by using a silicon-containing resist middle layer film composition; forming a resist upper layer film on the resist middle layer film by using a resist upper layer film composition which is a photoresist composition; forming a circuit pattern on the resist upper layer film; etching the resist middle layer film by using the resist upper layer film having the formed pattern as a mask; etching the resist underlayer film by using the resist middle layer film having the formed pattern as a mask; further etching the body to be processed by using the resist underlayer film having the formed pattern as a mask, whereby the pattern is formed in the body to be processed.

13. A patterning process comprising: forming a resist underlayer film on a body to be processed by using the composition for forming a resist underlayer film according to claim 1; forming a resist middle layer film on the resist underlayer film by using a silicon-containing resist middle layer film composition; forming an organic antireflective film (BARC) on the resist middle layer film; forming a resist upper layer film on the BARC by using a resist upper layer film composition which is a photoresist composition and thereby forming a 4-layered resist film; forming a circuit pattern on the resist upper layer film; etching the BARC film and the resist middle layer film by using the resist upper layer film having the formed pattern as a mask; etching the resist underlayer film by using the resist middle layer film having the formed pattern as a mask; further etching the body to be processed by using the resist underlayer film having the formed pattern as a mask, whereby the pattern is formed in the body to be processed.

14. A patterning process comprising: forming a resist underlayer film on a body to be processed by using the composition for forming a resist underlayer film according to claim 1; forming an inorganic hard mask intermediate film selected from a silicon oxide film, a silicon nitride film, and a silicon oxynitride film on the resist underlayer film; forming a resist upper layer film on the inorganic hard mask intermediate film by using a resist upper layer film composition which is a photoresist composition; forming a circuit pattern on the resist upper layer film; etching the inorganic hard mask intermediate film by using the resist upper layer film having the formed pattern as a mask; etching the resist underlayer film by using the inorganic hard mask intermediate film having the formed pattern as a mask; further etching the body to be processed by using the resist underlayer film having the formed pattern as a mask, whereby the pattern is formed in the body to be processed.

15. A patterning process comprising: forming a resist underlayer film on a body to be processed by using the composition for forming a resist underlayer film according to claim 1; forming an inorganic hard mask intermediate film selected from a silicon oxide film, a silicon nitride film, and a silicon oxynitride film on the resist underlayer film; forming an organic antireflective film (BARC) on the inorganic hard mask intermediate film; forming a resist upper layer film on the BARC by using a resist upper layer film composition which is a photoresist composition and thereby forming a 4-layered resist film; forming a circuit pattern on the resist upper layer film; etching the BARC film and the inorganic hard mask intermediate film by using the resist upper layer film having the formed pattern as a mask; etching the resist underlayer film by using the inorganic hard mask intermediate film having the formed pattern as a mask; further etching the body to be processed by using the resist underlayer film having the formed pattern as a mask, whereby the pattern is formed in the body to be processed.

16. The patterning process according to claim 14, wherein the inorganic hard mask intermediate film is formed by a CVD method or an ALD method.

17. The patterning process according to claim 12, wherein the resist upper layer film is patterned by a photolithography with a wavelength ranging from 10 nm to 300 nm, a direct drawing by electron beam, a nanoimprinting, or a combination thereof.

18. The patterning process according to claim 12, wherein a development method in the patterning process is an alkaline development or a development with an organic solvent.

19. The patterning process according to claim 12, wherein the body to be processed is a semiconductor apparatus substrate or the semiconductor apparatus substrate coated with any of a metal film, a metal carbide film, a metal oxide film, a metal nitride film, a metal oxycarbide film, and a metal oxynitride film.

20. The patterning process according to claim 19, wherein the metal is silicon, titanium, tungsten, hafnium, zirconium, chromium, germanium, copper, silver, gold, aluminum, indium, gallium, arsenic, palladium, iron, tantalum, iridium, molybdenum, or an alloy thereof.

* * * * *